US008035824B2

(12) United States Patent
Ausschnitt

(10) Patent No.: US 8,035,824 B2
(45) Date of Patent: Oct. 11, 2011

(54) DIFFERENTIAL CRITICAL DIMENSION AND OVERLAY METROLOGY APPARATUS AND MEASUREMENT METHOD

(75) Inventor: Christopher Ausschnitt, Boca Raton, FL (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 12/607,392

(22) Filed: Oct. 28, 2009

(65) Prior Publication Data

US 2010/0103433 A1 Apr. 29, 2010

Related U.S. Application Data

(62) Division of application No. 10/596,614, filed on Jun. 19, 2006, now Pat. No. 7,700,247.

(51) Int. Cl.
*G01B 11/04* (2006.01)
*G01B 11/14* (2006.01)
*G03F 9/00* (2006.01)

(52) U.S. Cl. ........ 356/636; 356/401; 356/625; 356/634; 356/635; 430/30

(58) Field of Classification Search .................... 430/30; 356/401, 625, 634, 635, 636
See application file for complete search history.

(56) References Cited

U.S. PATENT DOCUMENTS

| | | | |
|---|---|---|---|
| 5,363,171 A | 11/1994 | Mack | |
| 5,517,312 A | 5/1996 | Finarov | |
| 5,559,601 A | 9/1996 | Gallatin et al. | |
| 5,629,772 A | 5/1997 | Ausschnitt | |
| 5,631,721 A | 5/1997 | Stanton et al. | |
| 5,644,390 A | 7/1997 | Yasuzato | |
| 5,682,242 A | 10/1997 | Eylon | |
| 5,703,692 A | 12/1997 | McNeil et al. | |
| 5,712,707 A | 1/1998 | Ausschnitt et al. | |
| 5,739,909 A | 4/1998 | Blayo et al. | |
| 5,757,507 A | 5/1998 | Ausschnitt et al. | |
| 5,867,276 A | 2/1999 | McNeil et al. | |
| 5,867,590 A | 2/1999 | Eylon | |
| 5,880,838 A | 3/1999 | Marx et al. | |
| 5,916,711 A | 6/1999 | Salik et al. | |
| 5,917,594 A | 6/1999 | Norton | |
| 5,953,128 A | 9/1999 | Ausschnitt et al. | |
| 5,957,749 A | 9/1999 | Finarov | |
| 5,965,309 A | 10/1999 | Ausschnitt et al. | |
| 5,968,691 A | 10/1999 | Yoshioka et al. | |
| 5,976,740 A | 11/1999 | Ausschnitt et al. | |
| 6,038,029 A | 3/2000 | Finarov | |
| 6,045,433 A | 4/2000 | Dvir et al. | |
| 6,051,349 A | 4/2000 | Yoshioka et al. | |
| 6,052,626 A | 4/2000 | Inui | |
| 6,100,985 A | 8/2000 | Scheiner et al. | |
| 6,130,750 A | 10/2000 | Ausschnitt et al. | |
| 6,166,801 A | 12/2000 | Dishon et al. | |
| 6,171,731 B1 | 1/2001 | Medvedeva et al. | |
| 6,183,919 B1 | 2/2001 | Ausschnitt et al. | |
| 6,223,139 B1 | 4/2001 | Wong et al. | |
| 6,259,513 B1 | 7/2001 | Gallatin et al. | |
| 6,259,521 B1 | 7/2001 | Miller et al. | |
| 6,263,299 B1 | 7/2001 | Aleshin et al. | |
| 6,281,974 B1 | 8/2001 | Scheiner et al. | |
| 6,292,265 B1 | 9/2001 | Finarov et al. | |
| 6,323,946 B1 | 11/2001 | Norton | |
| 6,368,181 B1 | 4/2002 | Dvir et al. | |
| 6,383,824 B1 | 5/2002 | Lensing | |
| 6,388,253 B1 | 5/2002 | Su | |
| 6,407,809 B1 | 6/2002 | Finarov et al. | |
| 6,423,977 B1 | 7/2002 | Hayasaki et al. | |
| 6,424,417 B1 | 7/2002 | Cohen et al. | |
| 6,426,502 B1 | 7/2002 | Finarov | |
| 6,429,930 B1 | 8/2002 | Littau et al. | |
| 6,429,943 B1 | 8/2002 | Opsal et al. | |
| 6,432,729 B1 | 8/2002 | Mundt et al. | |
| 6,433,871 B1 | 8/2002 | Lensing et al. | |
| 6,433,878 B1 | 8/2002 | Niu et al. | |
| 6,451,621 B1 | 9/2002 | Rangarajan et al. | |
| 6,476,920 B1 | 11/2002 | Scheiner et al. | |
| 6,485,891 B1 | 11/2002 | Noguchi et al. | |
| 6,556,947 B1 | 4/2003 | Scheiner et al. | |

(Continued)

FOREIGN PATENT DOCUMENTS

TW 200302971 2/2003

(Continued)

OTHER PUBLICATIONS

International Application No. PCT/US2003/041438 filed: Dec. 19, 2003 Inventor: Christopher Ausschnitt PCT International Search Report. Suwa K. Ed—"Automatic Laser Scanning Focus Detection Method Using Printed Focuspattern" —Optical/Laser Microlithography 8, Santa Clara, Feb. 22-24, 1995;—SPIE vol. 2440—pp. 712-720.
Raymond C.J., et al.—"Metrology of Subwavelength Photoresist Gratings Using Optical Scatterometry"—Journal of Vacuum Science and Technology: Part B 13, AVS/AIP, Melville, New York (US)— Jul./Aug. 1995—1484-1495.
Benesch, et al.—"Phi-Scatterometry for Integrated Linewidth Control in DRAM Manufacturing" —2001 IEEE 0-7803-6731—Jun. 2001—pp. 129-132.
McNeil, John R.—"Scatterometry Applied to Microelectronics Processing" —2000 IEEE, 0-7803-6252—Jul. 2000—pp. 37-38.
Hayes, et al.—"Accuracy and Precision of Scatterometer Measurements Relative to Conventional CD Metrology" —2000 IEEE, 0-7803-6252—Jul. 2000—pp. 39-40.

(Continued)

*Primary Examiner* — Christopher Young
(74) *Attorney, Agent, or Firm* — Wenjie Li

(57) ABSTRACT

A method is described for measuring a dimension on a substrate, wherein a target pattern is provided with a nominal characteristic dimension that repeats at a primary pitch of period P, and has a pre-determined variation orthogonal to the primary direction. The target pattern formed on the substrate is then illuminated so that at least one non-zero diffracted order is detected. The response of the non-zero diffracted order to variation in the printed characteristic dimension relative to nominal is used to determine the dimension of interest, such as critical dimension or overlay, on the substrate. An apparatus for performing the method of the present invention includes an illumination source, a detector for detecting a non-zero diffracted order, and means for positioning the source relative to the target so that one or more non-zero diffracted orders from the target are detected at the detector.

8 Claims, 60 Drawing Sheets

U.S. PATENT DOCUMENTS

| | | | |
|---|---|---|---|
| RE38,153 E | 6/2003 | Finarov | |
| 6,583,866 B2 | 6/2003 | Jung et al. | |
| 6,603,529 B1 | 8/2003 | Finarov | |
| 6,619,144 B2 | 9/2003 | Dvir | |
| 6,643,017 B2 | 11/2003 | Cohen et al. | |
| 6,650,424 B2 | 11/2003 | Brill et al. | |
| 6,657,736 B1 | 12/2003 | Finarov et al. | |
| 6,704,920 B2 | 3/2004 | Brill et al. | |
| 6,750,952 B2 | 6/2004 | Grodnensky et al. | |
| 6,818,459 B2 | 11/2004 | Wack et al. | |
| 6,869,739 B1 | 3/2005 | Ausschnitt et al. | |
| 6,879,400 B2 | 4/2005 | Ausschnitt et al. | |
| 2001/0015811 A1 | 8/2001 | Ravid et al. | |
| 2001/0026364 A1 | 10/2001 | Ravid et al. | |
| 2002/0005957 A1 | 1/2002 | Finarov et al. | |
| 2002/0027648 A1 | 3/2002 | Van Der Laan et al. | |
| 2002/0033450 A1 | 3/2002 | Finarov et al. | |
| 2002/0072003 A1 | 6/2002 | Brill et al. | |
| 2002/0090744 A1 | 7/2002 | Brill et al. | |
| 2002/0171828 A1 | 11/2002 | Cohen et al. | |
| 2003/0058454 A1 | 3/2003 | Scheiner | |
| 2003/0086097 A1 | 5/2003 | Finarov | |
| 2003/0155537 A1 | 8/2003 | Machavariani et al. | |
| 2003/0169423 A1 | 9/2003 | Finarov et al. | |

FOREIGN PATENT DOCUMENTS

| TW | 200304079 | 2/2003 |
|---|---|---|
| WO | WO9746865 | 12/1997 |
| WO | WO9945340 | 9/1999 |

OTHER PUBLICATIONS

Ausschnitt, C.P.—"Disinguishing Dose From Defocus for In-Line Lithography Control"—Part of the SPIE Conference on Metrology, Inspection & Process Control for Microlithography XIII, Santa Clara, CA—Mar. 1999, SPIE vol. 3677.

Zhou, et al.—"Yield Prediction Using Critical Area Analysis With Inline Defect Data"—2002 IEEE/SEMI Advanced Semiconductor Manufacturing Conference—pp. 82-86.

Niu, et al.—"Specular Spectroscopic Scatterometry"—IEEE Transactions on Semiconductor Masnufacturing—vol. 14, No. 2—May 2001—pp. 97-111.

Lensing, et al.—"Shallow Trench Isolation Scatterometry Metrology in a High Volume Fab"—2001 IEEE, 07803-6731—Jun. 2001—pp. 195-198.

Chang, et al.—"Full Profile Inter-layer Dielectric CMP Analysis"—2001 IEEE, 0-7803-6731—Jun. 2001—pp. 133-136.

Ausschnitt, C.—"A New Approach to Pattern Metrology"—Proc. SPIE 5375-7—Feb. 23, 2004, Santa Clara, CA—pp. 1-15.

Application No. 10/596,614—Reference No. FIS920020101US1 Title: Differential Critical Dimension and Overlay Metrology Apparatus and Measurement Method Applicant:Christopher Ausschnitt filed: Jun. 19, 2006 Office Action Dated Jun. 24, 2009.

Application No. 03800269.7—1226 / 1709490—PCT/US0341438 Supplemental European Search Report Date Search Report was Issued: Feb. 23, 2009.

Search Report for Taiwan Invention Patent Application No. 091314469—Reference No. FIS920020101TW1 Filing Date: Nov. 24, 2004.

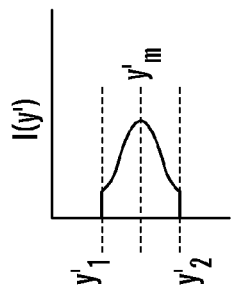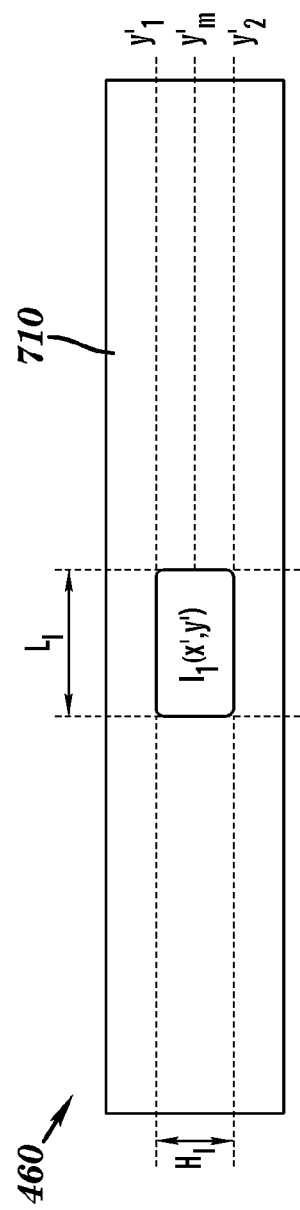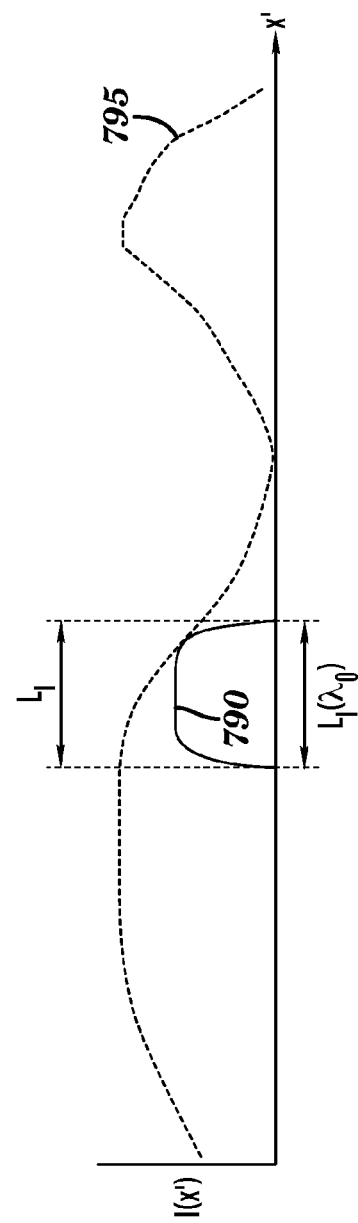

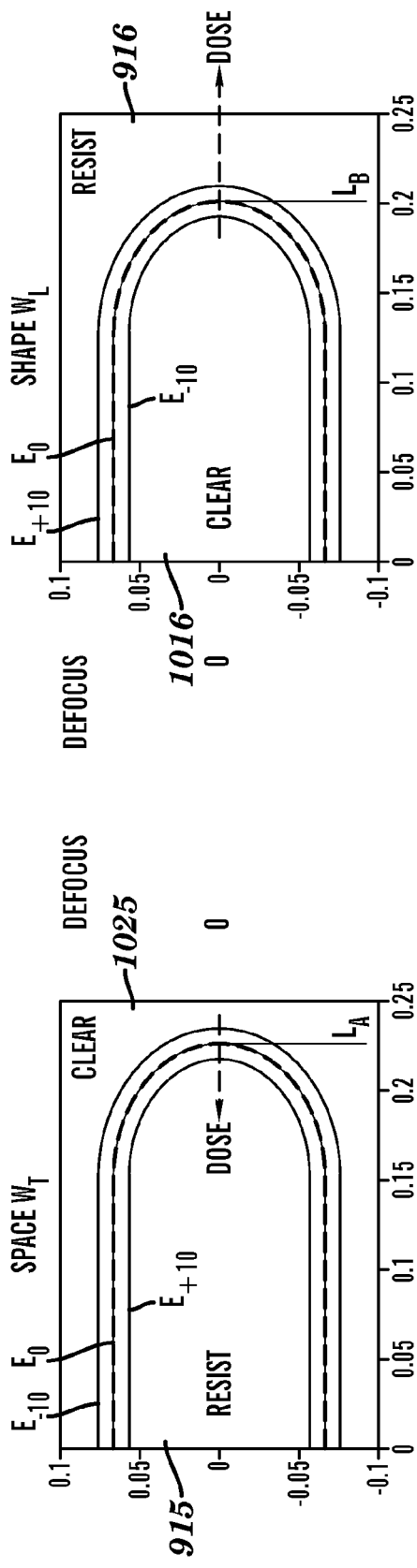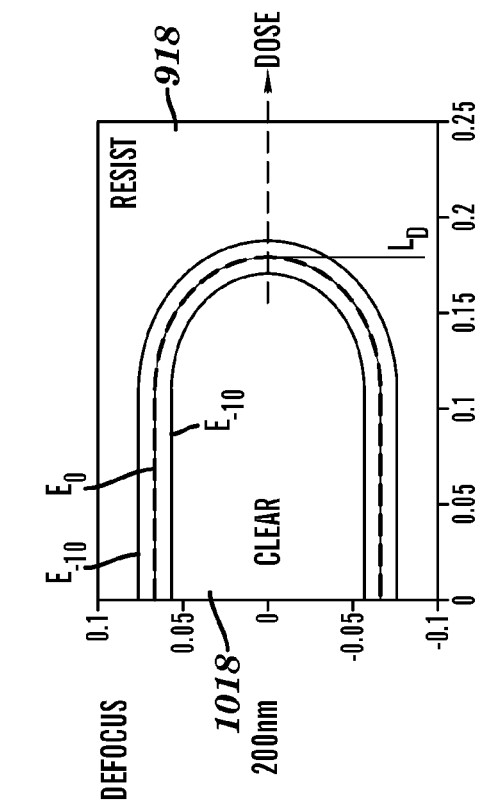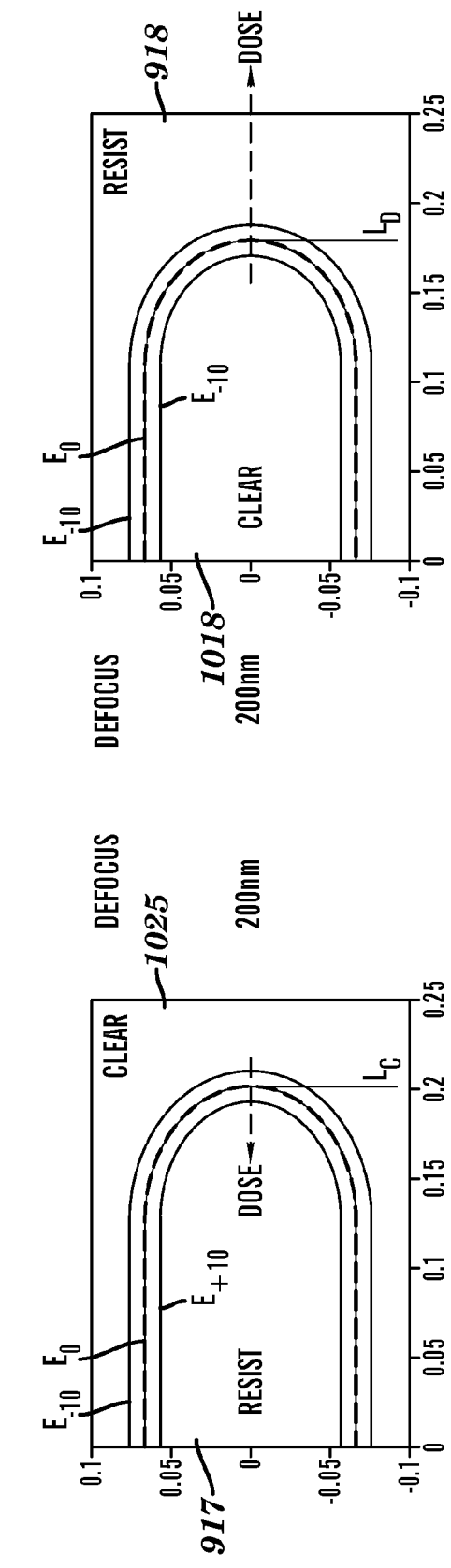

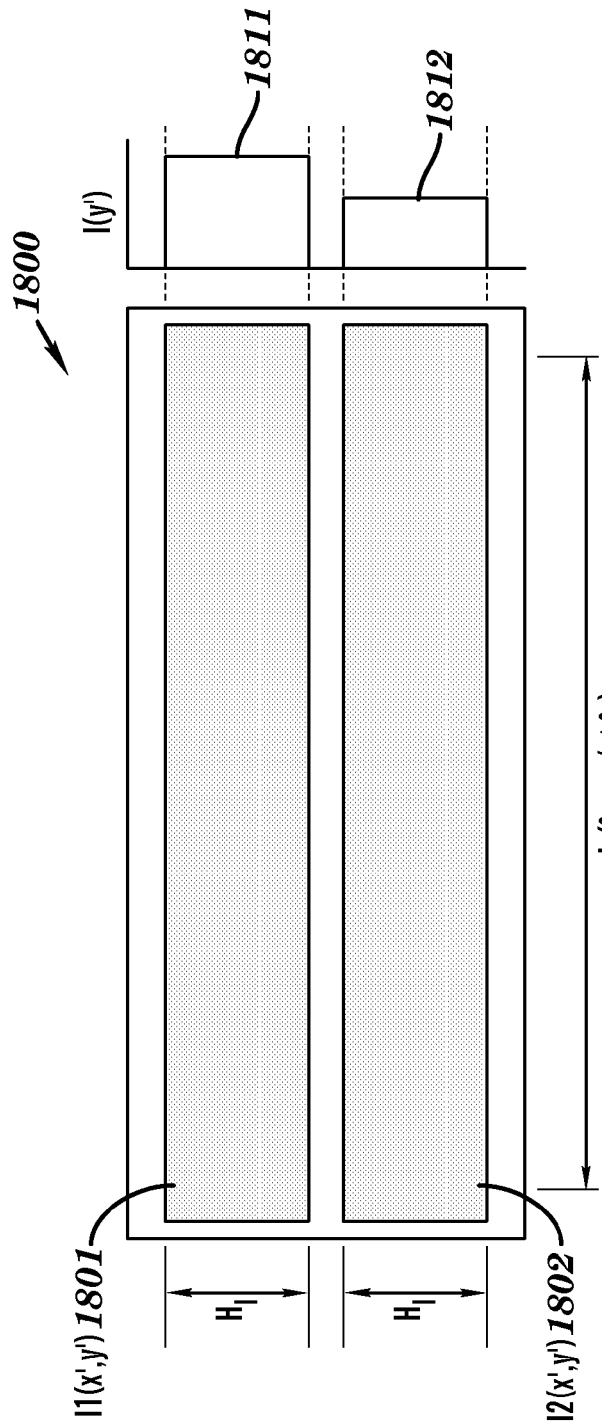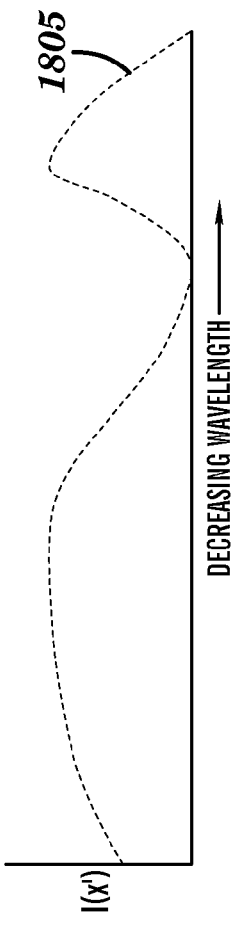
FIG. 18A
FIG. 18B

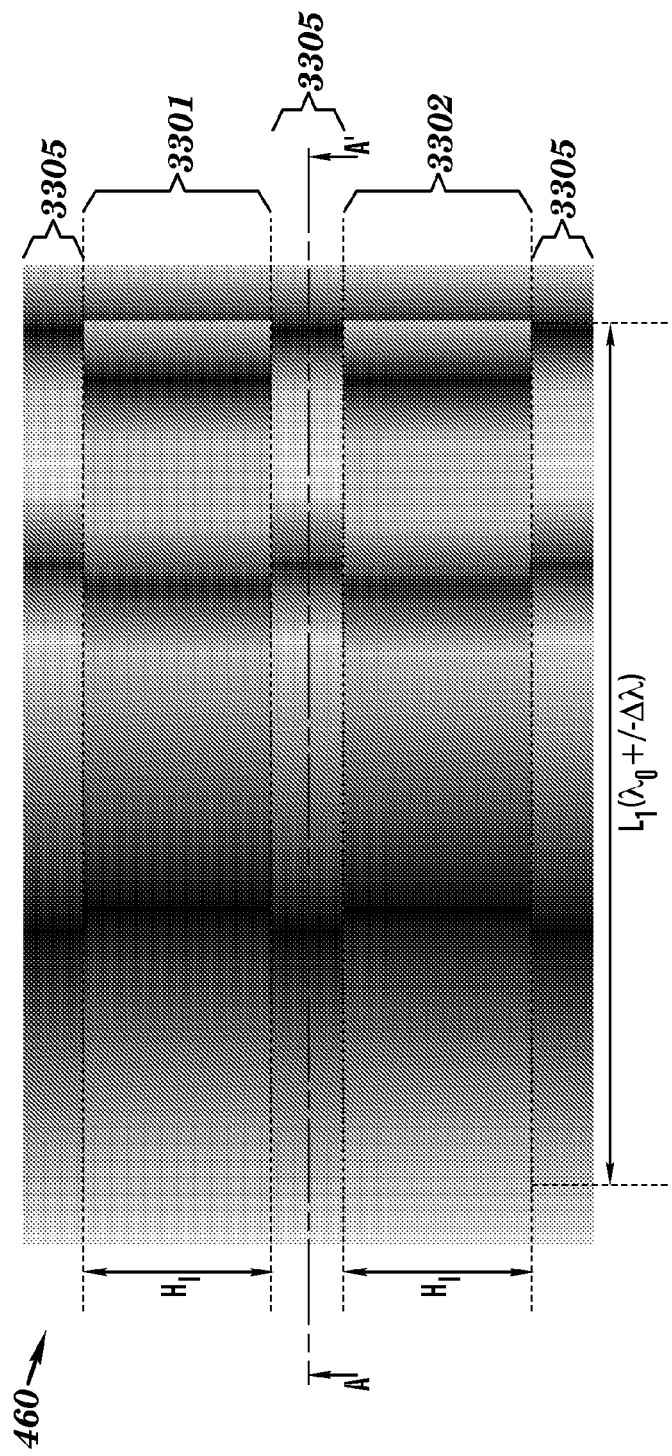
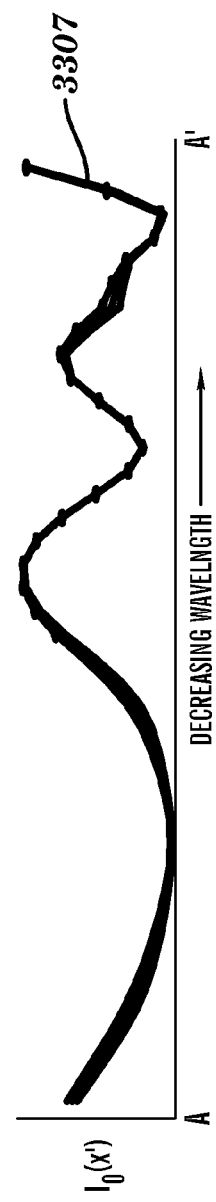
FIG. 33A
FIG. 33B

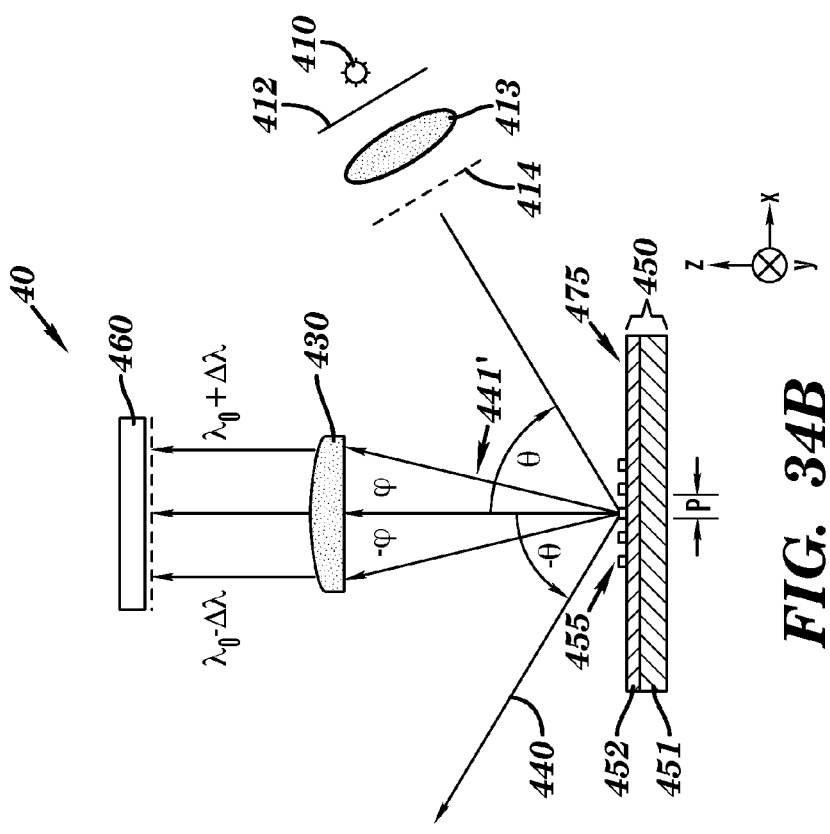
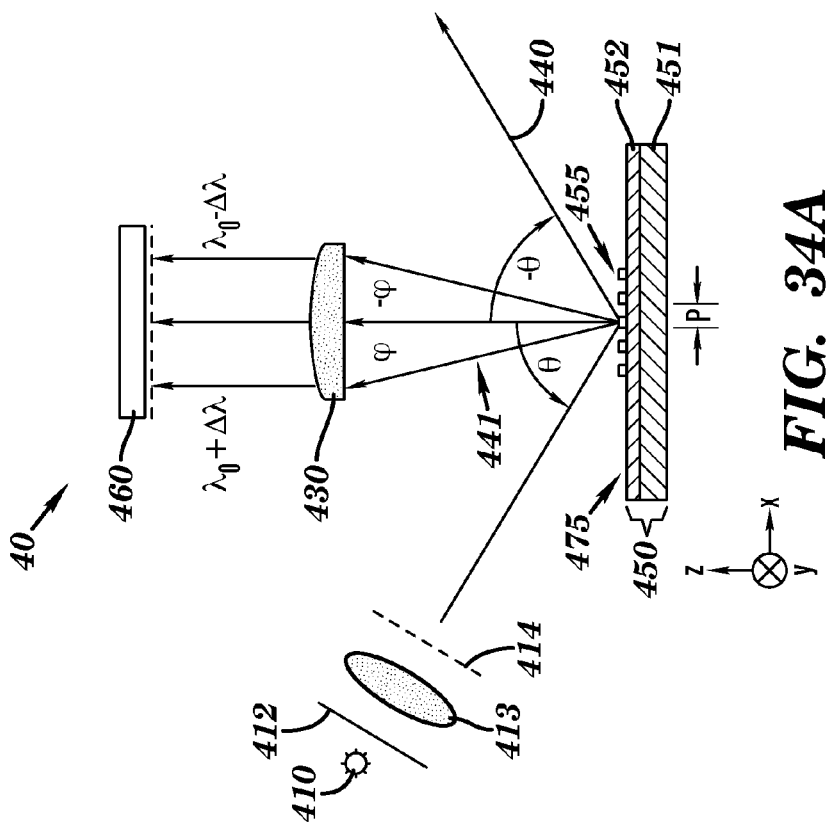
FIG. 34B
FIG. 34A

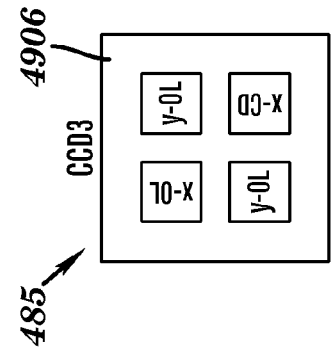
FIG. 49D
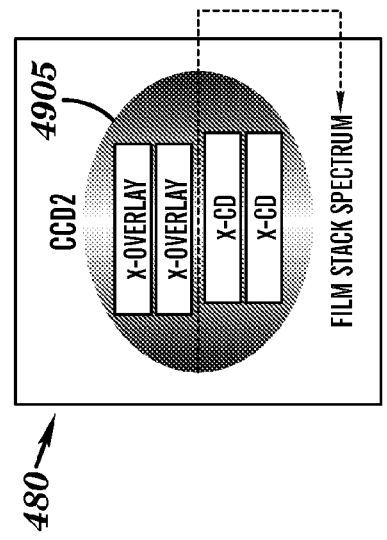
FIG. 49C
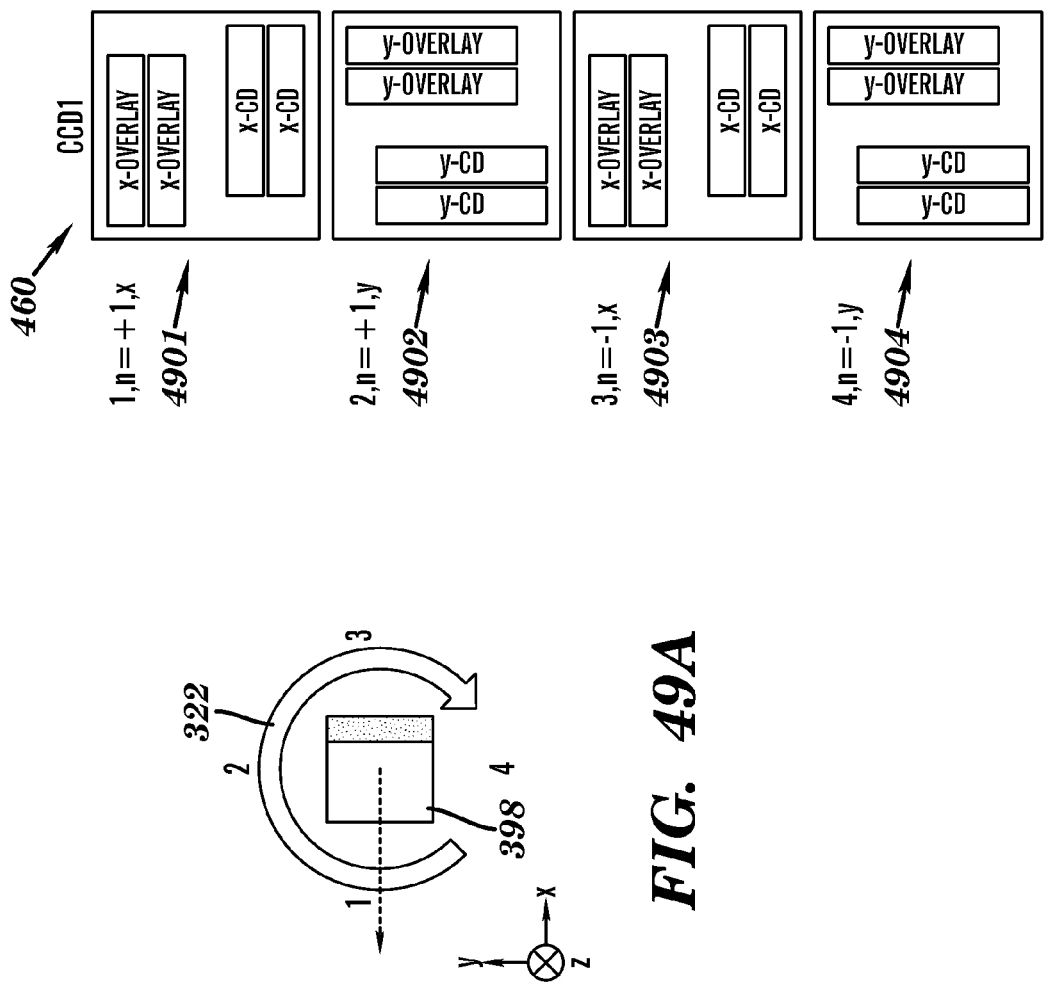
FIG. 49B
FIG. 49A

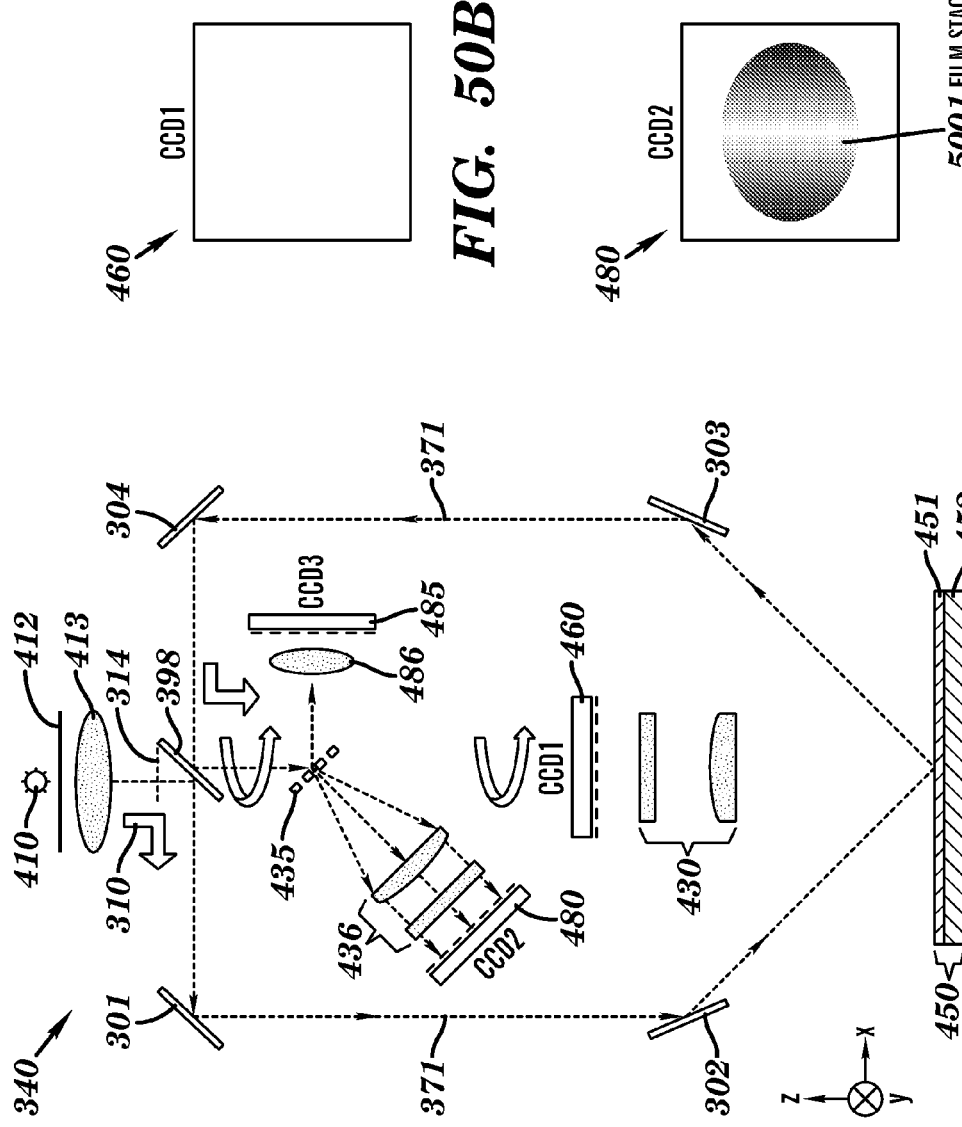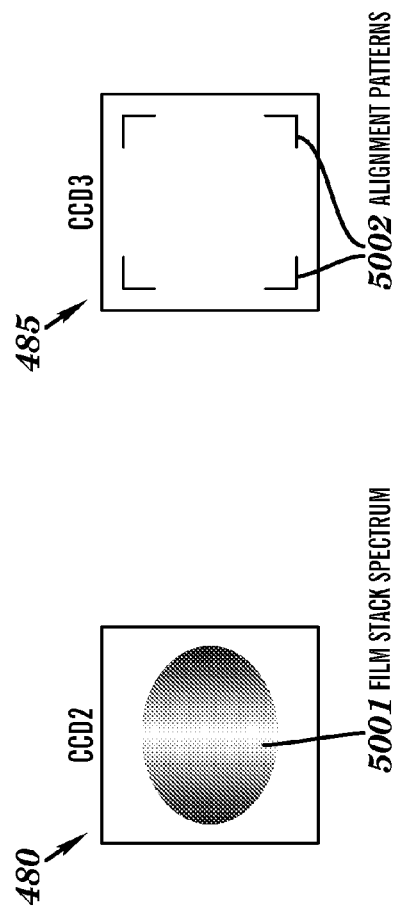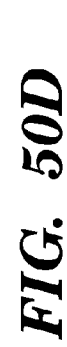

DIFFERENTIAL CRITICAL DIMENSION AND OVERLAY METROLOGY APPARATUS AND MEASUREMENT METHOD

CROSS-REFERENCE TO RELATED APPLICATIONS

This application is a divisional application of U.S. patent application Ser. No. 10/596,614, filed on Jun. 19, 2006. The subject matter of the application Ser. No. 10/596,614 is incorporated herein by reference.

TECHNICAL FIELD

The present invention relates generally to semiconductor manufacturing and, more particularly, to monitoring and control of lithographic and etch process conditions used in microelectronics manufacturing.

BACKGROUND OF THE INVENTION

During microelectronics manufacturing, a semiconductor wafer is processed through a series of tools that perform lithographic processing, followed by etch processing, to form features and devices in the substrate of the wafer. Such processing has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist (hereinafter, also referred to interchangeably as resist) film on a substrate. Those segments of the absorbed aerial image, whose energy (so-called actinic energy) exceeds a threshold energy of chemical bonds in the photoactive component (PAC) of the photoresist material, create a latent image in the resist. In some resist systems the latent image is formed directly by the PAC; in others (so-called acid catalyzed photoresists), the photo-chemical interaction first generates acids which react with other photoresist components during a post-exposure bake to form the latent image. In either case, the latent image marks the volume of resist material that either is removed during the development process (in the case of positive photoresist) or remains after development (in the case of negative photoresist) to create a three-dimensional pattern in the resist film. In subsequent etch processing, the resulting resist film pattern is used to transfer the patterned openings in the resist to form an etched pattern in the underlying substrate. It is crucial to be able to monitor the fidelity of the patterns formed by both the photolithographic process and etch process, and then to control or adjust those processes to correct any deficiencies. Thus, the manufacturing process includes the use of a variety of metrology tools to measure and monitor the characteristics of the patterns formed on the wafer. The information gathered by these metrology tools may be used to adjust both lithographic and etch processing conditions to ensure that production specifications are met.

Referring to FIG. 1, a typical lithographic and etch production manufacturing line 10 for manufacturing semiconductors is illustrated schematically. One or more semiconductor wafers 5 are processed in the manufacturing line 10 along the direction 100. A photocluster 110 contains photolithography tools, including track tools 111 for depositing and baking resist on the wafer, imaging a pattern on the wafer plane (e.g. exposure tools 112), and post-exposure track tools 113 for baking and developing the exposed pattern on the resist film. After photolithography, various tools are used to measure characteristics of the patterns formed on the resist. For example, an overlay measurement tool (OLM) 120 is used to ensure that the patterns formed on the resist layer are sufficiently aligned to previously formed patterns on the wafer. A scanning electron microscope (SEM) 130 is typically used to measure the width of critical dimensions (CD) of pattern features. The measurements from the metrology tools 120, 130 may be communicated to the photocluster 110 and the etchcluster 140 (typically including an etch chamber 141), as indicated by the dataflow path 135, to allow adjustments to the process conditions in accordance with those measurements.

These measurements are assessed in a disposition step 125, where a decision must be made as to whether the wafer 5 must undergo a rework process 101 in which the resist is stripped from the wafer 5 and sent back to the photocluster 110 to reapply the resist pattern under modified lithographic conditions. If the resist pattern meets production specifications, the wafer 5 can continue to be processed by the etchcluster 140. These decisions are typically made based on a limited number of measurements for each wafer; for example, about 2-3 overlay measurements at about 20 sites and only 1 CD measurement at 5-10 sites per wafer. This limited number of measurements is required to maintain a reasonable throughput processing rate of about 30 seconds per wafer or about 100 wafers per hour.

If the wafer 5 meets overlay and CD measurement requirements, the wafer 5 proceeds to processing in the etchcluster 140 where the resist pattern is transferred to the wafer substrate. Once again, the resulting pattern on the substrate will undergo measurement by metrology tools such as an in-line SEM 130 or atomic force microscope (AFM) 150. Post-etch metrology data from metrology tools 130, 150 may be fed back to other tools in the line along data flow paths 135 so that adjustments to process conditions may be made.

Periodically, more extensive off-line measurements 15 may be made using tools similar to those used in-line, such as an OLM 120, an SEM 130 and an AFM 150, and may also include other tools such as a film thickness measurement tool (FTM) 160 and an electrical probe measurement tool (EPM) 170.

It would be desirable to obtain even more measurements at more sites and on all wafers. Thus, referring to FIG. 2, a more desirable hypothetical wafer processing system 20 may include tools such as an FTM 160 and an OLM 120 within the photocluster 110. Other metrology tools and methods may also be beneficial, such as scatterometry metrology (SCM) 180 and microscopy (MCR) 185, which would provide information that is not typically provided today. Although such a hypothetical processing system 20 would have increased metrology capability over conventional systems, this increased capability would come at the expense of increased complexity and cost.

In recent years, so-called "scatterometry" techniques have been developed that enable optical metrology of periodic structures without the need for sophisticated hardware such as an SEM or AFM. The principle of scatterometry is that detailed information about small patterns can be extracted from the reflected or zero-order diffracted energy of grating-like patterns. Conventional SCM uses reflected energy from patterns on the wafer and compares the signal of the reflected energy to determine pattern characteristics. SCM has the advantage of relative speed and simplicity, but requires the development of extensive libraries of signals to which the reflected signal can be matched. Those libraries are costly and time-consuming to develop, and also require computer servers 190 and associated databases to perform the required comparisons. Scatterometry may be added as well as to off-line metrology systems 25 to improve the quality and quantity of information and subsequent control of lithographic and etch processes. For example, Littau et al. (U.S. Pat. No. 6,429,930) has described using scatterometry to determine the center of focus by measuring a diffraction signature and comparing it to a library of diffraction signatures at different incident angles, wavelengths and/or phases to determine the center of focus. However, scatterometry is computationally intensive, and requires server farms and databases containing signal libraries, thus increasing complexity and cost. Scatterometry requires the simultaneous determination of multiple free parameters pertaining to both the film stack and the target pattern. Its success depends on detailed a priori knowledge of the film stack and pattern characteristics that are often indeterminate. Since conventional scatterometry is not a differential measurement, its application to CD measurement is susceptible to noise: for example, measurement variation such as illumination, wavelength, detector response, target alignment; process variation such as film thicknesses and optical properties. Conventional scatterometry is also restricted to detection of the zeroth diffracted order, which can be used to characterize film thickness, but has typically poor signal to noise ratio in distinguishing signal signatures due to the target CD from those due to the film stack. The targets used with scatterometry must be large enough so that the illumination is contained within the target (i.e. the illumination must be fully landed within the target area), which takes up more chip area than typical CD or overlay targets. In addition, scatterometry capability degrades as target features become more isolated (the ratio of target CD to the target period decreases). Since CD sensitivity to defocus increases with the degree of isolation, the ability to measure defocus, a critical lithographic processing parameter, requires the measurement of isolated features.

It is desirable to control the photolithographic process conditions (e.g. exposure dose and defocus) to ensure the highest quality image. The principal determinant of the photoresist image is the surface on which the exposure energy equals the photoresist threshold energy in the resist film. "Exposure" and "focus" are the variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

The use of microscopy (MCR) 185 can be used in conjunction with specially designed metrology targets to monitor dose and focus, as described further below. The lithographic patterning of wafers in semiconductor manufacturing depends on controlling the lithographic process to guarantee that the various pattern features stay within a common process window. This process window is the parameter space over which all pattern tolerances are met. Thus, accurate measurement and control is required of two fundamental parameters of lithography processing, specifically dose and focus (or defocus). Dose specifies the mean energy of the image, and defocus is the lowest order aberration that causes image degradation. Lithography control must be based on the predetermined response of measurable pattern attributes to dose and defocus. It would be desirable to control dose and focus in-line during the manufacturing process.

One method of characterizing the response of patterns to dose and defocus is through the use of a focus exposure matrix (FEM). A grid or matrix of test patterns is formed in which the grid elements are processed through a range of focus and dose settings, and pattern attributes within each grid element are measured to characterize the lithographic process.

The measurement of pattern attributes is typically performed using either a scanning electron microscope (SEM) or an optical tool to form images of the patterned wafers (e.g. an FEM wafer). However, SEM metrology is expensive to implement, is relatively slow in operation and is difficult to automate.

Methods for using microscopy for obtaining dose and focus have been described by Ausschnitt et al. (e.g. C. P. Ausschnitt, "Distinguishing dose from defocus for in-line lithography control," SPIE, Vol. 3677, pp. 140-147 (1999); Ausschnitt et al., U.S. Pat. No. 5,965,309; Ausschnitt et al., U.S. Pat. No. 5,976,740). Ausschnitt et al. have disclosed dual-tone metrology targets (referred to as "schnitzls") for characterizing dose and focus. The "tone" of a lithographic pattern is determined by the presence or absence of resist material which is normally deposited in a layer or film on the surface of the substrate of a wafer to be etched. Patterns are either resist shapes on a clear background or the absence of resist shapes (i.e., spaces) in a background of resist material. Complementary tone patterns can be formed by interchanging the areas that are exposed during the lithographic process. These tone patterns may be created in resist material by preparing masks with opaque and transparent areas corresponding to the shapes or spaces to be created on the resist material, and then using a source of radiation on one side of the mask to illuminate and project the mask shapes and spaces on to the resist layer at the opposite side of the mask. The dual-tone metrology targets disclosed by Ausschnitt et al. have differential responses (for example, by taking advantage of differential bias and line shortening effects) to dose and focus that can be measured using microscopy systems. A further advantage is that the same microscopy system can be used to measure overlay as well as dose and focus. However, the roughly symmetric sensitivity of schnitzlometry to lithographic focus deviation leads to ambiguity regarding the sign of the focus deviation. In addition, this "schnitzlometry" method requires high quality microscopy and focusing capability in which a precise image of the schnitzelometry and overlay targets must be captured in order to obtain the required measurements. Precise, in-focus image capture adds to the time required for measurement and makes the measurement susceptible to process and environmental variations that might exist within photo- and etch-clusters.

Conventional overlay metrology also depends on microscopy and is susceptible to similar lens quality, focusing and process variation issues. In particular, the use of microscopy introduces error sources such as tool-induced shift (TIS), errors due to tool calibration and optical alignment variation, and wafer-induced shift (WIS), errors due to process nonuniformities in both underlying layers and the overlay target itself.

Accordingly, there is still a need for an inexpensive, rapid, in-line method and system of measuring and controlling the patterning of lithographic and etch processes; one that is primarily sensitive to the pattern dimensions, both on a single level and relative to a prior pattern level, and insensitive to the properties of the film or films in which the patterns are formed and the underlying film stack and substrate.

Bearing in mind the problems and deficiencies of the prior art, it is therefore an object of the present invention to provide an integrated metrology system, including an in-line measurement and control tool, test patterns and evaluation methods for determining lithographic and etch process conditions as well as overlay error whereby one pattern group is capable of distinguishing between exposure, focus and etch problems and a second pattern group is capable of measuring two-dimensional overlay error in semiconductor pattern processing, and the measurement of both groups may be simultaneous.

It is yet another object of the present invention to provide a method of evaluating lithography parameters, such as focus and exposure, and etching parameters, such as rate and isotropy, which is easy and inexpensive to utilize.

It is yet another object of the present invention to provide a single apparatus capable of determining critical dimension, profile attributes (e.g., sidewall angle, thickness loss), exposure and focus conditions, overlay error, and film thickness characteristics.

It is yet another object of the present invention to provide a means of determining corrections to the lithography and etch process parameters to sustain optimum patterning performance.

Still other objects and advantages of the invention will in part be obvious and will in part be apparent from the specification.

SUMMARY OF THE INVENTION

The above and other objects and advantages, which will be apparent to one of skill in the art, are achieved in the present invention, which is directed to, in a first aspect, a method for measuring a dimension on a substrate, including providing a nominal pattern comprising an array of features having a primary pitch of period P in a primary direction, wherein the nominal pattern is characterized by a nominal characteristic dimension that repeats at the period P along the primary direction (e.g., the x-direction), and the nominal characteristic dimension has a pre-determined variation along a direction orthogonal to said primary direction (e.g., the y-direction). The nominal pattern is used to form a target pattern on the substrate corresponding to the nominal pattern, such that the target pattern has a substrate characteristic dimension corresponding to the nominal characteristic dimension. The characteristic dimension of the pattern is not necessarily the dimension of interest to be measured. The target pattern formed on the substrate is then illuminated with radiation characterized by at least one wavelength, so as to produce diffracted orders. A relationship between a dimension of interest (i.e., the dimension to be measured) and a detected variation of one or more non-zeroth diffracted orders along said orthogonal direction, in response to a deviation of the substrate characteristic dimension relative to the nominal characteristic dimension, is provided. The corresponding variation of the one or more non-zeroth diffracted orders along the orthogonal direction (e.g. the y-direction) is detected and the dimension of interest is then determined in accordance with the provided relationship, based on the detected variation of said one or more non-zeroth diffracted orders. In the case where multi-wavelength or broadband illumination is used, the variation of the one or more non-zeroth diffracted orders in the parallel direction (e.g. the x-direction) is detected to determine the spectral response of the diffracted intensity to changes in the target dimensions and profile characteristics.

Preferably, variations in intensities of the first non-zero diffracted order is collected, although the invention contemplates that any, or multiple, detectable non-zero diffracted order may be used. Through the use of multi-wavelength or broadband illumination, the method allows for the measurement and control of pattern profile characteristics as well as dose and defocus.

The method is adaptable for the measurement of critical dimension (CD). Through the use of dual-tone target patterns designed according to the invention, the method allows for measurement and control of lithographic parameters, such as dose and defocus.

The method is also adaptable for overlay measurements. In the case of overlay measurements, variations in intensity and phase of one or more non-zeroth diffracted orders is used.

In another aspect, the invention is directed to an apparatus for performing metrology measurements comprising a source of radiation for illuminating a target pattern, a detector for detecting the variation of one or more non-zero diffracted orders, means for securing a substrate, means for positioning the source, the substrate and the detector so that the source illuminates the target pattern, and so that the detector detects the variation of one or more non-zero orders of said radiation diffracted from the target pattern.

The apparatus of the present invention may be further configured with a second detector for detecting the zeroth order of the radiation diffracted from the target pattern, including means for positioning the second detector relative to the source and the substrate so that the second detector detects the zeroth order, and means for determining a second dimension of interest based on the detected zeroth order. For example, film thickness may be determined by detecting the zeroth order reflected from unpatterned regions of the substrate or unpatterned areas of the target.

The present invention is directed, in yet another aspect, to an apparatus for differential metrology that is configured for in-line operation (e.g. on a production track or etch tool) during semiconductor manufacturing semiconductor of, for example, integrated circuits. The apparatus includes means for determining a deviation in process conditions (e.g. dose and defocus, or etch rate and isotropy) from nominal process conditions based on the variation of the one or more non-zeroth diffracted orders, and means for providing adjustments in subsequent process conditions in response to the determined deviation in process conditions.

BRIEF DESCRIPTION OF DRAWINGS

The present invention, which provides a method for Critical Dimension (CD), overlay and film-thickness metrology and lithographic process control, will now be described in more detail by referring to the drawings that accompany the present application. It is noted that in the accompanying drawings like reference numerals are used for describing like and corresponding elements thereof. The drawings are not necessarily drawn to scale.

FIGS. 7A-7F illustrate the image of the first order diffracted intensity of the tapered grating target on the CCD array of the apparatus of FIG. 4, where FIG. 7A illustrates the image, FIG. 7B illustrates the intensity summed in the direction parallel to the target period, and FIG. 7C illustrates the intensity summed in the direction perpendicular to the target period for monochromatic illumination. FIGS. 7C-7F are the corresponding figures illustrating the case of multi-wavelength illumination.

FIG. 10A is the top view, FIGS. 10B-C are the cross-sectional views of the substrate and target.

FIGS. 11A-11D shows the simulated contours of the space and shape ends that delineate the target of FIGS. 10A-10C.

FIG. 18 illustrates the image of the first order diffracted intensity of the two grating regions.

FIG. 33 shows the zero order detected intensity for the target layout of FIG. 17.

FIG. 34 are the apparatus configurations for imaging both positive and negative first order diffraction.

FIGS. 49A-49D illustrate the sequential detected positive and negative first order intensities of the target shown in FIG. 48, the constant detected zero-order intensity, and the target image used for pattern recognition and alignment.

FIGS. 50A-50D illustrate an apparatus enabling spectroscopic film thickness measurement in the absence of a target pattern on a wafer.

DETAILED DESCRIPTION OF THE INVENTION

Differential CD

Figure 1:
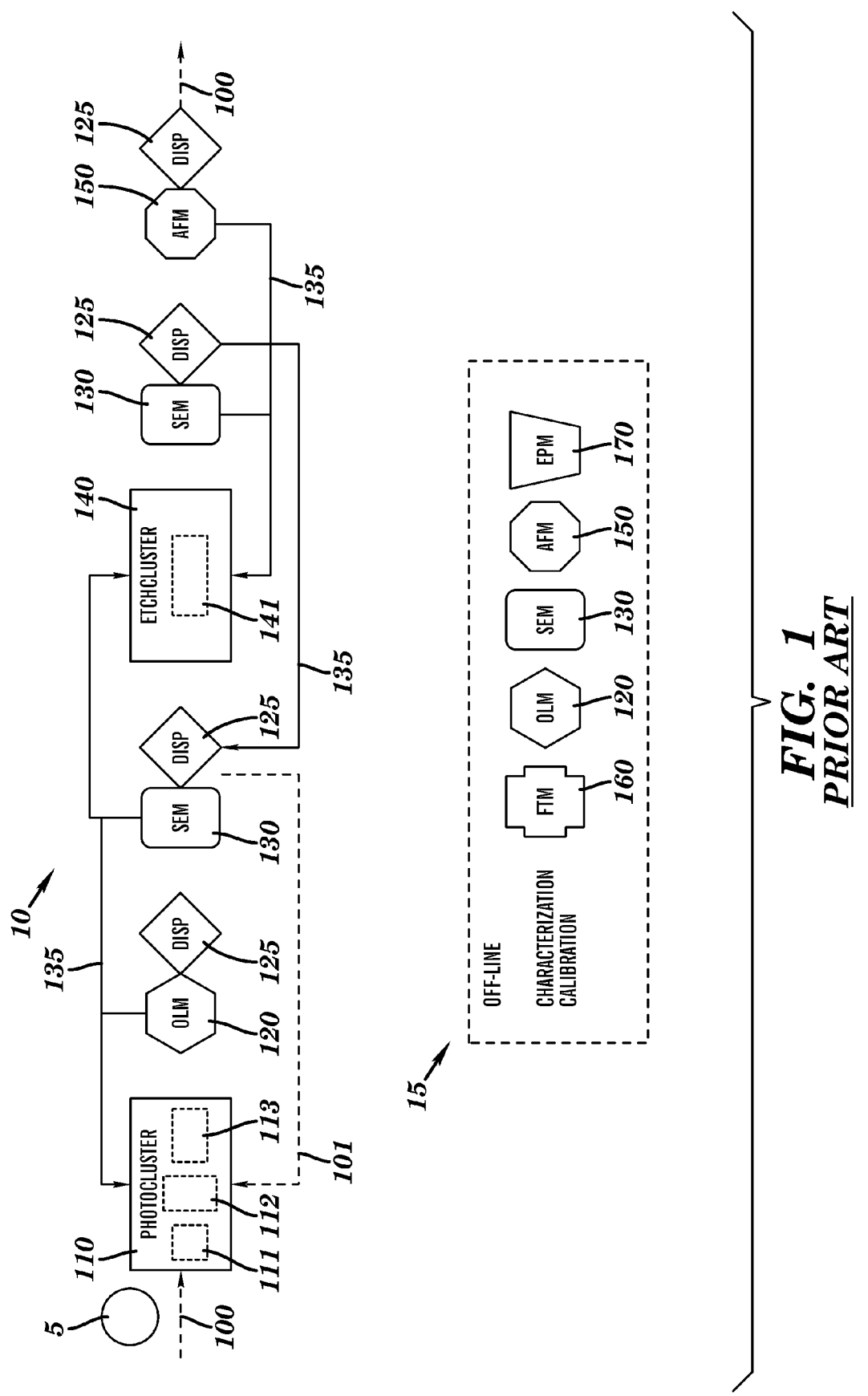
FIG. 1 depicts the typical components of a semiconductor patterning system consisting of lithography, etch and various metrology tools.
Figure 2:
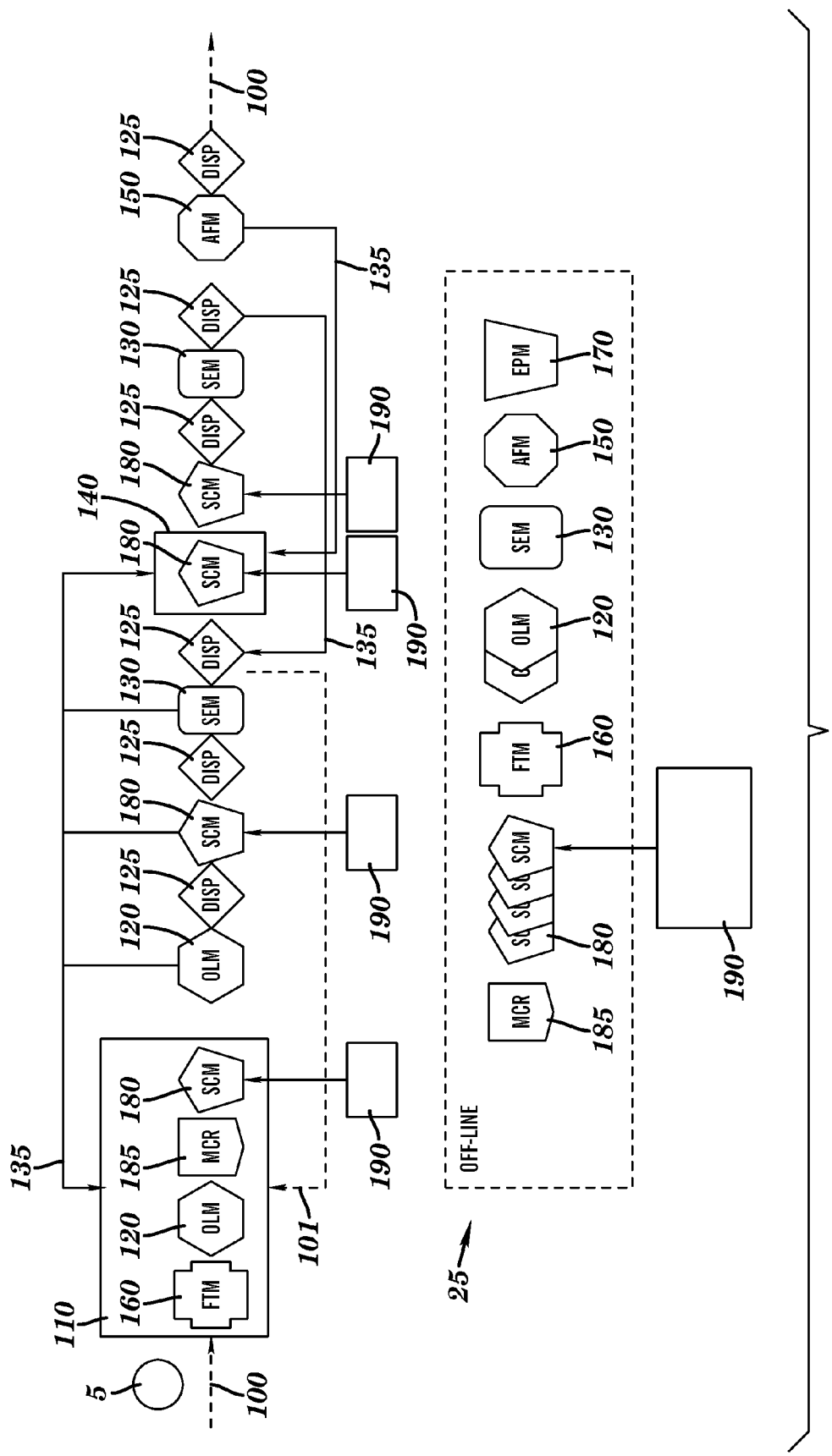
FIG. 2 illustrates a semiconductor patterning system having increased complexity resulting from the use of scatterometry (SCM) tools.
Figure 3:
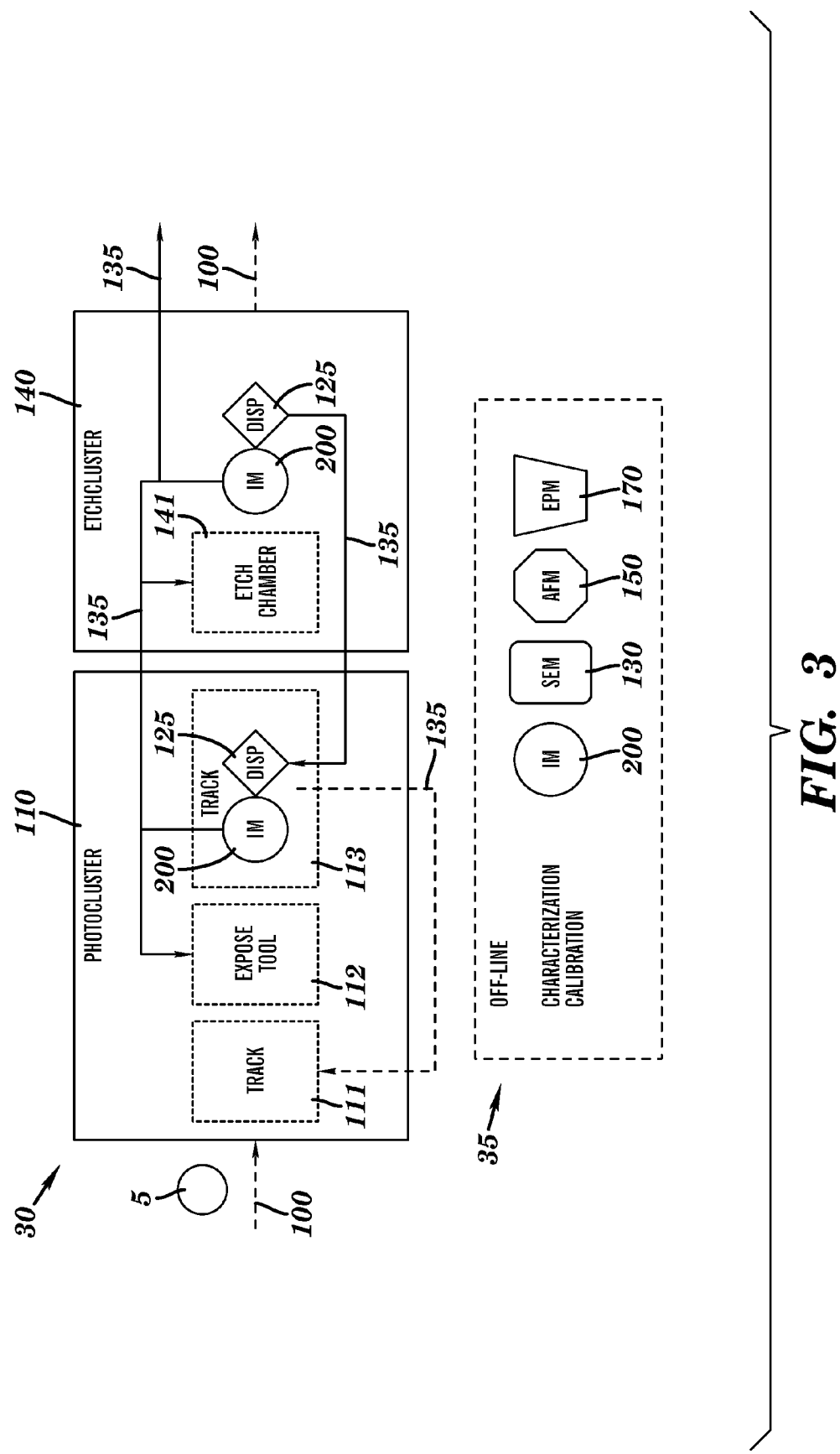
FIG. 3 shows a semiconductor patterning system resulting from the use of the inventive integrated metrology (IM) apparatus.

Referring to FIG. 3, in accordance with the present invention, a single, integrated, optical metrology (IM) tool 200 is described that may be used to perform sequential or simultaneous measurements of CD, overlay and film thickness. The IM tool 200 of the present invention may be deployed within an in-line processing system 30, in which the IM tool 200 obviates the need for an SEM tool 130, an OLM tool 120, an FTM tool 160 or an SCM tool 180 (see, e.g. FIG. 1 or 2). The IM tool 200 may be configured to be integrated into a lithographic processing tool or an etch processing tool, thus enabling metrology during in-line processing. The novel differential targets and measurement methods used by the IM tool 200 provide in-situ CD and overlay calibration at each measurement site. The IM tool 200 used in conjunction with appropriate metrology targets, to be described in more detail below, can obtain measurements on many more wafer sites on all wafers quickly and reliably, without increasing cost and complexity, and will maintain or increase the throughput of wafers as compared to conventional metrology methods. For example, it would be desirable to perform at least fifty measurements on each wafer, but maintain wafer throughput of at least 100 wafers per hour. This translates to move, align and measurement (MAM) times of approximately 0.5 sec at 50 measurements per wafer. Current MAM times are in the range of 3-5 seconds per wafer site. The IM tool 200 may also be deployed in an off-line system 35, in place of an FTM tool, an SEM tool, an OLM tool or an SCM tool, thus reducing overall cost and complexity.

In accordance with the invention, an integrated metrology (IM) system, including a method, an apparatus and target structure is described for performing optical measurements of CD, dose and defocus, and overlay. The same apparatus may be used for all of these measurements, with appropriately designed target structures and methods. The inventive IM apparatus and system may also be adapted to obtain other measurements, such as film thickness and pattern profiles, using conventional methods that use reflected or scattered energy (e.g. conventional reflectometry, ellipsometry or scatterometry). The inventive IM system is suitable for use during in-line wafer processing within the photocluster and within the etch cluster, or for off-line wafer processing. Since the inventive system is configured to detect distinct orders diffracted from a designed target metrology structure on the wafer, for convenience, the inventive metrology method and system, including associated target structures, is hereinafter referred to as "diffractometry." Reference is made to the drawings to illustrate the method according to the present invention, which are not necessarily drawn to scale.

Figure 4B:
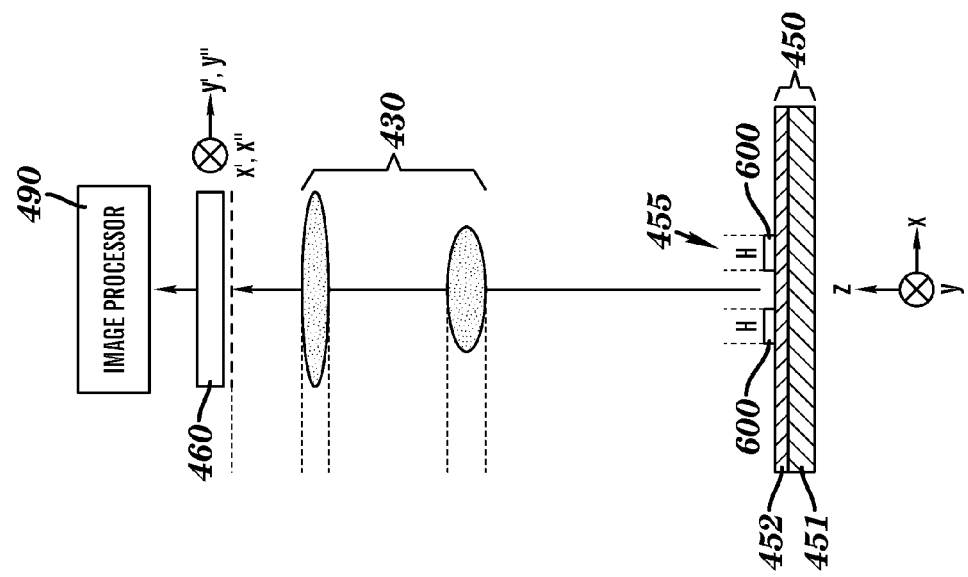
FIGS. 4A and 4B illustrate, respectively, orthogonal side views of an embodiment of the inventive apparatus.
Figure 4A:
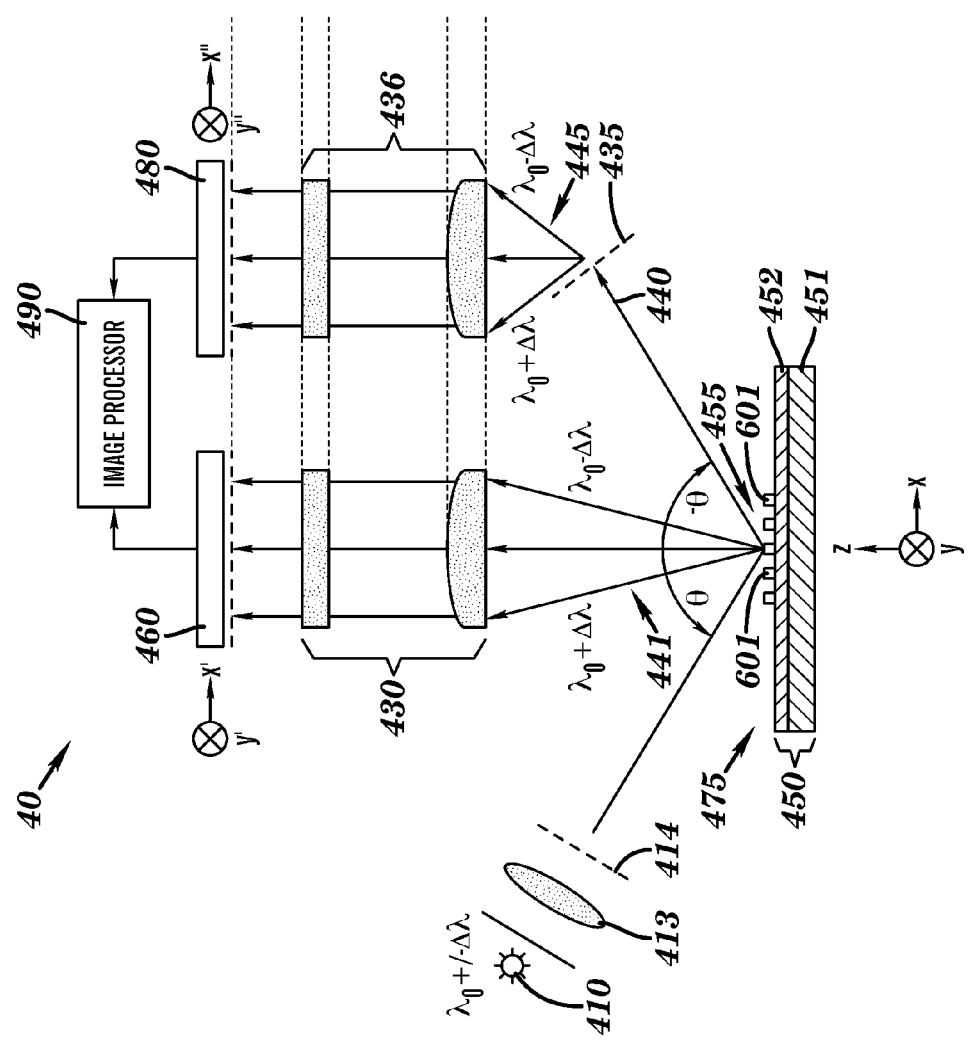

One embodiment of a diffractometry system 40 in accordance with the present invention is illustrated schematically in FIGS. 4A-4D. An illumination source 410 is provided, which is preferably a multi-wavelength source, such as a set of light emitting diodes (LEDs) or lasers, or finite-band source, such as a Xenon lamp, which is projected through illumination optics 413 (which may include a demagnifying objective and a collimating objective, not shown) onto a target 455 formed on a wafer 450. In FIG. 4A, the wafer 450 is located on horizontal plane having x- and y-directions (where the y-axis is pointing in and out of the plane of FIG. 4A), and the axis orthogonal to the plane of the wafer is the vertical z-direction. The wafer 450 may include a substrate 451 and a film stack 452 which may be include at least one, and typically several layers, including, for example, a layer of photoresist (or resist) material. A polarizer 414 is optionally provided which can be set to optimize the diffraction efficiency of the diffracted orders and/or the reflectivity of the wafer 450 in the absence of a target 455. In particular, transverse magnetic (TM) field polarization will enhance the first-order diffraction efficiency from grating targets 455. A color filter 412 is optionally provided which tailors the bandwidth around the primary illumination wavelength $\lambda_0$ so that the illumination energy ranges through at least one band of wavelengths $\pm \Delta \lambda$ wide enough to ensure sufficient contrast in the signal reflected off a patterned target 455 that is distinguishable from the signal reflected from an unpatterned region 475 of the surface of the wafer 450. For targets formed in resist, the illumination bandwidth $\lambda_0 \pm \Delta \lambda$ must fall outside the range of actinic energy so that the resist is not subjected to additional modification. The illumination energy is preferably not purely monochromatic because monochromatic illumination could be extinguished by internal reflection in a layer of a given thickness in the film stack 452. Thus, the filter 412 provides at least one band of energy having wavelengths in a bandwidth of $\lambda_0 \pm \Delta \lambda$, where $\lambda_0$ is chosen so that non-zero diffracted orders of the target 455, having a primary pitch P, as discussed in more detail below, will be collected by a collection optics or objective lens 430. In the x-z plane illustrated in FIG. 4A, the collection optics 430 projects the wavelength dispersed non-zero diffracted order onto the detector array 460 at normal incidence. In the y-z plane illustrated in FIG. 4B, the collection optics 430 images the y-dimension of the target 455 onto the detector array 460. The plane of the detector is described by the coordinates (x',y') to distinguish it from the plane of the substrate described by coordinates (x,y). An image processor 490 may be provided to analyze the signal(s) detected by the detector array 460, and determine the dimension of interest. The analysis methodology used in the image processor 490 depends on the dimension to be measured, as described in more detail below.

In the example of a inventive diffractometry apparatus 40 illustrated in FIGS. 4A-4D, configured to image an inventive diffractometry target 455, having a primary period P (or equivalently, pitch P) of repeating elements 601 oriented along the x-direction and chosen so that P>λ. For example, consider a target 455 according to the invention that is comprised of one or more subregions 600, wherein each subregion 600 is comprised of elements 601 that repeat at period P along the x-direction (as illustrated in FIG. 4A), and have dimension H along the y-direction, as illustrated in FIG. 4B. Such a target would be suitable for measuring CD. Similar principles for arranging and configuring the diffractometry apparatus 40 would also apply for imaging an overlay target according to the invention. In a preferred embodiment, the apparatus 40 is configured so that the illumination is directed along the x-direction (i.e., the direction of the primary period P) and is incident on the target 455 at an angle $$\theta = \arcsin(n\lambda_0/P) \quad (1)$$

relative to the z-axis along which the detector 460 is located. Note that the condition P>nλ$_0$ must be met to allow the illumination angle θ to have a real value between 0° and 90°. The zero order ray 440 will be reflected at an angle −θ relative to the z-axis, and the nth diffracted order rays 441 will be substantially parallel to the z-direction.

Provided the condition of Equation (1) is met, the nth diffracted order 441 will be diffracted over an angular distribution roughly symmetric about the z-axis in the x-direction governed by:

$$\Delta\theta = \pm\left(\frac{n\Delta\lambda}{P\cos\theta}\right). \quad (2)$$

The imaging objective 430 is configured to capture the nth diffracted order 441 without interfering with the incident and reflected ray 440, and project an image of the nth diffracted order on a detector array 460. The detector array 460 may be a charge coupled device (CCD) as known in the art, or other similar array. The illumination energy bandwidth λ$_0$±Δλ, and the primary period P of the target 455 are chosen so that the nth diffracted order 441 can be distinguished from other diffracted orders without overlap in the direction of primary periodicity (i.e. along the x'-direction) at the detector array 460. If P=1000 nm, for example, broadband illumination in the range λ$_0$±Δλ=500±200 nm incident at θ=30 deg has first order diffraction angles in the range ±Δθ=±13.3 deg.

Figure 4C:
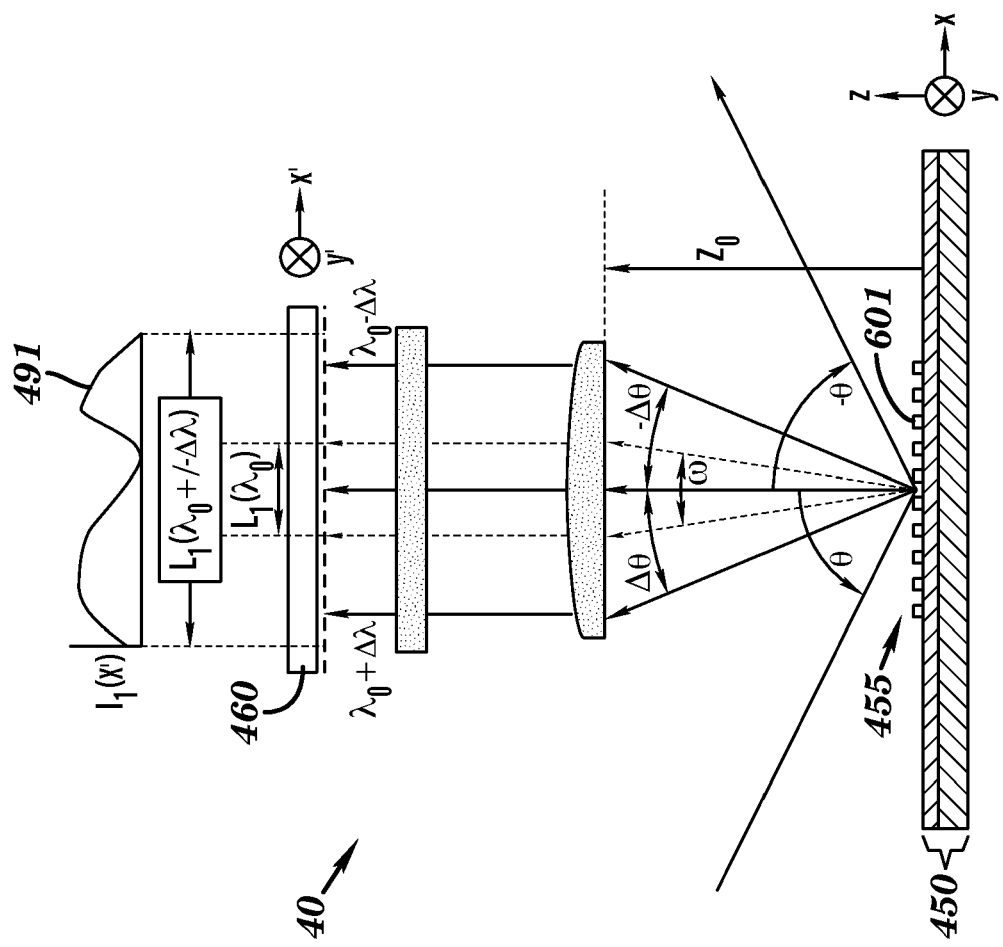
FIG. 4C illustrates a more detailed view of the apparatus view in FIG. 4A.

The collection lens 430 is designed to image the y-dimension of the target 455 onto the detector array 460 at a magnification M. Thus the diffracted energy on the detector 460 spans a y'-dimension that is always a multiple M of the target subregion 600 y-dimension H. In the x-direction, the target 455 is comprised of N elements 601 spaced at a period P. For plane-wave monochromatic illumination, the non-zero order diffracted energy projected onto the detector array 460 spans an x'-dimension L$_f$(λ$_0$) determined by the divergence of the diffracted beam at the surface of the collection lens 430. The angular width of the principal fringe of the diffracted beam ω shown in FIG. 4C, is given by:

$$\omega = \frac{\lambda}{NP\cos(\theta)} \quad (3)$$

The period P and number N of elements 601 making up the target 455 should provide sufficient angular dispersion at the illumination wavelength λ so that the first diffractive order can be distinguished from other diffracted orders. For example, about 10 elements 601 at a pitch P of about 1 μm along the x-direction would provide a sufficiently small angular dispersion of about ±2 degrees. Thus, the total dimension along the x-direction of a preferred embodiment of the target 455 is on the order of 10 μm. For N=10, P=1 μm, λ$_0$=500 nm, θ=30 deg, Equation (3) gives ω≅3.3°. At the lens surface the beam spread is z$_0$ tan(ω), where z$_0$ is distance of the collection lens from the substrate. The intensity of the non-zero diffracted order may vary along the x'-dimension of the detector, for example, as indicated by the plot 491 of first order intensity I$_1$(x'). The span of diffracted energy at the detector array 460 will have a length L$_f$ that depends on the bandwidth of the illumination, as illustrated in FIG. 4C. For monochromatic illumination of wavelength λ$_0$, and for z$_0$=10 mm, therefore, the x'-direction span of the diffracted energy on the detector array would be L$_f$(λ$_0$)≅600 μm. For multi-wavelength or broadband illumination in the range λ$_0$±Δλ, the propagation divergence is convolved with the x-direction wavelength dispersion to further spread the projected energy in the x-direction. In the case of broadband illumination, this results in a continuous distribution of the projected energy over the angle ±Δθ in the x-direction. For the case considered above where Δθ=13.3 deg, the total spread of the detected energy in the x'-direction is L$_f$(λ$_0$±Δλ)≈5 mm. In the case of discrete multi-wavelength illumination, this results in multiple beams that may or may not overlap depending on the wavelength angular dispersion relative to the divergence angle.

Figure 4D:
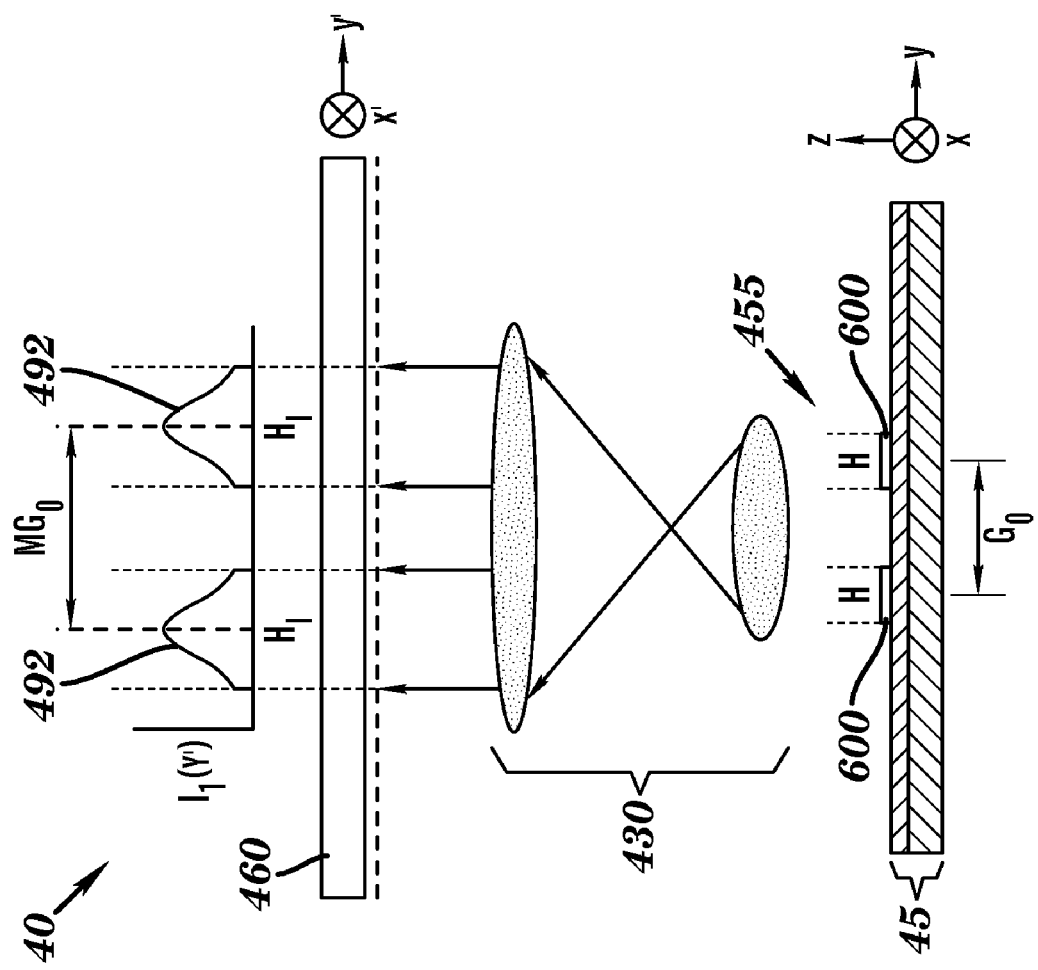
FIG. 4D illustrates a more detailed view of the apparatus view in FIG. 4B.

To achieve the projection characteristics described, the numerical apertures NA$_{x,y}$, of the collection optics 430 must satisfy the criteria NA$_x$≧sin Δθ and NA$_y$≧0.7 λ/H. The first criterion ensures that the collection optics 430 captures the diffracted rays 441 within the divergence angle ±Δθ in the x-direction. The second criterion ensures that the collection optics 430 resolves the minimum y-dimension H of the target 455. An inventive CD metrology target 455 is designed to include one or more finite grating "sub-patterns" or subregions 600 of N elements 601 spaced at a primary period (pitch) P having at least one designed nominal width W$_0$. The overall dimension of a finite grating sub-pattern 600 typically has a rectangular shape, that can be characterized by an overall minimum sub-pattern height H and sub-pattern length L. The NA$_x$ of the detection objective 430 must encompass the full angular dispersion ±Δθ of the broadband illumination in the x-direction without interfering with the incident and reflected ray 440. In the case considered above, where Δθ=13.3 deg, 0.23≦NA$_x$<0.5 is required. There is a direct tradeoff between NA$_y$ and target size. At λ=700 nm and H=2.5 μm, NA$_y$≧0.1 is required. To maximize depth of focus, it is preferable to operate at the lower end of the allowed NA$_{x,y}$ ranges with the diffracted rays nearly normal to the substrate as shown in FIGS. 4A-4C. Typical CCD arrays have a physical pixel (i.e., detector element) size of about 10 μm. For H=5 μm, the imaging objective 430 magnification M must be at least 80 to span 40 pixels in the y'-direction on the detector array 460. For the broadband case considered earlier, therefore, the projection of the first diffracted order spans an (x',y') region L$_f$×MH≈5.0 mm×0.4 mm. If there are more than one subregions 600, separated by a pitch G$_0$, then the span of the projected images 492 will be increased by $MG_0$. For example, the span along the y'-direction will be $M \times (G_0+H)$ for the case of two subregions 600, as illustrated in FIG. 4D.

The diffractometry system 40 shown in FIG. 4A also allows the separate detection of the zero order or reflected ray 440. If the zero order ray 440 is passed through a wavelength dispersive optical element 435 and the angularly dispersed rays 445 (shown as the non-zero diffracted order of a transmission grating 435 in FIG. 4A) are collected by a collection optic 436 prior to detection at a detector 480 (such as a CCD array), then the diffractometry system 40 could also be used for conventional spectroscopic reflectometry or ellipsometry to measure film thickness as well as conventional spectroscopic scatterometry to measure the CD of nested $P<\lambda$ structures. In a manner similar to the collection optic 430, the collection optic 436 can be designed to project the rays dispersed in the x-direction at normal incidence onto the detector 480, as shown in FIG. 4A, while imaging the target dimension in the y-direction, comprising one or more subregions 600 of dimension H along the y-direction.

The design of target 455, in accordance with the present invention, will depend on the characteristic to be determined, e.g., whether CD (including profile attributes), or overlay. Specific target designs can enhance the response of the measured CD and overlay attributes to process parameters, such as dose and focus, to facilitate feedback and feedforward corrections to these parameters during the various patterning process steps, that is, in real time during processing on the track. The measurement of film thickness could be performed using the diffractometry system 40 on the film stack 452 absent a target pattern, by capturing the zeroth diffracted order (reflected ray) 440. Furthermore, multiple targets can be grouped within the illuminated area of the substrate to enable the simultaneous determination of CD, overlay and film thickness as described below.

For the purpose of measuring CD, the target 455 is designed, in accordance with the present invention, to have differential response to processing conditions, such as lithographic dose and defocus and etch rate and isotropy, during formation on the wafer, as discussed in more detail below. The design principles for the inventive CD targets can be better understood by reference to FIGS. 5A and 5B.

Figure 5A:
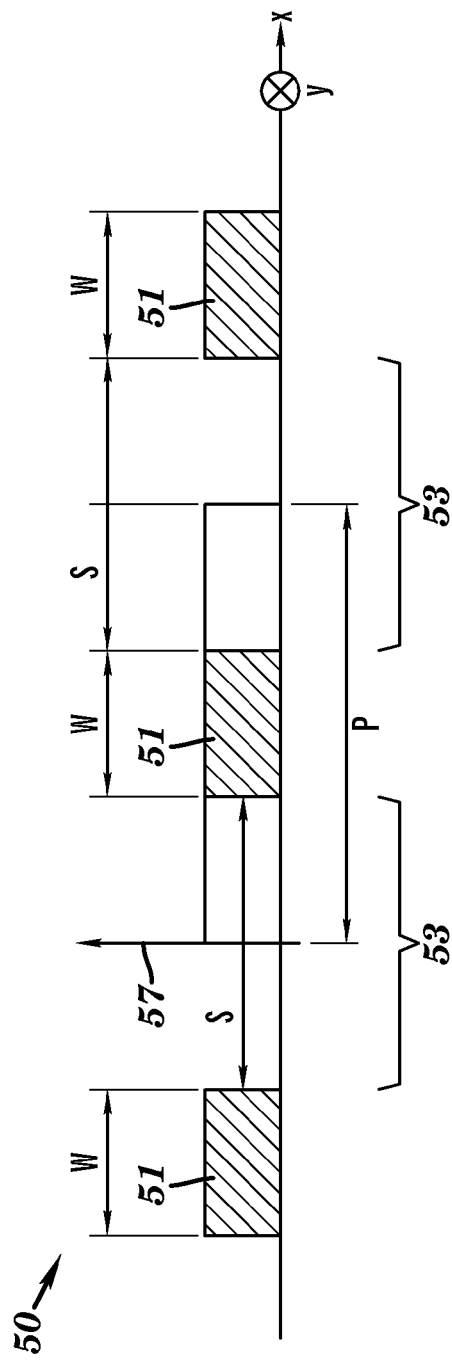
FIG. 5A shows a schematic of the two-dimensional reflectivity of a grating target.

An idealized grating 50 is illustrated in FIG. 5A, wherein the grating having periodic array of lines 51 having linewidth W and spaces 53 having spacing width $S=P-W$, in which the grating is characterized by a period P in the direction of the horizontal axis x. The vertical axis 57 in FIG. 5A illustrates the relative complex reflectivity amplitude. If the reflectivity of a line 51 (e.g. a resist line) is $R_L$ and the reflectivity of the exposed substrate in the space 53 is $R_S$, then the relative reflectivity is $R_{LS}=R_L-R_S$. The relative reflectivity is a function of the illumination wavelength and angle of incidence. For the sake of simplicity, we assume the transition between the two reflectivity regimes is abrupt, equivalent to the assumption of vertical sidewalls on the grating elements. The presence of non-vertical sidewalls complicates the analysis by adding a transition region of variable reflectivity between $R_L$ and $R_S$, but does not fundamentally alter the result regarding the determination of the average W; i.e., the CD averaged over the height of the sidewalls of the grating element. Inclusion of non-vertical sidewall effects enables the determination of profile attributes as well as the average W. The spatial variation of the reflectivity amplitude $a(x,y)$ over the surface of a finite grating having a period P consisting of N elements (e.g. lines) of length (or height) H (wherein H is oriented parallel to the y-axis) illuminated by an amplitude $A_0$, that also may be a function of wavelength, is described by the following equation:

$$a(x, y) = A_0 \left\{ R_S + R_{LS}\left[rect\left(\frac{y}{H}\right)rect\left(\frac{x}{W}\right) \otimes comb\left(\frac{x}{P}\right)\right]rect\left(\frac{x}{NP}\right) \right\} \quad (4)$$

In the scalar diffraction theory approximation valid for $P>\lambda$, the far-field amplitude $A_n$ of order n at each wavelength is given by the Fourier transform of Equation (4):

$$A_n(u, v) = \quad (5)$$
$$A_0 \left\{ R_S \delta(u, v) + R_{LS}HWNP\text{sinc}(Hv)\text{sinc}(Wu) \sum_n \text{sinc}\left[NP\left(u - \frac{n}{P}\right)\right] \right\}$$

where (u, v) are the far-field coordinates at a distance z from the grating defined by $(u=x/\lambda z, v=y/\lambda z)$. For $n \neq 0$, the diffracted order intensities $I_n=|A_n|^2$ are given by:

$$I_n(u, v) = (A_0 HWNP)^2 |R_{LS}|^2 \text{sinc}^2(Hv)\text{sinc}^2(Wu) \quad (6)$$
$$\text{sinc}^2\left[NP\left(u - \frac{n}{P}\right)\right]$$
$$= \left(\frac{A_0 HNP}{\pi u}\right)^2 |R_{LS}|^2 \text{sinc}^2(Hv)\text{sinc}^2\left[NP\left(u - \frac{n}{P}\right)\right]$$
$$[1 - \cos(2\pi Wu)]$$

Equation (6) is separable into wavelength $\lambda$ dependent and target element width W dependent terms. In the direction $$\left(u = \frac{n}{P}, v = 0\right)$$

the intensity in the plane of the detector 460 of FIGS. 4A-4D is dispersed in wavelength in the x'-direction according to Equation (1) and imaged at a magnification M in the y'-direction.

$$I_n(\lambda, W) = \left(\frac{A_0 HNP^2}{\pi n}\right)^2 |R_{LS}(\lambda)|^2 \left\{1 - \cos\left(\frac{2\pi n W}{P}\right)\right\}. \quad (7)$$

The wavelength and linewidth dependent components of Equation (7) are separable. In the (x',y') plane of the detector, the x'-direction intensity distribution $I_n(x')$ is obtained by integrating over W:

$$I_n(x') = \left(\frac{1}{P}\right)\left(\frac{A_0 HNP^2}{\pi n}\right)^2 \left[\int_0^P \left\{1 - \cos\left(\frac{2\pi n W}{P}\right)\right\} dW\right] |R_{LS}(\lambda)|^2 \quad (8)$$
$$= \left(\frac{A_0 HNP^2}{\pi n}\right)^2 |R_{LS}\{\lambda(x')\}|^2.$$

The distribution of intensity in the x'-direction provides a direct measure of the relative reflectivity magnitude $|R_{LS}\{\lambda(x')\}|$. On the other hand, the y'-direction intensity distribution $\bar{I}_n(y')$ is obtained by integrating over $\lambda$:

$$I_n(y') = \qquad (9)$$
$$\left(\frac{HNP^2}{\pi n}\right)^2 \left(\frac{1}{2\Delta\lambda}\right)\left[\int_{\lambda_0-\Delta\lambda}^{\lambda_0+\Delta\lambda} |R_{LS}(\lambda)|^2 \, d\lambda\right]\left\{1-\cos\left(\frac{2\pi n W\left(\frac{y'}{M}\right)}{P}\right)\right\}.$$

The distribution of intensity in the y'-direction is a function of W. Furthermore, we can define diffraction efficiencies $DE_n$, the fraction of illumination energy diffracted into a particular order, as:

$$DE_n(\lambda) = \frac{I_n(x')}{|A_0|^2(HNP)^2} = \left(\frac{P}{\pi n}\right)^2 |R_{LS}(\lambda)|^2 \qquad (10)$$

$$DE_n(W) = \frac{I_n(y')}{|A_0|^2(HNP)^2} \qquad (11)$$
$$= \left(\frac{P}{\pi n}\right)^2 \left(\frac{1}{2\Delta\lambda}\right)\left[\int_{\lambda_0-\Delta\lambda}^{\lambda_0+\Delta\lambda} |R_{LS}(\lambda)|^2 \, d\lambda\right]$$
$$\left\{1-\cos\left(\frac{2\pi n W}{P}\right)\right\}$$

Figure 5B:
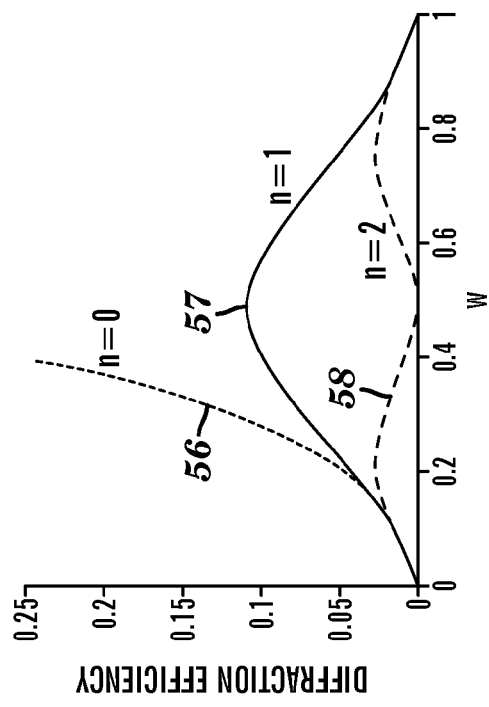
FIG. 5B illustrates the resulting first order intensity as a function of the width of the grating elements of FIG. 5A.

FIG. 5B illustrates plots of the diffraction efficiency $DE_n$ (W) 56, 57, 58 of the n=0, 1 and 2 diffracted orders, respectively, as a function of normalized line width $$w \equiv \frac{W}{P}$$

as given by Equation (11) in the case where we assume the relative reflectivity $R_{LS}(\lambda)=1$. The plots 56, 57, 58 show that when the normalized line width w=0.5 (when the amount of patterned area is 50% of the total grating area, the grating is referred to as a 50% duty cycle grating), the 1st diffracted order 57 is at peak intensity and the 2nd diffracted order 58 is at a null.

Figure 6:
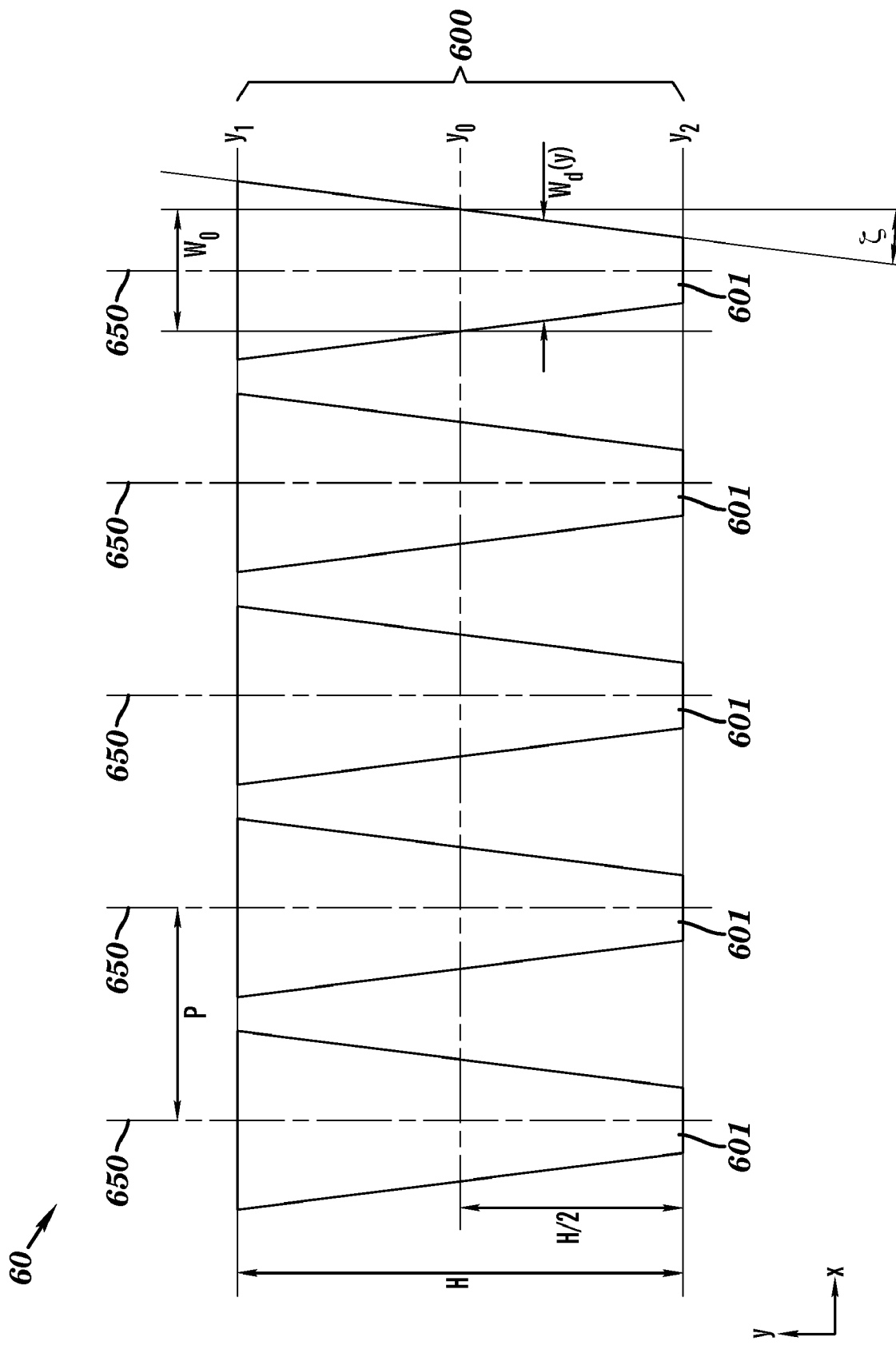
FIG. 6 is a top-down view of a grating target consisting of tapered grating elements.

FIG. 6 illustrates one embodiment of a diffractometry target design 60 suitable for use with the diffractometry system 40 (see FIGS. 4A-4D) in accordance with the present invention, useful for measuring critical dimension (CD). The CD target 60 includes one sub-pattern region of N (wedge shaped) elements 601 spaced at period P (here, the period P is measured along the x-direction, which is the direction of primary periodicity of the target pattern) measured between the center axis 650 of a grating element 601, which has a length H that is substantially orthogonal (i.e. along the y-direction) to the direction of target periodicity (i.e. the x-direction). The designed width $W_d$ of each element 601 preferably varies linearly along the y-direction over the dimension H:

$$W_d(y) = (y - y_0)\tan\zeta + \frac{P}{2} \qquad (12)$$

where $\zeta$ is the taper angle of the elements with respect to the y-axis, and $$y_0 \equiv \frac{y_1 + y_2}{2}$$

is the midpoint of the dimension H where $$W_d(y_0) = \frac{P}{2}.$$

Over the range of printing linearity in the vicinity of $y_0$, the printed width W(y) is, in turn, determined by:

$$W(y) = (y - y_m)\tan\zeta + \frac{P}{2} \qquad (13)$$

where $y_m$ is the measurable location of the maximum or minimum of a non-zero diffracted order.

Figure 7E:
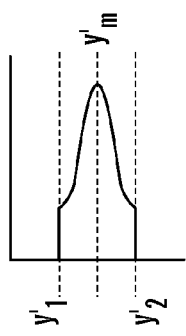
Figure 7D:
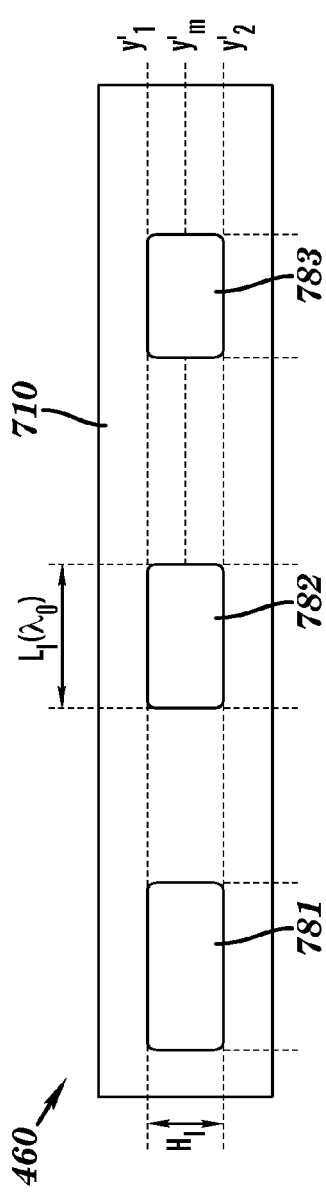
Figure 7F:
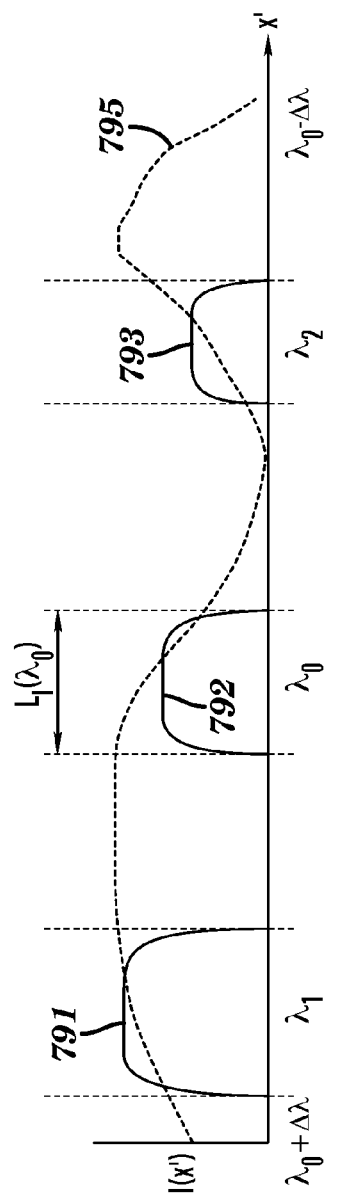

The image of first order diffraction detected at the detector array 460 for the tapered grating CD target 60 of FIG. 6 is illustrated in FIGS. 7A-7F. The imaging lens 430 of the inventive diffractometry system 40 is assumed to have a magnification M in the range necessary to resolve the x, y intensity variation, typically 50-100. FIG. 7A illustrates the image intensity $I_1(x',y')$ in a region of detection 710 plotted on a plan view of the detector array 460 for the case of monochromatic illumination. FIG. 7B plots the intensity $I_1(y')$ of FIG. 7A integrated or summed along the detectors in the x'-direction. FIG. 7C plots the intensity $I_1(x')$ 790 of FIG. 7A integrated or summed along the detectors in the y'-direction for the case of monochromatic illumination, which spans a width $L_I(\lambda_0)$ determined by the divergence $\omega$ of the optics 430 (see Equation (3) above). For the case of broadband illumination in the range $\lambda_0 \pm \Delta\lambda$, the intensity $I_1(x')$ 795 summed or integrated along the y'-direction, spans a length $L_I(\lambda_0 \pm \Delta\lambda)$ determined by the angular dispersion $\Delta\theta$ as discussed above (see Equation (2)). FIG. 7D illustrates the image intensities $I_1(x',y')$ 781, 782, 783 plotted on a plan view of the detector array 460 in the region of detection 710 for the case of multiple, discrete wavelength illumination at three wavelengths $\lambda_1, \lambda_0, \lambda_2$, respectively, whose first order images are spatially separated on the detector array 460. FIG. 7E plots the intensity $I_1(y')$ of FIG. 7D integrated or summed along the detectors in the x'-direction. The locations of the peaks or nulls of the intensity distributions 781, 782, 783 are the same for a given diffracted order as a function of wavelength, although the magnitude of the intensity may vary. FIG. 7F plots the intensity $I_1(x')$ 791, 792, 793 of intensity distributions $I_1(x',y')$ 781, 782, 783, respectively, for the case of multiple discrete wavelength illumination in FIG. 7D, integrated or summed along the detectors in the y'-direction. An example of the intensity $I_1(x')$ 795 integrated or summed along the y'-direction for broadband illumination in the range $\lambda_0 \pm \Delta\lambda$ is also plotted in FIG. 7F. Since diffraction only occurs within the patterned area of the target, the detected intensity $I_1(x',y')$ is zero outside the roughly $H_I \times L_I$ detection region 710, which has an image height $H_I$ that is MH, and an image length $L_I$.

Depending upon the non-zero diffracted order being detected, the condition W(y')=P/2 corresponds to either a peak (odd orders) or a null (even orders) in the detected intensity; consequently, variations in W(y') from the designed nominal values will cause shifts in the peak or null locations relative to the fixed $H_I$ perimeter. In the case of first order diffraction, the measured value of the printed dimension $W(y'_0)$ at the center of each target element 601 is given by the measured peak location $y'_m$ relative to the measured image center $$y'_0 = \frac{y'_1 + y'_2}{2}.$$

Substituting $y'_0$ in Equation (13), $W(y'_0)$ (i.e. the CD), can be obtained:

$$W(y'_0) = (y'_0 - y'_m)\tan\zeta + \frac{P}{2} \quad (14)$$

The measured peak location can be determined precisely by using the known form of the measured intensity $I_n(y')$ from Equation (9) and substituting the expression for $W(y)$ from Equation (13):

$$I_n(y':a_0, y'_m) = a_0\left\{1 - \cos\left(\frac{2\pi n\left[(y' - y'_m)\tan\zeta + \frac{P}{2}\right]}{MP}\right)\right\} \quad (15)$$

All of the parameters in Equation (15) are known except $a_0$ and $y'_m$. Thus, the location of the intensity maximum or minimum $y'_m$ may be determined by any suitable curve fitting method, such as least squares fit of Equation (15) to the measured intensity $I_n(y')$ using only $a_0$ and $y'_m$ as free parameters. Having determined $y'_m$ and the image center $y'_0$, the printed width $W(y'_0)$ of the target elements 601 at the midpoint of His determined by Equation (14).

Figure 8:
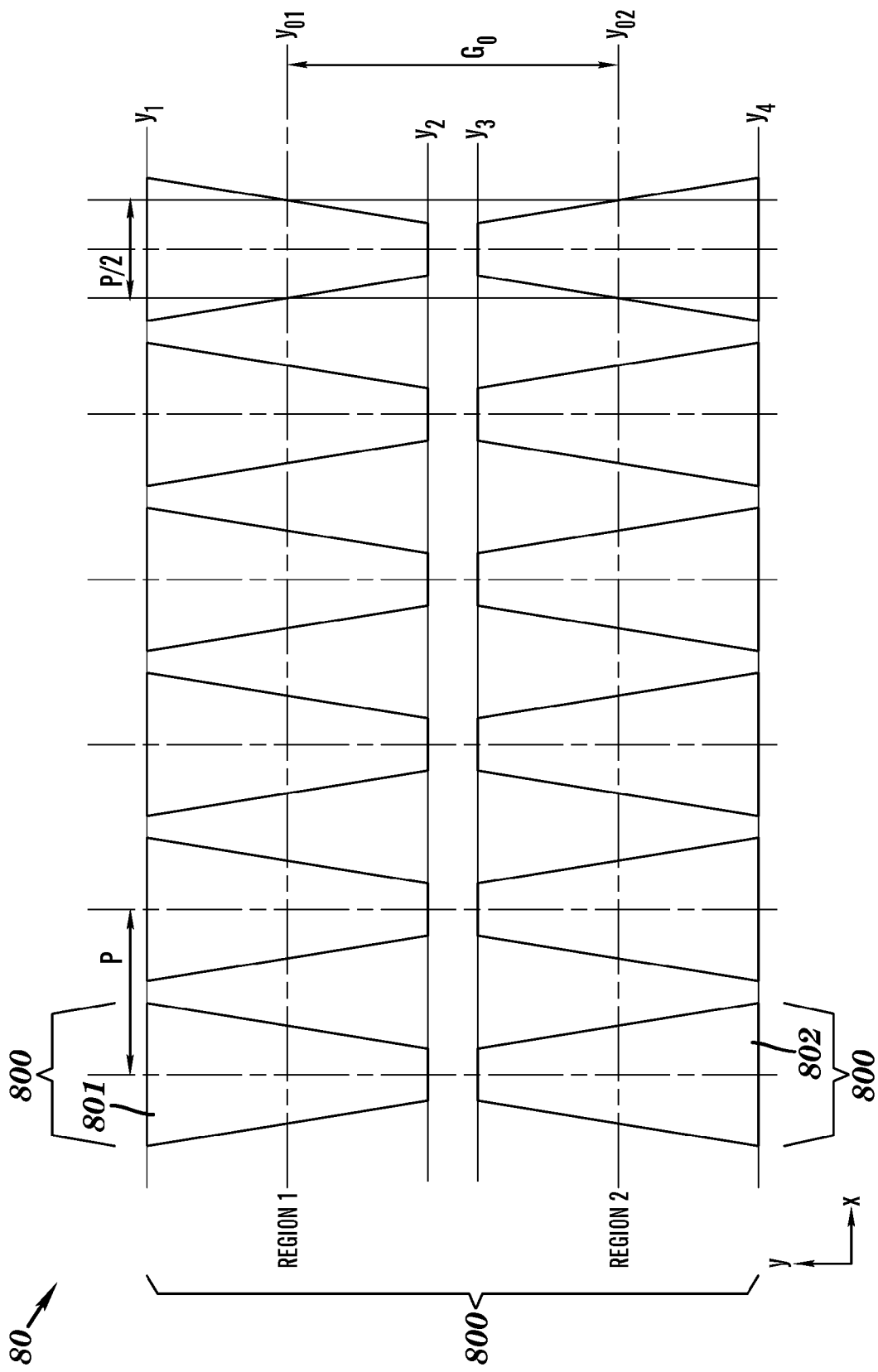
FIG. 8 illustrates a grating target divided into two regions in which the grating elements have opposite taper but a common period.

Another embodiment of target design 80 is shown in FIG. 8, which uses two counter-tapered subregions, Regions 1 and 2, each comprising elements 801, 802, repeating at period P in the x-direction, respectively, which can be arranged to resemble either hourglass-shaped grating elements 800 as shown, or barrel-shaped grating elements (not shown). The elements 801 of Region 1 are separated from the elements 802 of Region 2 by a pitch $G_0 = y_{01} - y_{02}$, where $y_{01}$ and $y_{02}$ are the designed center locations of elements 801 and 802, respectively. This enables measurement of the two peak intensity locations relative to each other, thereby doubling the measurement sensitivity. It has the further advantage that, because a known pitch dimension $G_0 = y_{01} - y_{02}$, which is invariant with process conditions, is incorporated into the target design, the location of the image centers $y'_{01}$ and $y'_{02}$ need not be measured. Measurement of the distance between the two first order maxima $$G = \frac{y'_{1m} - y'_{2m}}{M}$$

(recall that $y'_{1m}, y'_{2m}$ may be determined by curve fitting of Equation 15) enables the determination of the target element width at the image centers $W(y_0) = W(y_{01}) = W(y_{02})$ by:

$$W(y_0) = \left(\frac{P - (G_0 - G)\tan\zeta}{2}\right) \quad (16)$$

The CD, or $W(y_0)$, is determined by the known target dimensions $G_0$, $\zeta$, the known magnification M of the imaging lens, and the measured dimension G.

The target designs of FIGS. 6 and 8 apply to cases where the CD of interest is close to P/2. For the condition $P > \lambda$ necessary to enable optical measurement, this sets a lower limit on measurable CD. However, in another embodiment of the invention, the boundaries of the target elements can be delineated by arrays of sub-elements—features arrayed at a fine pitch $p_f << P$ that is comparable to or less than the minimum pitch of the circuit patterns. The purpose of the fine structure is two fold:

1) Ensure compatibility of the target with the circuit patterns being printed. The coarse, primary pitch P is constrained by the need to generate detectable non-zero order diffracted beams at the wavelengths used for measurement, whereas the typical pitch of circuit patterns may be significantly smaller.
2) Ensure adequate target sensitivity (equal to or greater than that of the circuit patterns) to process variation.

Figure 9B:
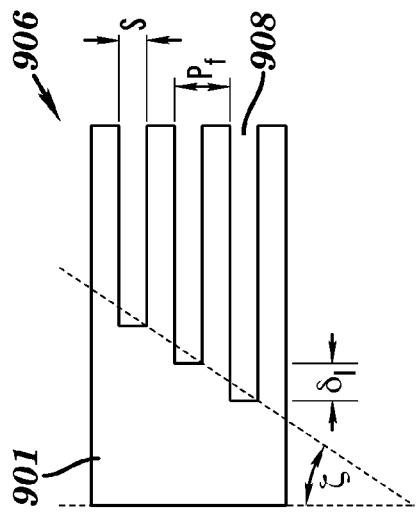
FIGS. 9B and 9C illustrate details of the taper and tone reversal, respectively.
Figure 9C:
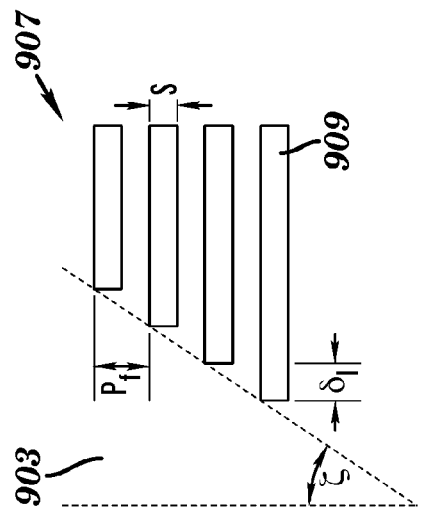
Figure 9A:
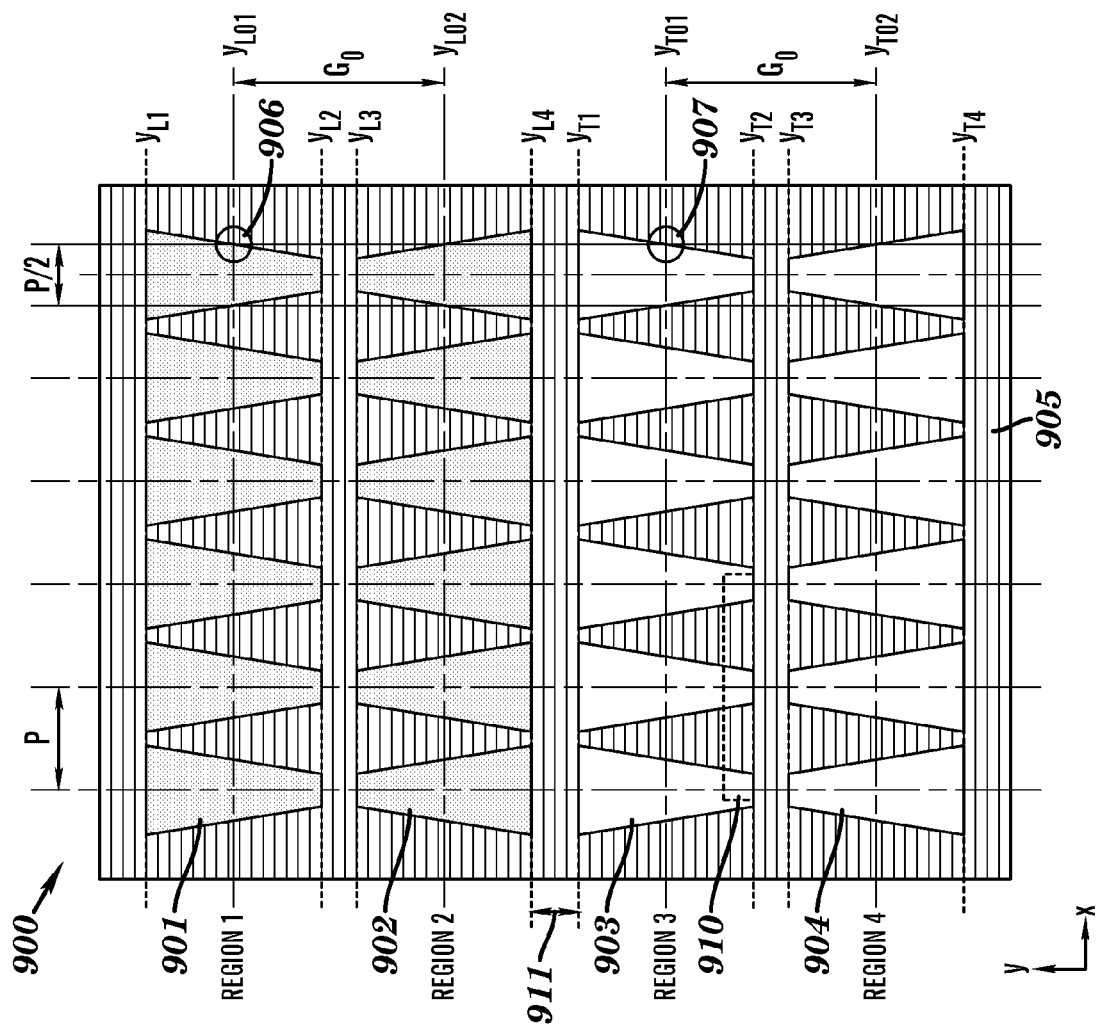
FIG. 9A illustrates a grating target divided into four regions in which the oppositely tapered grating elements in each pair of regions have opposite tone but a common period.

One such target example 900 is shown in FIG. 9A, where target elements 901, 902, 903, 904 similar to elements 801, 802 in FIG. 8 have been delineated by tightly nested lines oriented parallel to the primary periodicity P, having a fine period $p_f$ and a width of approximately $p_f/2$. The example fine-pitched target 900 is organized into sub-patterns denoted as Region 1 and Region 2, comprised of elements 901, 902 spaced at period P along the x-direction, respectively, where the separation $G_0$ between midpoints of elements 901 (i.e. Region 1) and 902 (i.e. Region 2) along the y-direction is predetermined, in a manner similar to the target 80 of FIG. 8. Complementary tone sub-patterns denoted as Region 3 and Region 4, comprised of elements 903, 904 spaced at period P along the x-direction, respectively, and where the midpoint of Region 3 and Region 4 are separated along the y-direction by the predetermined separation $G_0$ along the y-direction. The separation distance 911 between the complementary tone sub-region pairs is not critical to the design of the target 900, but should be sufficient to allow adequate separation of the detected signals. As viewed by the diffractometer, the printed target corresponding to the designed target 900 of FIG. 9A is now comprised of three different reflectivities: 1) The reflectivity $R_L$ of the tapered elements 901, 902, having width $W_L$, for example, represented by the presence of resist lines, 2) the reflectivity $R_T$ of the tapered complementary tone elements 903, 904, having width $W_T$, for example, represented by openings or trenches in resist, and 3) the effective reflectivity $R_S^e$ of the surrounding region 905 filled with the tightly nested parallel lines 909 and spaces 908. Referring to FIG. 9B, an enlarged view of the circled area 906 of Region 1 is illustrated showing that the first and second tapered shapes 901 and 902 of Regions 1 and 2, respectively, (regions of remaining pattern material) are delineated by the ends of tightly nested parallel spaces 908 (i.e. areas of removed patterned material in the shape of lines having width s preferably about $p_f/2$) of nominal period $p_f << P$ whose lengths are oriented along the direction of primary periodicity P (i.e. the x-direction in FIG. 9A). As shown in the detailed view of area 906 illustrated in FIG. 9B, the taper of the target shape regions 901, 902 is achieved by shifting the position of the ends of the surrounding space lines 908 in a fixed increment $\delta l$ over successive pitches $p_f$. The circled area 907 of Region 3 is illustrated in an enlarged view in FIG. 9C, showing that the first and second tapered space elements 903, 904 (areas of removed pattern material) are delineated by the ends of tightly nested parallel shapes 909 (i.e. areas of remaining patterned material in the shape of lines having width s preferably about $p_f/2$) of nominal period $p_f << P$ whose lengths are oriented along the direction of primary periodicity P (i.e. the x-direction in FIG. 9A). As shown in the detailed view of circled area 907 illustrated in FIG. 9C, the taper of the target space regions 903, 904 is achieved by shifting the position of the ends of the surrounding shape lines 909 in a fixed increment δl over successive pitches $p_f$. The effective taper angle ζ of the boundaries between the different reflectivities is given by $$\tan\zeta = \frac{\delta l}{p_f}.$$

The target design 900 of FIG. 9A enables simultaneous measurement of the widths $W_L$ of tapered shapes 901, 902 and widths $W_T$ of tapered space shapes 903, 904. Measurement of the paired non-zero order extrema positions ($y'_{Lm1}$, $y'_{Lm2}$) and ($y'_{Tm1}$, $y_{Tm2}$) enables the determination of the target element widths $W_{L,T}$ at the image centers by:

$$W_{L,T}(y_0) = \left(\frac{P - (G_0 - G_{L,T})\tan\zeta}{2}\right) \quad (17)$$

where $G_{L,T} = \frac{y'_{L,Tm1} + y'_{L,Tm2}}{M}.$

Figure 10C:
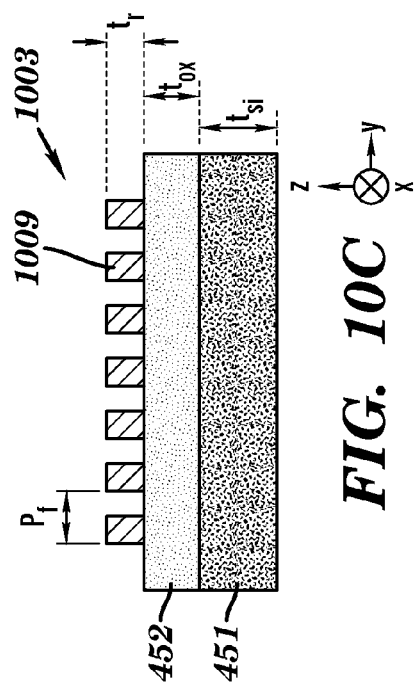
FIGS. 10A-10C illustrates the physical target corresponding to the simulated results.
Figure 10A:
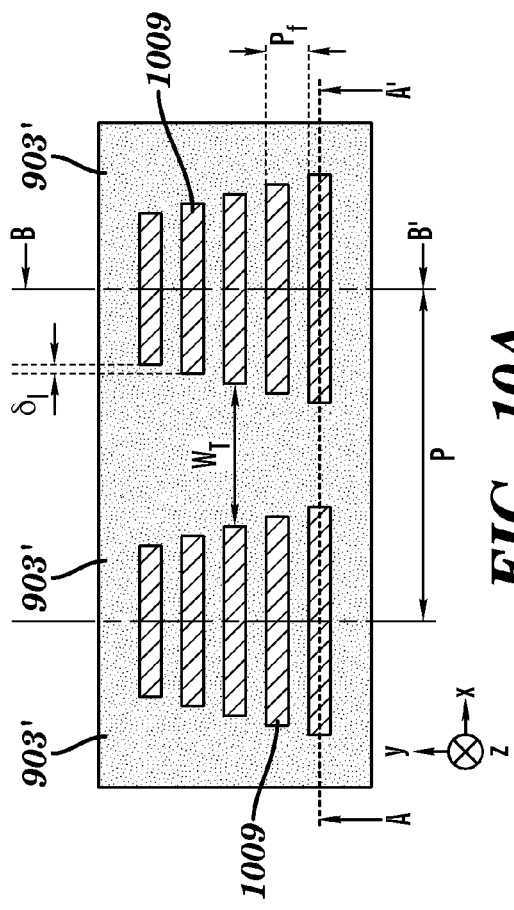
Figure 10B:
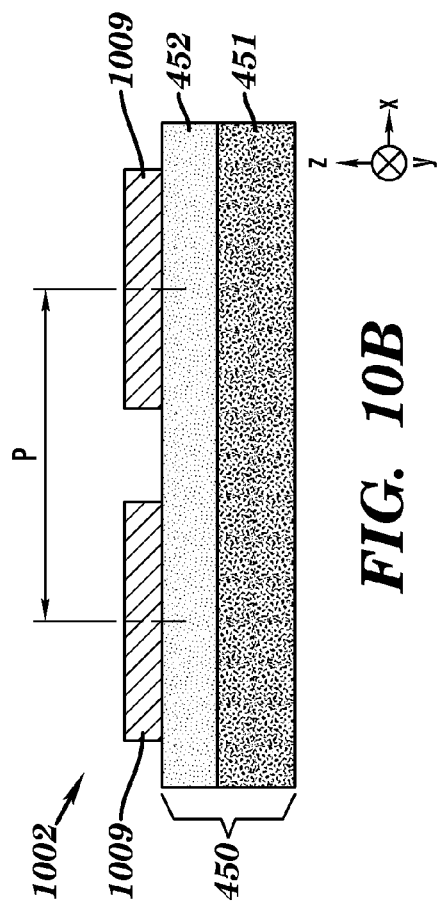

A plan view section 1001 of the printed substrate pattern corresponding to a section 910 of the tapered space Region 3 of mask target layout 900 of FIG. 9A is shown in FIG. 10A. The plan view 1001 in the x-y plane shown in FIG. 10A, illustrates tapered spaces 903' (corresponding to mask shapes 903 of FIG. 9A) having width $W_T$ formed by the staggered line ends of resist shapes 1009 corresponding to the shape lines 909 of FIG. 9C. The cross-sectional view 1002 along line A-A' in the x-z plane is shown in FIG. 10B, in which the features 1009 comprise the structure of primary period P. The cross-sectional view 1003 along line B-B' in the y-z plane is shown in FIG. 10C, in which the features 1009 comprise the structure of fine period $p_f$. In cross-section, the structures are formed in a resist film 1009 on a substrate 450 comprised of a film stack 452, represented in FIGS. 10B and 10C by an oxide layer 452, over a silicon wafer 451. The resist 1009 and film stack 452 thicknesses are typically much smaller than the thickness of the silicon wafer 451; i.e., $t_r$, $t_{ax} \ll t_{si}$.

FIGS. 11 through 16 provide a simulated example of the operation of the present invention for the target pattern 900 and corresponding printed structures 1001, 1002, 1003 of FIGS. 9A-9C and FIGS. 10A-10C. The response of the inventive diffractometry system and method for measuring CD to typical process variations—dose and focus changes in the resist image formation and oxide and resist film thickness variations—is simulated using a method described in commonly assigned U.S. patent application Ser. No. 10/353,900, filed on Jan. 28, 2003, the contents of which are hereby incorporated by reference in its entirety. For patterns consisting of arrays of arbitrary subelements, the simulator generates both the pattern imaged in resist by the lithography system and the diffracted energy measured by the diffractometer. The dimensions, pitches and transmission of the mask pattern elements, the characteristics of the resist, the optical characteristics of the lithography system, the film stack on the substrate, the wavelength of illumination in the diffractometer are all user selectable. For the examples illustrated in FIGS. 11 through 16, here, the simulation assumed the use of a positive resist having thickness in the range 250 nm-350 nm, a refractive index of 1.73, and a "threshold" model (the threshold model assumes that any portion of the resist exposed to a dose equal to or greater than a characteristic threshold value of the particular resist material is removed by the developer). Use of the threshold model is consistent with the assumption of vertical resist sidewalls, noted earlier. The wafer is assumed to include a substrate of silicon having a refractive index of 3.5+0.35i, where the imaginary component corresponds to absorption, and an overlying stack of oxide having a thickness of 600 nm and refractive index of 1.46.

The simulated target pattern on the mask was based on a dual tone target pattern similar to the target 900 of FIG. 9A, but having an infinite number of diffractive array elements (similar to elements 901, 902 or complementary tone elements 903, 904) repeating at period P in the x-direction, where the elements (901, 902, 903 or 904) are delineated by ends of tightly nested subelements (similar to lines 909 and spaces 908 of FIGS. 9A-9C) repeating along the y-direction at period $p_f$. The simulator simulates each set or region of primary features individually; that is, Region 1 comprising an infinite array of elements 901, Region 2 comprising an infinite array of elements 902, Region 3 comprising an infinite array of elements 903 and Region 4 comprising an infinite array of elements 904 of FIG. 9A are simulated separately. The target pattern has a pitch $P_x$=1000 nm in the direction of primary periodicity (along the x-direction) of the tapered primary diffractive array elements. Each primary diffractive array element (e.g. 901, 902, 903 or 904) is delineated by sub-elements 909 in the y-direction (the direction of varying primary element width or taper). The sub-elements 909 of each array element have a sub-pitch $p_f$=250 nm and a sub-width s=125 nm. The width of the tapered primary array elements W(y) varies from 350 nm to 850 nm in δl=25 nm increments in the y-direction (the direction of the taper) to simulate diffraction from one of the printed arrays (e.g. Region 1, 2, 3 or 4) of tapered segments (e.g. printed shapes corresponding to designed target areas 901, 902, 903 or 904, respectively) similar to those illustrated in FIG. 10A.

A space element grating is simulated by specifying a mask background transmission of 1 and a pattern transmission of 0. A shape element grating is simulated by specifying a mask background transmission of 0 and a pattern transmission of 1. The designed 50% duty cycle width $W_d(y_0)$ on the mask is $$\frac{P}{2} = 500 \text{ nm},$$

but the printed 50% duty cycle width W(y₀) is skewed toward larger mask dimensions because of line shortening effects. For the Threshold Model of resist patterning used here, the magnitude of line shortening is a characteristic of the aerial image and the nominal dose. To ensure that the printed 50% duty cycle width W(y₀) is positioned at the center (H/2) of the array element in the latent image formed in the resist at the nominal dose the mask pattern width must be increased by the anticipated amount of line shortening.

The photolithographic exposure system in the simulation was assumed to have a numerical aperture (NA) of 0.7, a partial coherence of 0.6, and illumination wavelength of 193 nm. The nominal dose, normalized to the dose required to fully expose a large open area, was 0.32. Simulated developed images were computed for exposure dose conditions varying −10%, 0% and +10% from normalized dose. Simulations were performed for each of those three dose conditions for defocus at 0 nm, 100 nm and 200 nm. The resulting zero- and first-order diffracted signals from the simulated developed images were computed assuming 300 nm-700 nm bandwidth plane-wave illumination incident at an angle θ=30 deg, consisting of equal parts TE and TM polarization. The second-order diffracted signals were computed assuming 300 nm-400 nm plane-wave illumination incident at an angle θ=44.4 deg, consisting of equal parts TE and TM polarization.

The differential line shortening response of the fine-grained features 908, 909, which delineate the shape (901, 902) and space (903, 904) regions, to dose and defocus is illustrated in FIG. 11. Simulated latent images of an end portion of a line-end shape 915 in a clear field 1025 are illustrated in FIG. 11A at zero defocus. The tip of the line 915 is located at length $L_A$ at nominal exposure dose (0%), indicated by the contour labeled $E_0$. Note that as exposure increases from −10% (the $E_{-10}$ contour) to 0% to +10% (the $E_{+10}$ contour), the resist line is shortened, corresponding to an increase in width $W_T$ of the space shape 903' relative to nominal shape 903 (compare FIG. 10A to FIGS. 9A and 9C). By contrast, for the opposite tone patterns (e.g. nominal shapes 901, 902), in which a line end space 1016 in a resist field 916 is formed, the space length $L_B$ is elongated as exposure dose varies from −10% (contour $E_{-10}$) to +10% (contour $E_{+10}$). Note that at nominal dose (0%), the resist shape 915 has a length $L_A$ that is different (i.e. longer) than the space 1016 length $L_B$. On the other hand, under conditions of defocus, both shape and space dimensions respond in the same fashion, as illustrated in FIGS. 11C and 11D, in which both the length $L_C$ of the line-end shape 917 (in clear field 1025) and the length $L_D$ of the line-end space 1018 (in resist field 918) are shortened at 200 nm defocus as compared to the lengths $L_A$, $L_B$ of the zero defocus case.

Figure 12:
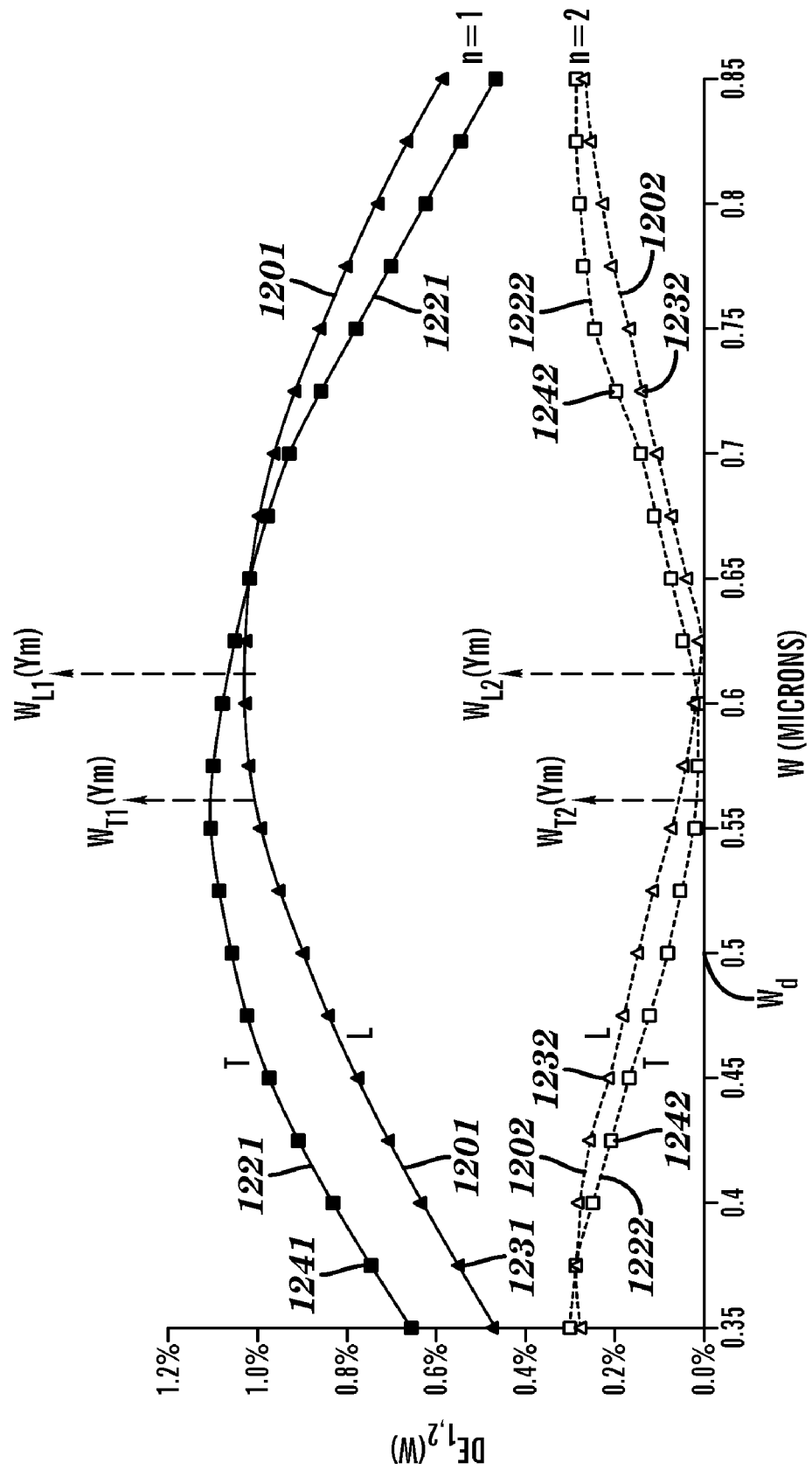
FIG. 12 shows the simulated, wavelength-averaged intensity distribution in the direction perpendicular to the target period.

Referring now to FIG. 12, diffraction efficiencies $DE_{1,2}$ (W) determined by Equation (11) for the first (n=1) and second (n=2) diffracted orders are shown for the case of 0% dose error, zero defocus and assuming a resist thickness of 300 nm, plotted along the direction of varying target width $W_d$ (along the y'-direction), averaged over wavelength (along the x'-direction) from 300-700 nm for zero and first order, and 300-400 nm for second order, where the requirement of real diffraction angles in the range of 0-90° by Equation (1) limits the allowed wavelength band. The diffraction efficiency for the tapered space targets 903, 904 are indicated by the curves 1221, 1222 for orders n=1, 2, respectively, labeled T and for the tapered shapes 901, 902 indicated by the curves 1201, 1202 for orders n=1, 2 respectively, labeled L. In accordance with the present invention, the target dimensions $W_{T1}(y_m)$, $W_{L1}(y_m)$ corresponding to the position of the peaks of the first order curves 1221, 1201, respectively, and dimensions $W_{T2}(y_m)$, $W_{L2}(y_m)$ corresponding to the position of the nulls of the 2nd order curves 1222, 1202, respectively, are independent of the substrate and target reflectivities (as indicated in Equation 9) and are particularly useful for the determination of CD and the analysis of variations in dose and focus. These dimensions are determined by fitting the measured diffraction efficiencies (simulated data in this case) to parameterized curves of the form in Equation (15):

$$DE_n(W:a_0, W_m) = a_0\left\{1 - \cos\left(\frac{2\pi n[W - W_m]}{MP}\right)\right\} \quad (18)$$

where $W_m = W(y_m)$ is the target design dimension required to produce the dimension $$W = \frac{P}{2}$$

the substrate. In FIG. 12, the discrete data points 1231, 1241, 1232, 1242 are the simulated values of diffraction efficiency, and the continuous line curves 1201, 1221 are the fit of Equation (18) for (n=1), and the dashed curves 1202, 1222 are the fit for (n=2). The fit parameters are:

TABLE I

|  | n | | | |
|---|---|---|---|---|
|  | 1 | | 2 | |
|  | L | T | L | T |
| $a_0$[%] | 0.55% | 0.52% | 0.14% | 0.14% |
| $W_m$[μm] | 0.5692 | 0.616 | 0.5785 | 0.6206 |

As is evident in FIG. 12, the quality of fit is excellent over a large range of W, from 0.35 to 0.85 microns. Even at optimum dose (the dose required to print the fine features s=0.125 μm to size) and perfect focus, the peaks $W_{T1}(y_m)$, $W_{L1}(y_m)$ and nulls $W_{T2}(y_m)$, $W_{L2}(y_m)$ of the diffraction orders $W_m$ are shifted significantly with respect to the design values $W_d$=0.5 μm. As determined by the n=1 maxima, the shortening of the space ends 908 that delineate the target shapes 901, 902 having width $W_L$ is 69 nm; whereas that of the line ends 909 that delineate the target space shapes 903, 904 having width $W_T$ is 116 nm. While this agrees qualitatively with the threshold contours of the aerial image, the aerial image shortening accounts for only about half of the measured shortening. The measurement overestimates the shortening because the boundary of the regions of differing reflectivity is spatially modulated by the fine features. The measurement is an average over that modulation. Note that the shortening determined by the n=2 minima is greater than that determined by the n=1 maxima, as can be seen from Table I. This is because the second-order diffraction weights the average edge modulation differently than first-order diffraction; the different diffracted orders have differing sensitivity to the edge modulation. This shows that the measurement of multiple diffracted orders provides useful information regarding line-edge roughness.

Figure 13B:
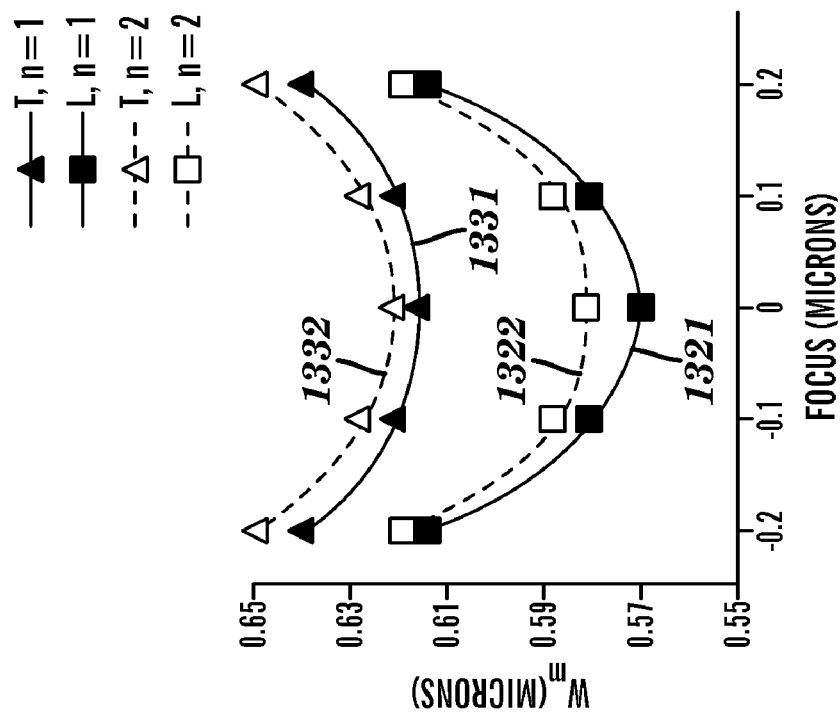
FIGS. 13A-13B show the simulated dose and focus response of the target in FIG. 9.
Figure 13A:
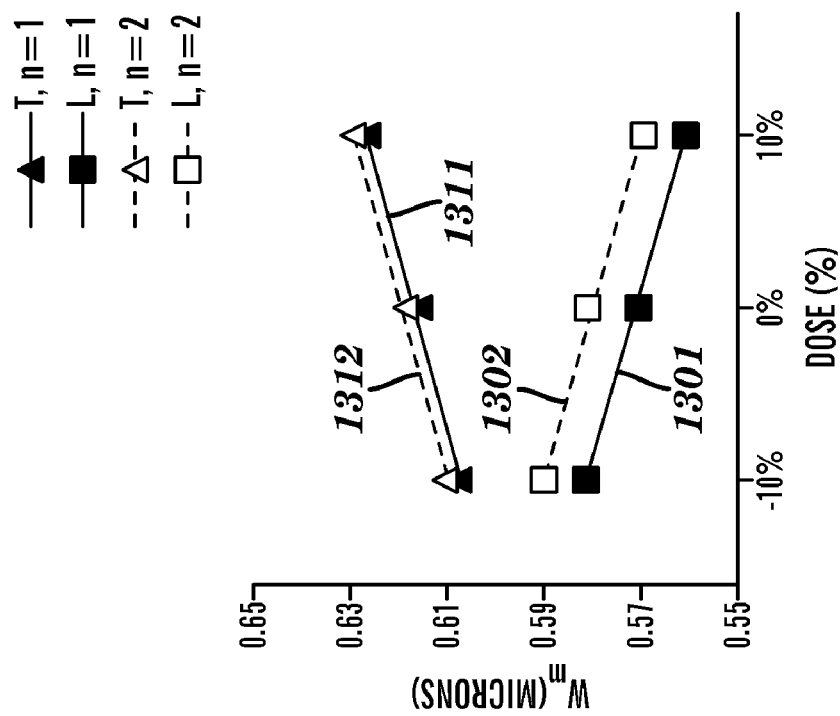

FIG. 13A shows the response of $W_m$ to dose and FIG. 13B shows the response to focus (B) of the exposure tool. Referring to FIG. 13A, for shapes 901, 902, curve 1301 is the response to dose for n=1 and curve 1302 is the response to dose for n=2. For complementary shapes 903, 904, curve 1311 is the response to dose for n=1 and curve 1312 is the response to dose for n=2. Referring to FIG. 13B, for shapes 901, 904, curve 1321 is the response to defocus for n=1 and curve 1322 is the response to defocus for n=2. For complementary shapes 903, 904, curve 1331 is the response to defocus for n=1 and curve 1332 is the response to defocus for n=2. For both diffracted orders n=1, 2 the dose response is roughly linear (FIG. 13A) and the focus response is roughly parabolic and symmetric about best focus (FIG. 13B). The slope of the dose response is of opposite sign for the two target tones, whereas the curvature of the focus response is of the same sign. This distinct response of the shape and space structures enables the separate control of lithographic dose and focus, for example, using the method according to Ausschnitt (U.S. Pat. No. 5,965,309), the contents of which are hereby incorporated by reference in its entirety.

Figure 14B:
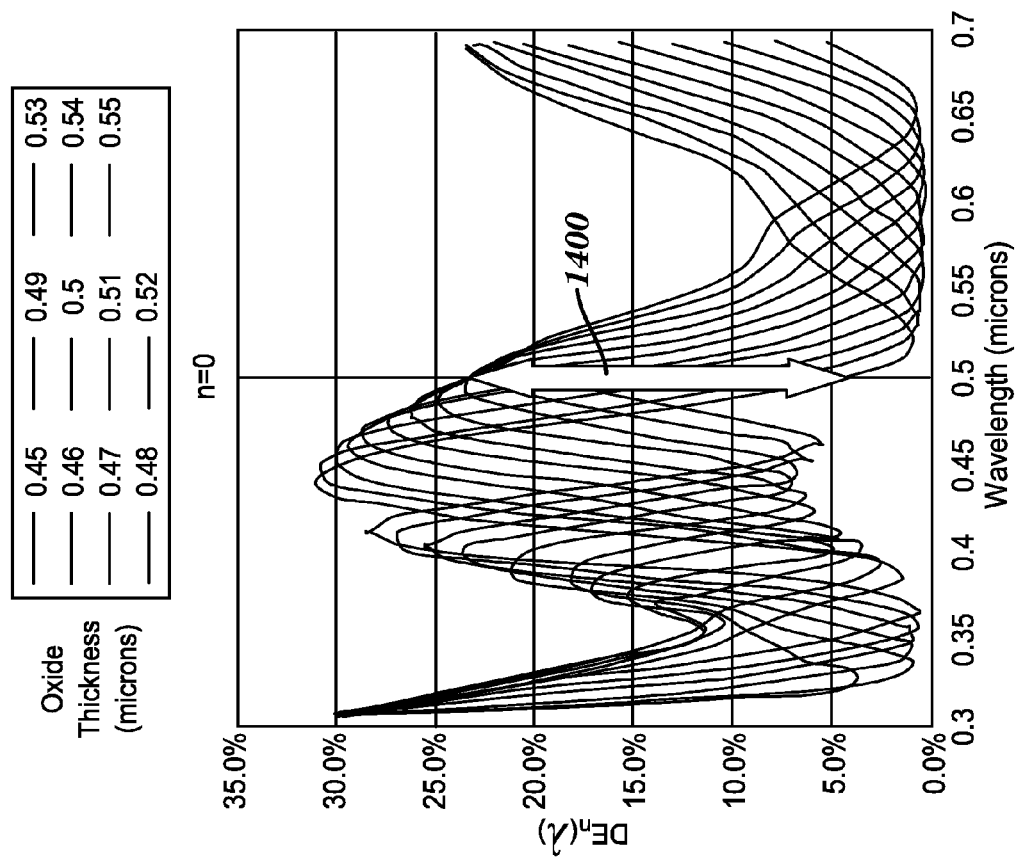
FIGS. 14A-14B show the simulated response of the zero- and first-order diffraction efficiency as a function of wavelength and oxide thickness.
Figure 14A:
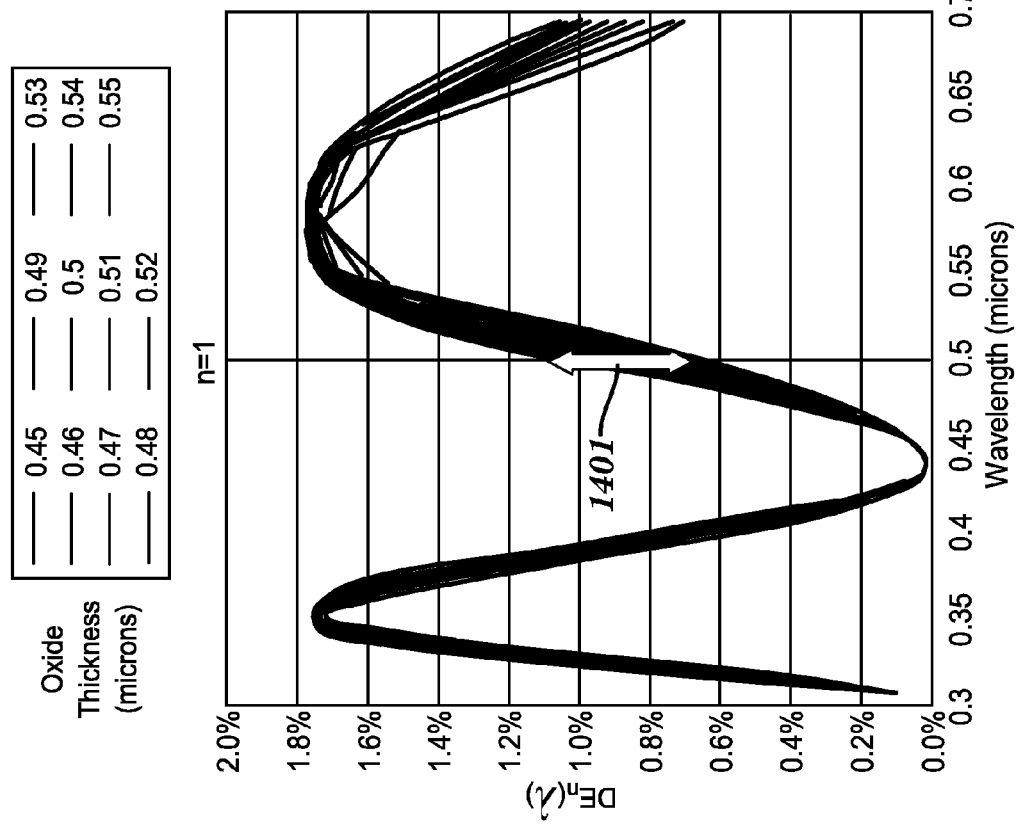

FIGS. 14A and 14B show the simulated behavior of the diffracted energy over a 100 nm range of the underlying oxide film 452 thickness $t_{ox}$ for the zero n=0 and first n=1 orders in the x'-direction, as they would be detected in the detectors 480 and 460, respectively, of FIG. 4A, for a space T target comprising Regions 3 and 4 of FIG. 9A having a design dimension $W_d$=0.6 μm close to the value corresponding to a printed dimension of $$W = \frac{P}{2} = 0.5 \text{ μm}.$$

The diffracted energy is dispersed linearly in wavelength by the transmission grating element 435 of FIG. 4 in the case of n=0 and the printed target grating 455 in the case of n=1. Thus, wavelength is equivalent to the x'-direction at the detector 460 configured to detect non-zero order, and the x"-direction of the second detector 480 configured to detect the zero order in FIG. 4. As expressed in Equation (5) the spectral response for n=0 is a function of both the substrate reflectivity $R_S$ and the relative reflectivity $R_{LS}$. As expressed in Equation (10), the spectral response is for n=1 is a direct measure of the pattern reflectivity relative to the substrate $|R_{LS}|$. The sensitivity of the diffraction efficiency to the change in underlying oxide film thickness is shown in FIG. 14A for zero order and 14B for first order by spread 1400, 1401, respectively, of the curves plotted in oxide thickness increments of 10 nm over the 100 nm oxide thickness range between 450 nm and 550 nm. The spread at $\lambda_0$=500 nm is indicated by the double-headed arrows 1400, 1401 as a rough metric of relative sensitivity between the two diffracted orders. The zero order spread 1400 is significantly larger than the first order spread 1401, so that clearly, zero order is significantly more sensitive to oxide thickness than first order. A quantitative measure of the relative sensitivity can be obtained by taking the ratio of the range of diffraction efficiency variation with oxide thickness to its value at the midpoint of the range $$\frac{\Delta DE_n}{DE_n}.$$

For the zero-order spread 1400 of FIG. 14A, $$\frac{\Delta DE_0}{DE_0} \approx 1.5,$$

whereas for the first-order spread 1401 of FIG. 14B, $$\frac{\Delta DE_1}{DE_1} \approx 0.4.$$

Thus, the diffraction efficiency at zero order has greater than three times the sensitivity to the underlying oxide film thickness in our example. This illustrates that non-zero orders are the better choice to measure pattern attributes; whereas zero order is the better choice to measure underlying film thickness. In fact zero order works best in this regard when there is no pattern.

Figure 15B:
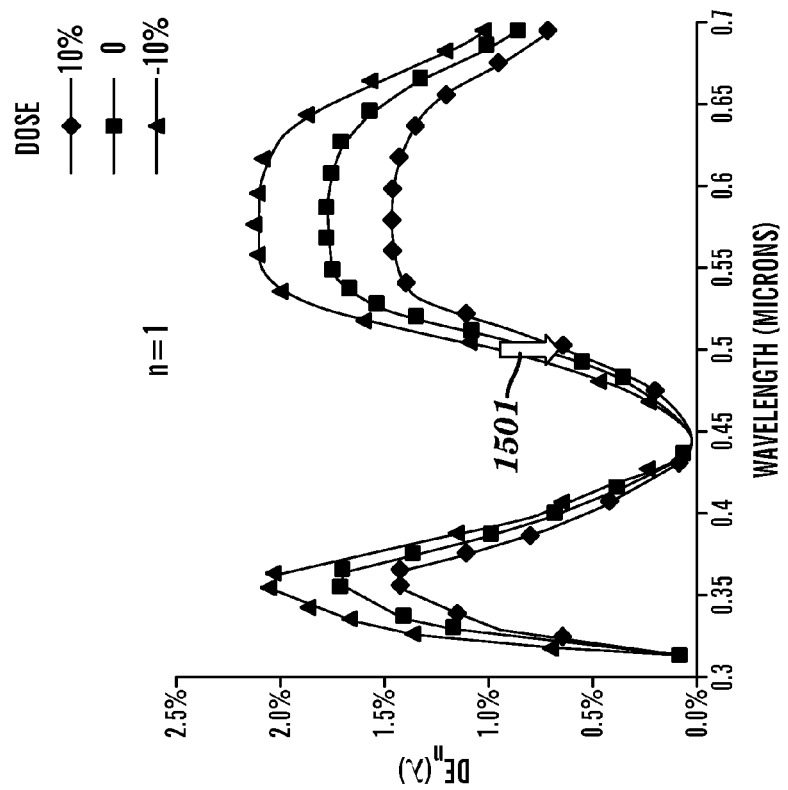
FIGS. 15A-15B show the simulated response of the zero- and first-order diffraction efficiency as a function of wavelength and exposure dose.
Figure 15A:
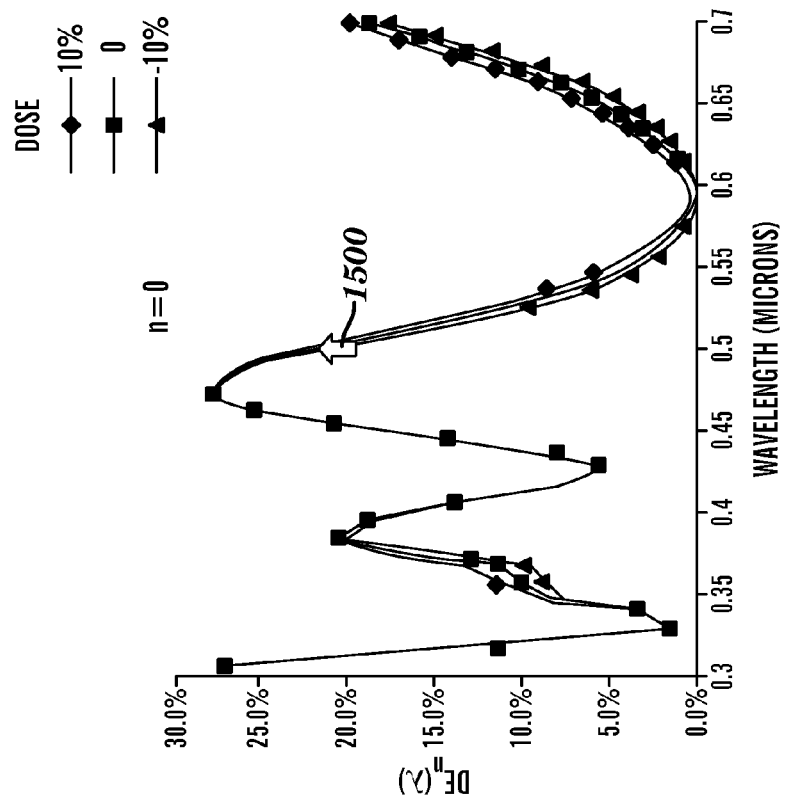

FIGS. 15A and 15B illustrates a similar pair of plots to those in FIGS. 14A-14B, except here we are showing the response of the diffracted orders to the changes in target pattern density induced by changes in the dose used to expose the pattern over a range of ±10% about the optimum dose defined above. The focus is fixed at best focus. Once again, we can assess the relative sensitivity to dose by the spread 1500 for zero order and spread 1501 for first order of the curves; and we conclude that non-zero orders are the better choice to measure pattern attributes. As in the case of FIG. 14, a quantitative measure of the relative sensitivity may be obtained by taking the ratio of the range of diffraction efficiency variation with dose to its value at the midpoint of the range $$\frac{\Delta DE_n}{DE_n}.$$

For the zero order spread 1500 in FIG. 15A, $$\frac{\Delta DE_0}{DE_0} \approx 0.1,$$

whereas for the first order spread 1501 in FIG. 15B, $$\frac{\Delta DE_1}{DE_1} \approx 0.3.$$

In the example shown in FIG. 15, the diffraction efficiency at first order has approximately three times greater sensitivity to exposure dose than zero order. In fact, zero-order is primarily sensitive to the pattern changes by virtue of the illumination energy that is diffracted into higher orders. Hence, zero-order sensitivity goes to zero as relative reflectivity $R_{LS} \rightarrow 0$.

Figure 16B:
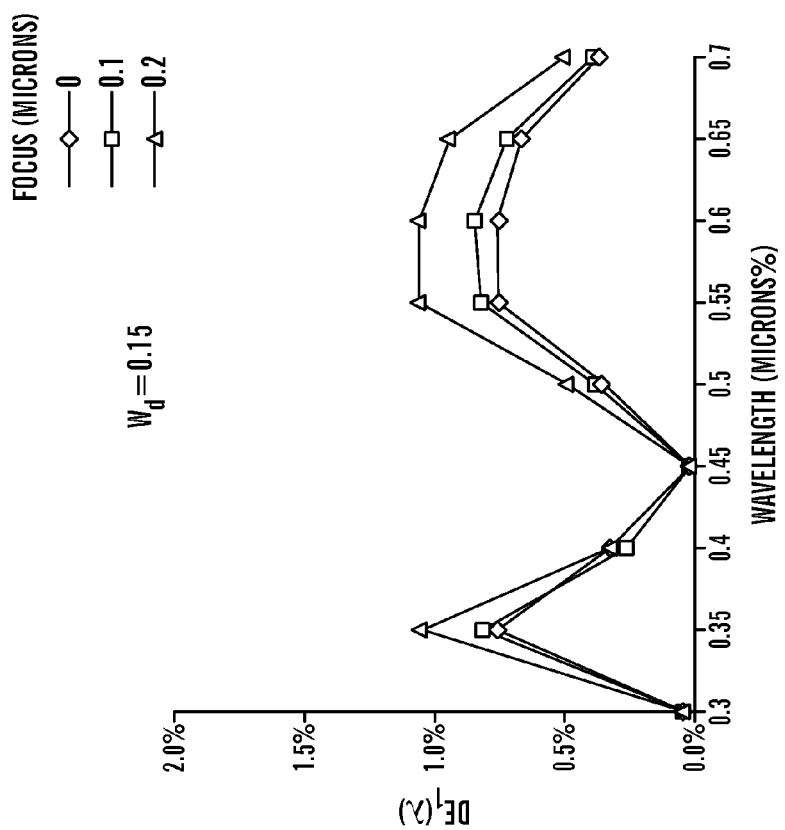
FIGS. 16A-16B show the simulated response of the first-order diffraction efficiency as a function of wavelength and focus at two different designed grating element widths.
Figure 16A:
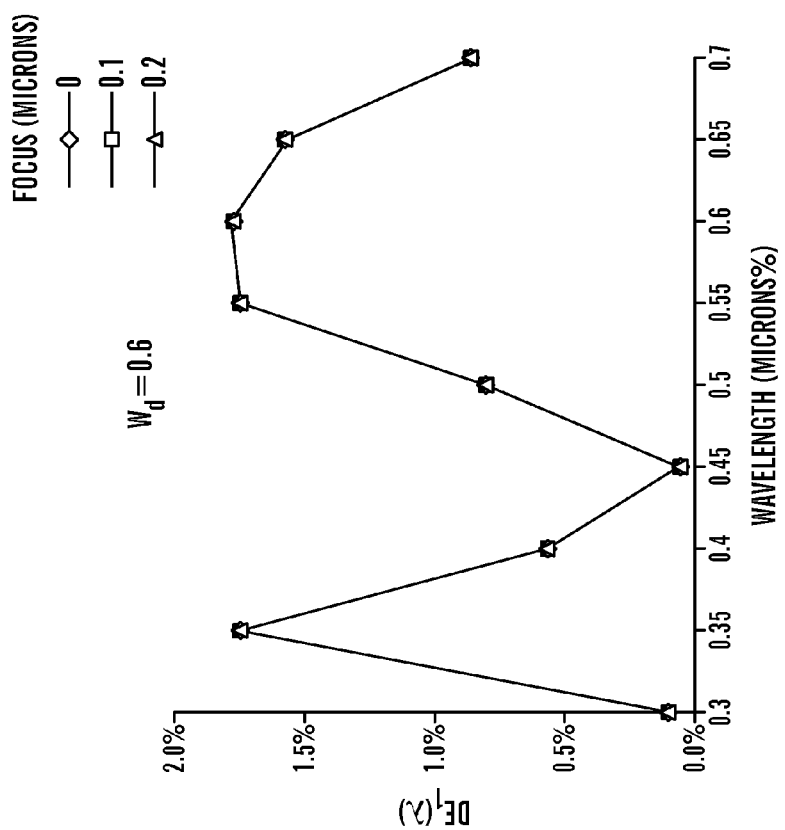

FIGS. 16A and 16B show the sensitivity of the first order diffraction efficiency to changes in the focus used to print the target pattern over a range of 200 nm about best focus at two different nominal values of mask dimension $W_d$. The dose is fixed at the optimum dose. At $W_d$=0.6 μm the printed grating has an approximately 50% duty cycle and the sensitivity to defocus is low, as illustrated in FIG. 16A. At $W_d$=0.15 μm the printed grating has an approximately 20% duty cycle and the sensitivity to defocus is relatively high, as illustrated in FIG. 16B. Thus, high focus sensitivity is achieved with more isolated grating elements and the achievement of focus control requires the measurement of these relatively isolated structures. Dose sensitivity, on the other hand, is not a strong function of the target duty cycle.

Thus, we conclude that optimum spectral sensitivity to both dose and defocus is achieved for relatively isolated grating elements; which leads us to the simpler target embodiment discussed below.

Figure 17:
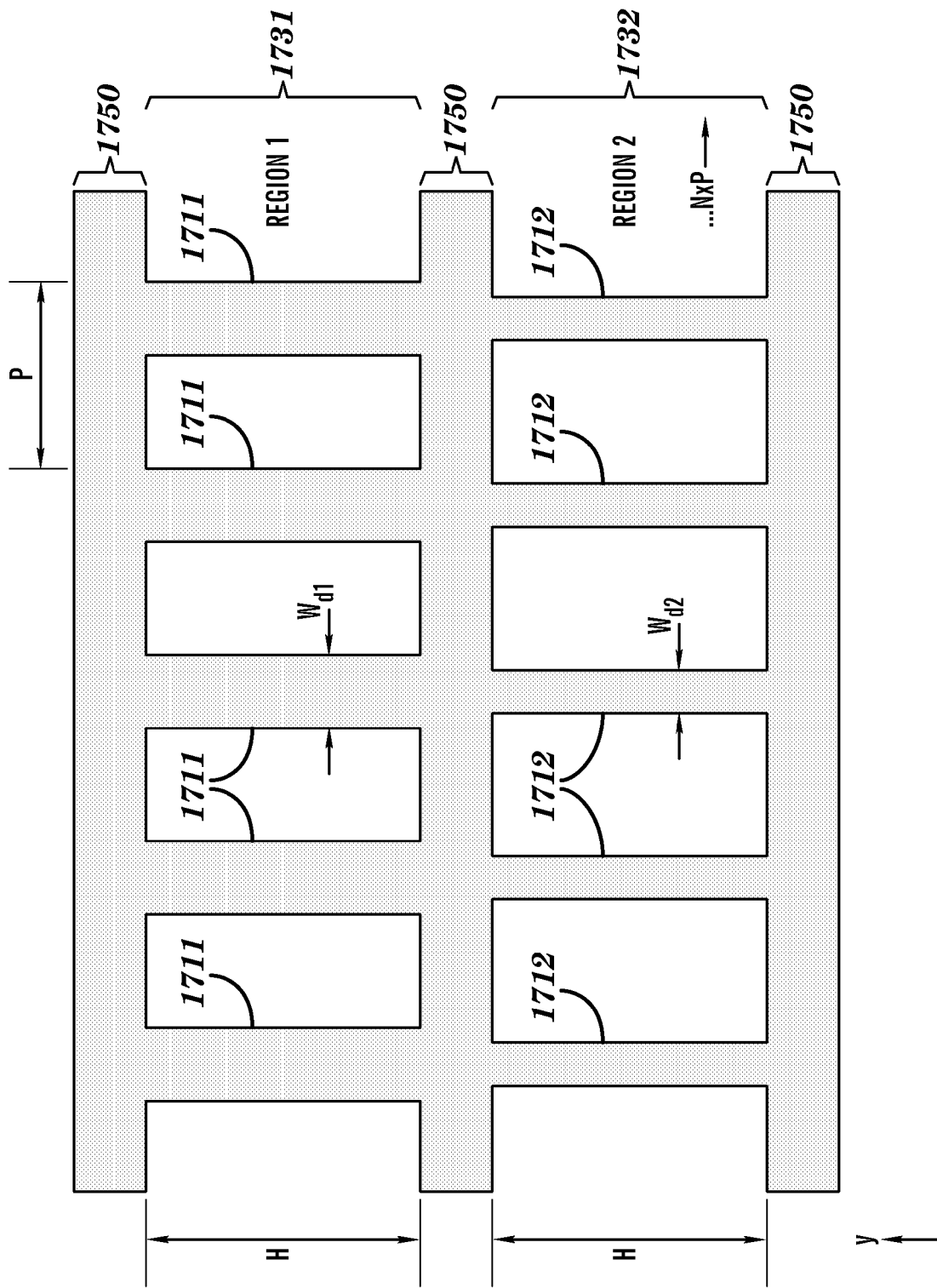
FIG. 17 illustrates a grating target divided into two regions in which the grating elements have different widths but a common period.

A preferred embodiment 1701 of the inventive discrete differential grating target 455 for use in measuring CD is shown in FIG. 17. This exemplary target 1701 provides a preferred means of CD measurement that places no restriction on the nominal CD size. The target grating 1701 is divided into two or more sub-pattern regions, e.g. Region 1 (reference numeral 1731) and Region 2 (reference numeral 1732), comprised of lines, e.g. 1711, 1712, respectively, having length H oriented along the y-direction. The nominal widths, e.g. $W_{d1}$, $W_{d2}$, of lines 1711, 1712, respectively, are uniform within each sub-pattern region 1731, 1732, respectively, but are different between sub-pattern regions 1731, 1732, respectively (e.g. first sub-pattern region 1731 including lines 1711 having nominal width $W_{d1}$, and second subpattern region 1732 having lines 1712 of nominal width $W_{d2}$). The features 1711, 1712 are preferably joined by connecting regions 1750, which can help avoid line shortening of the elements 1711, 1712, as well as provide structural support to elements 1711, 1712 on the printed structure. Note that the widths of elements 1711, 1712 would be typically much smaller than the width of the connecting regions 1750. The separate sub-pattern regions (e.g., 1731, 1732) are preferably, but are not required to be, arranged along the y-axis with respect to each other. The following sub-pattern characteristics are defined, normalized to the pitch:

1. $\bar{w} \equiv \dfrac{(W_1 + W_2)}{2P}$ is the unknown average width whose designed nominal size is $\bar{w}_d$.

2. $\delta \equiv \dfrac{(W_1 - W_2)}{2P}$ is the pre-determined (designed) offset between the two designed nominal widths.

In this example, the designed nominal dimension $$\bar{w}_d = \frac{(W_{d1} + W_{d2})}{2P},$$

where $W_{d1}$, $W_{d2}$ are the designed nominal widths of the sub-pattern lines 1711 and 1712, respectively. $2\delta$ is designed to be sufficiently small so that the reflectivity $R_4$ within each constant linewidth sub-pattern region (e.g. 1731, 1732) is the same and, over the range of CD variation within the lithographic patterning process, the pre-determined offset $\delta$ is invariant. The pre-determined offset value $\delta$ can be used as an in-situ calibration of CD variation. It is useful to choose the designed nominal offset $\delta$ as a fraction $\beta$ of the deviation of the designed nominal average linewidth $\bar{w}_d$ from 0.5, wherein $$\delta = \beta\left(\frac{1}{2} - \left|\bar{w}_d - \frac{1}{2}\right|\right) \tag{19a}$$

Figure 19:
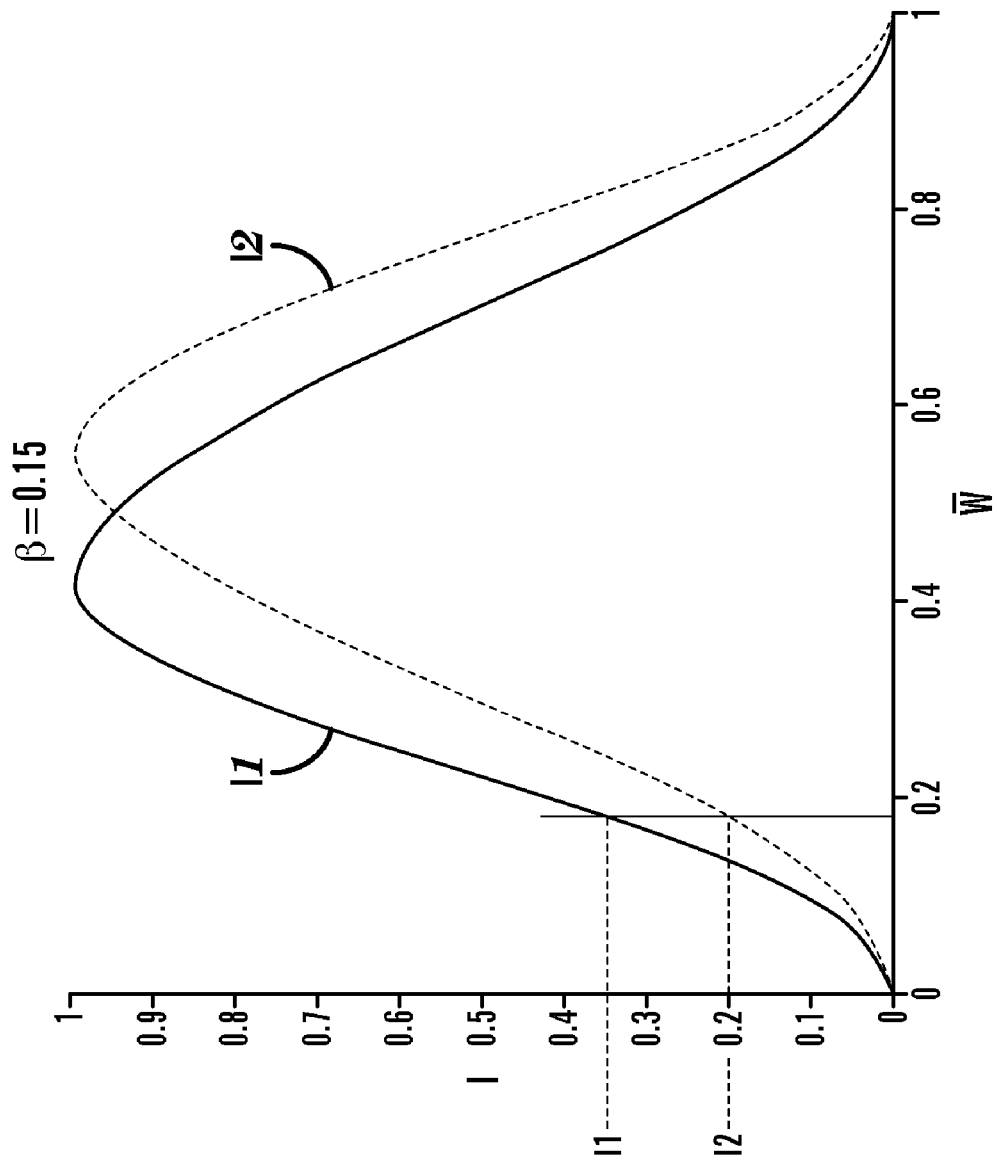
FIG. 19 is a plot of the first order diffracted intensities of two gratings whose widths differ by 30% of their average width.

The detected image 1800 of the two-region differential grating CD target 1701 appears as shown in FIG. 18A, plotted in a plan view of the detector array 460. The intensities (I1, I2) are constant within their respective sub-pattern regions 1801, 1802 (having respective dimensions of $H_{I1} \times L_I$ and $H_{I2} \times L_I$, which are each about $MH \times MNP$), as illustrated in FIG. 18C. This obviates the need for precise detector calibration, since the detected intensity can be averaged over many detectors. The intensity summed or integrated over the y'-direction is illustrated in the plot 1805 of FIG. 18B, which provides a spectral response for a broadband source, which is a function of average linewidth of the target elements as well as the profile of the target elements. Therefore, the profile characteristics of the printed target elements can be determined by comparing the measured spectral response to a library of spectral responses, in a manner similar to scatterometry. However, the use of the spectral response in accordance with the present invention has the advantage that the spectral response of non-zero diffracted orders is relatively insensitive to the underlying film thickness, as indicated by FIG. 14. The intensities 1811, 1812 illustrated in FIG. 18C are the intensities 1801, 1802, respectively, summed or averaged over the x'-direction and the contrast between the two average intensities 1811, 1812 provides a measurement of the average width of the grating elements of the two target subregions, as explained further below. The dependence of the two intensities I1 (1801), I2 (1802), on average width $\bar{w}$ is shown in FIG. 19 for $\beta = 0.15$.

Given the further definitions:

$$a \equiv \cos(2\pi\delta) \tag{19b}$$

$$r \equiv \frac{I1}{I2} = \frac{1 - \cos[2\pi(\bar{w} + \delta)]}{1 - \cos[2\pi(\bar{w} - \delta)]}$$

$$C \equiv \frac{I1 - I2}{I1 + I2}$$

The unknown average width $\bar{w}$ can be expressed as:

$C \geq 0$:

$$\bar{w} = \frac{1}{2\pi}\arccos\left[\frac{aC^2 \pm (a^2 - 1)\sqrt{1 - C^2}}{a^2(C^2 - 1) + 1}\right] \tag{20a}$$

$C < 0$:

$$\bar{w} = 1 - \frac{1}{2\pi}\arccos\left[\frac{aC^2 \pm (a^2 - 1)\sqrt{1 - C^2}}{a^2(C^2 - 1) + 1}\right] \tag{20b}$$

Figure 20:
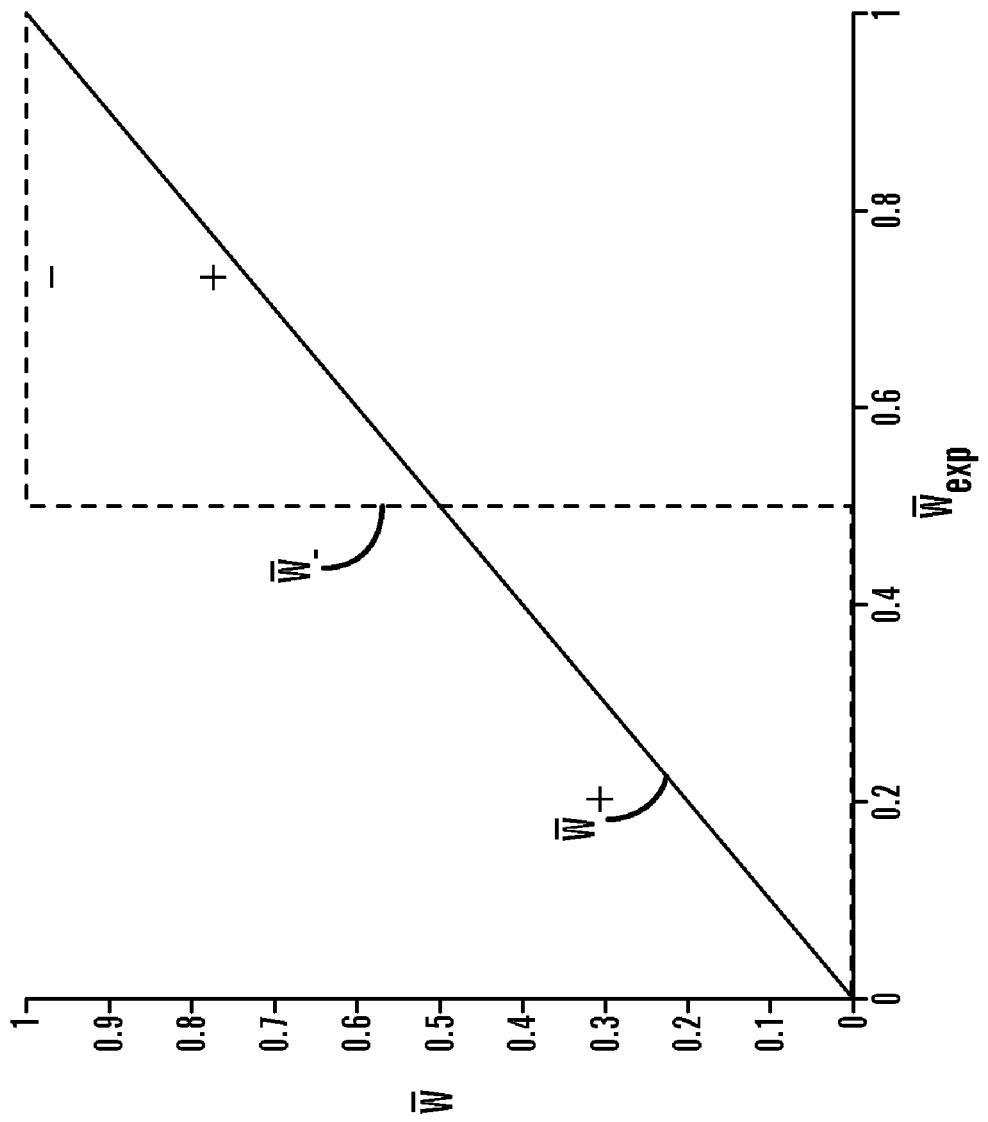
FIG. 20 is a plot showing that the width calculated from the "+" solution to Equations (20a)-(20b) is identical to the nominal width.
Figure 21:
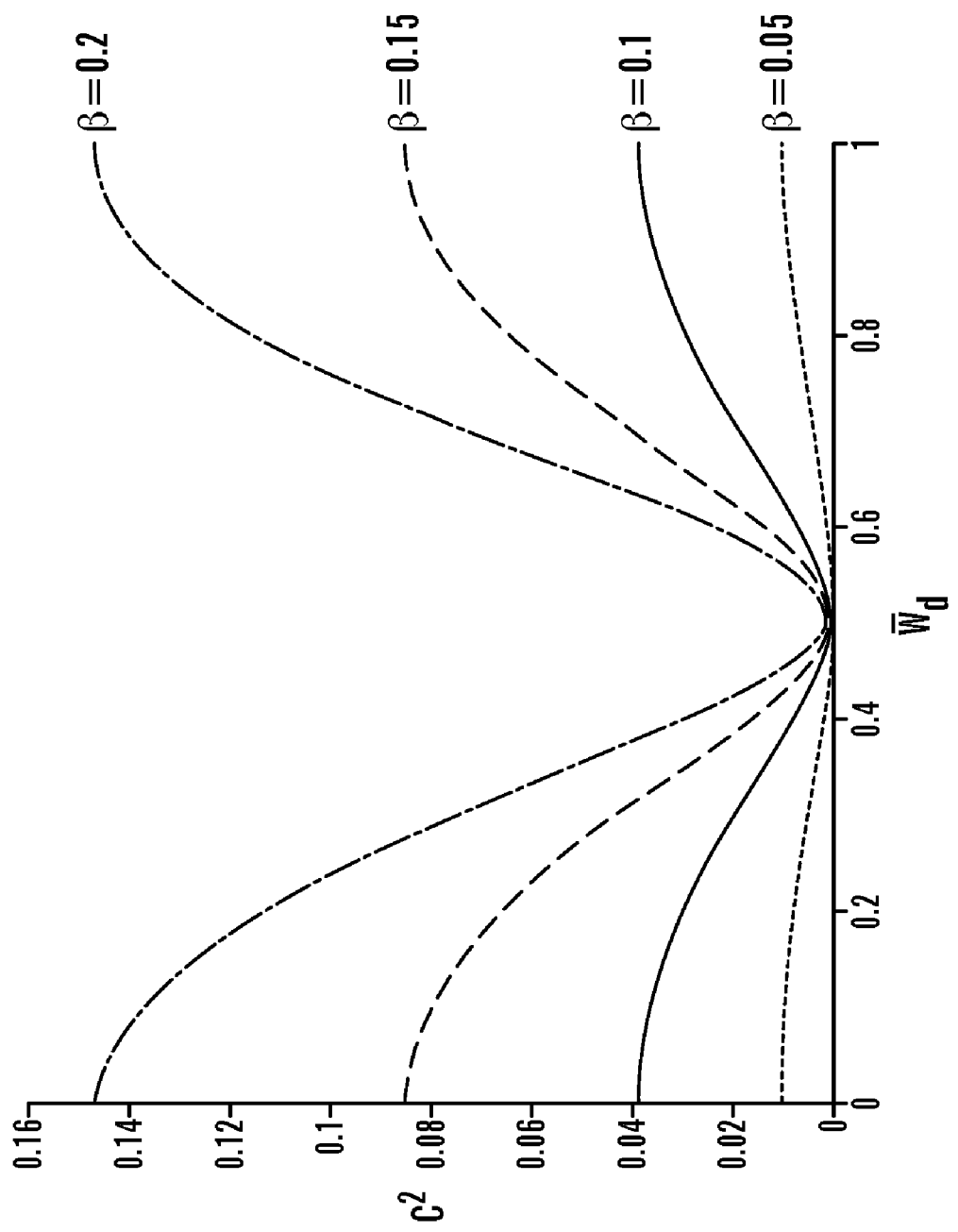
FIG. 21 plots the square of the measurable contrast as a function of the nominal width for different values of the fractional deviation $\beta$ of the two widths from nominal.

The average width $\bar{w}$ of Equations 20a, 20b is determined by the measured contrast C between the two intensity regions 1801, 1802 of FIG. 18 and the known, pre-determined (i.e. designed) offset difference $\delta$ between the two nominal linewidths $W_{d1}$, $W_{d2}$. A plot of the two solutions (determined by the choice of sign in Equations 20a, 20b) for the calculated $\bar{w}$ as a function of a expected printed average width $\bar{w}_{exp}$ on a wafer target is shown in FIG. 20, indicated by $\bar{w}_+$, $\bar{w}_-$. The positive solution $\bar{w}_+$ of Equations 20a and 20b, for which $\bar{w} = \bar{w}_{exp}$, is the average linewidth. The square of the contrast $C^2$ is dependent on the fi parameter as shown in FIG. 21. The contrast increases as the grating elements become increasingly isolated; namely, as $W \to 0$, P. Note that as $W \to P$, the grating elements become isolated spaces.

The required precision of CD measurement for semiconductor applications needs to be on the order of 1 nm. The precision of the inventive CD measurement technique is dependent on the sensitivity of C to changes in $\bar{w}$. For the small variations that concern us the fractional change of contrast $$\frac{\Delta C}{C}$$

is given by:

$$\frac{\Delta C}{C} = \frac{\Delta \bar{w}}{C\dfrac{d\bar{w}}{dC}} \tag{21}$$

From Equations (20a) and (20b) we obtain $C \geq 0$:

$$\frac{d\bar{w}}{dC} = -\frac{F_3}{2\pi}\left(\frac{F_2}{\sqrt{1 - F_1^2}}\right) \tag{22a}$$

$C < 0$:

$$\frac{d\bar{w}}{dC} = \frac{F_3}{2\pi}\left(\frac{F_2}{\sqrt{1 - F_1^2}}\right) \tag{22b}$$

where:

$$F_1 \equiv \frac{aC^2 + (a^2-1)\sqrt{1-C^2}}{a^2(C^2-1)+1}$$ (23)

$$F_2 \equiv \frac{2C}{a^2(C^2-1)+1}$$

$$F_3 \equiv a - \frac{(a^2-1)}{2\sqrt{1-C^2}} - a^2 F_1$$

Figure 22A:
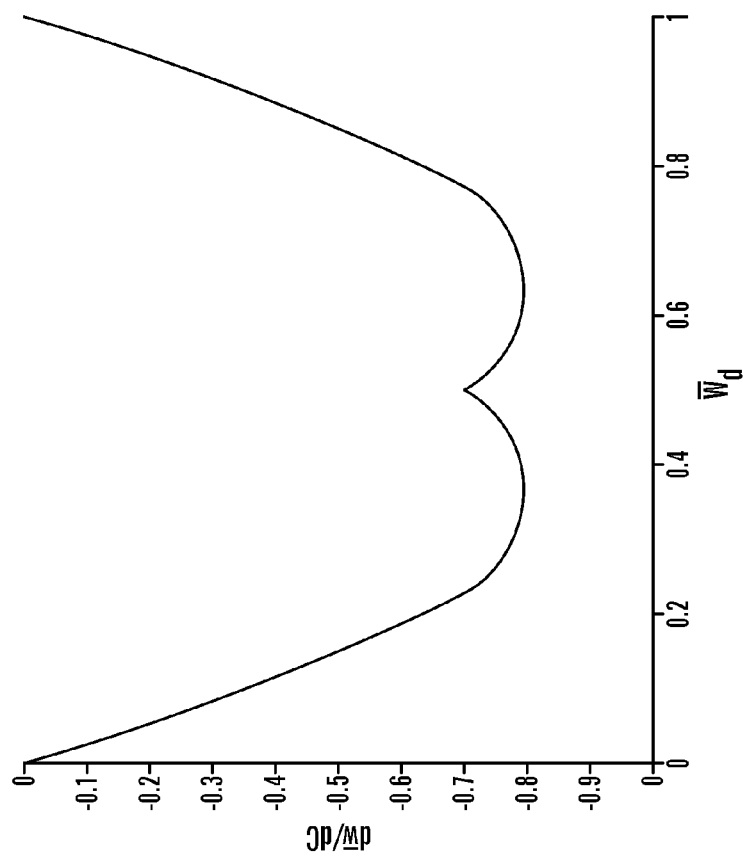
FIGS. 22A-22B plot the sensitivity of width to the measurable contrast over the full range of nominal width (22A) and over the range of greatest interest (22B).

Equations 22a and 22b express the rate of change of $\overline{w}$ with the contrast, thus providing a measure of sensitivity. For good sensitivity of measurement (defined as the rate of change of contrast with $\overline{w}$, which is the inverse of Equations 22a and 22b), small changes in $\overline{w}$ preferably provide large changes in contrast. An important property of Equations 22a and 22b is that the sensitivity increases at the extremes $\overline{w} \ll 1$, and $1-\overline{w} \ll 1$ of the linewidth (i.e. when the width W is close to P), where $$\frac{d\overline{w}}{dC}$$

approaches zero, as shown in FIG. 22A. At one extreme each grating element is a feature with reflectivity $R_A$ defined by the presence of a film. At the other extreme each grating element is a feature with reflectivity $R_S$ defined by the absence of a film.

Figure 22B:
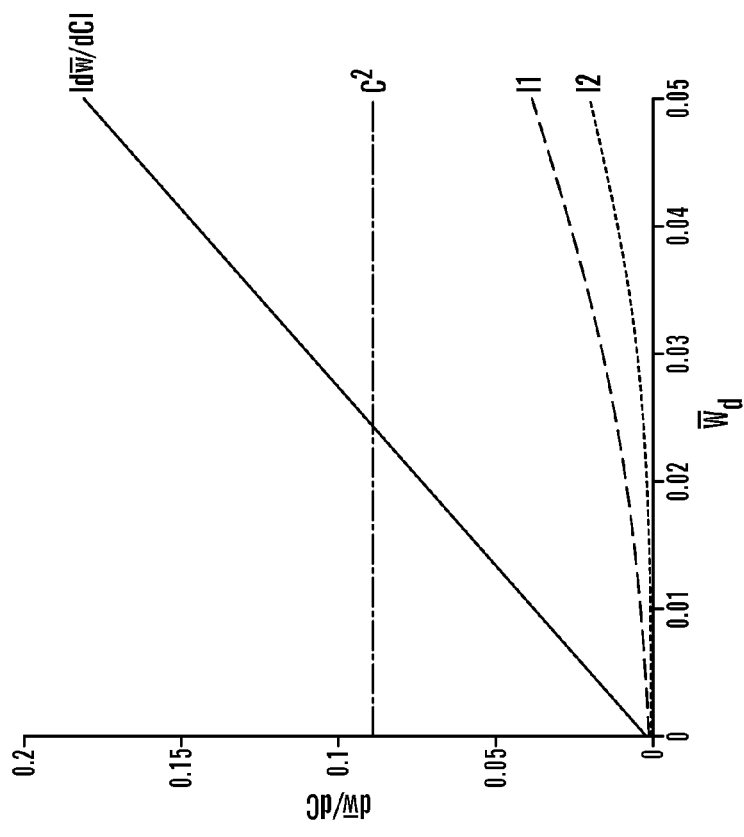

In either case, the inventive differential CD measurement has the desirable characteristic that sensitivity increases as the feature width decreases. A detailed view of sensitivity behavior in the $\overline{w}_d \leq 0.05$ region is shown in FIG. 22B. Substituting in Equations 21-23, at P=1000 nm and β=0.15, a 1 nm change in a 50 nm nominal CD in FIG. 17 (e.g. if $\overline{w}_d$=50 nm, then $W_{d1}$ is 15% larger, or about 57.5 nm, and $W_{d2}$ would be 15% smaller, or about 42.5 nm) corresponds to $\Delta\overline{w}$=0.001, $$\left|\frac{d\overline{w}}{dC}\right| \approx 0.18, \, C \gtrsim 0.25, \, \text{so that} \, \frac{\Delta C}{C} \gtrsim 0.02.$$

A 2% change in the nominal contrast (0.5% change in absolute contrast) is measurable, so a precision of 1 nm of measurable change in width is achievable.

Figure 23:
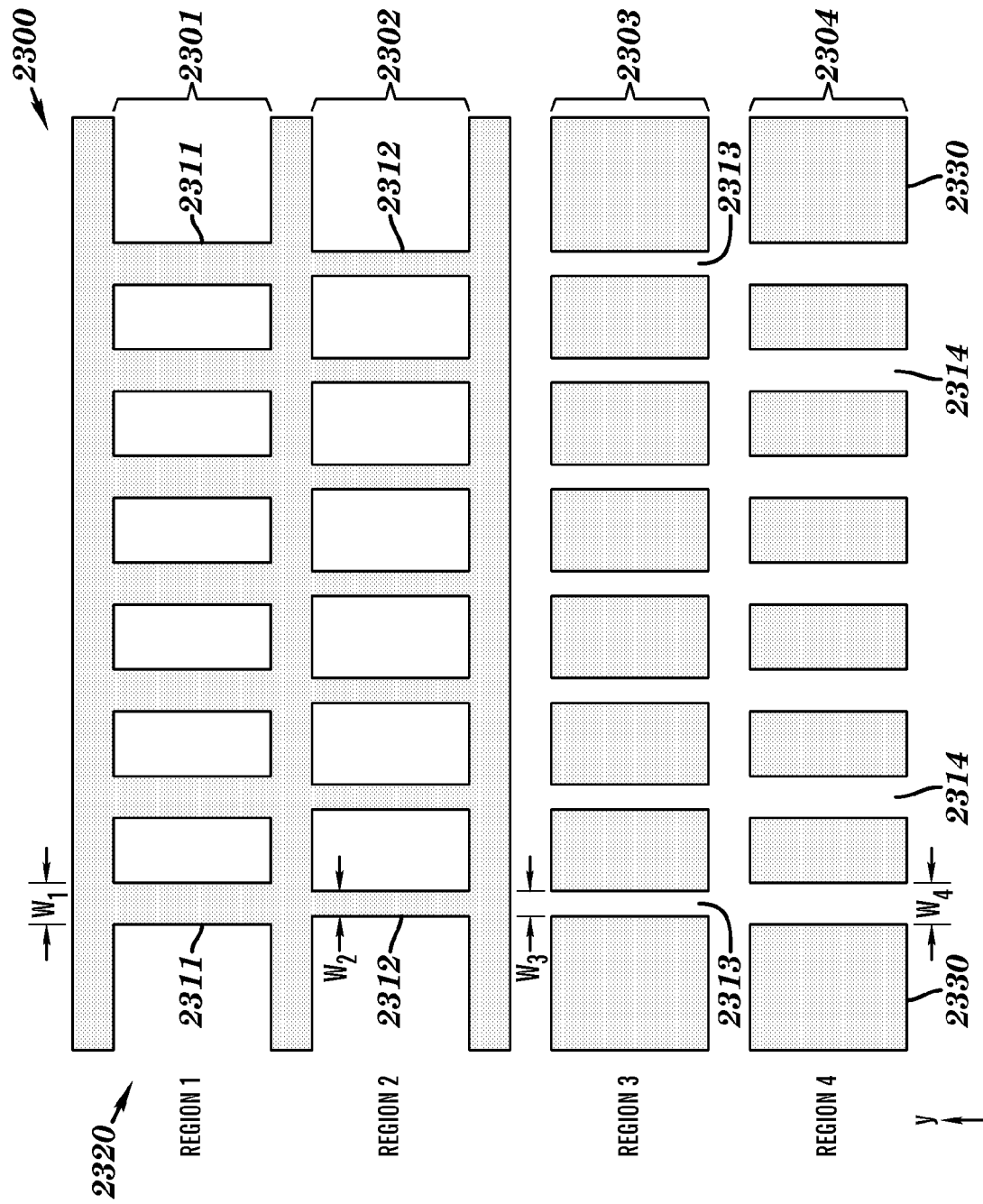
FIG. 23 illustrates a dual-tone linewidth target consisting of four regions, two containing isolated line shapes of different widths and two containing isolated line spaces of different widths.
Figure 24B:
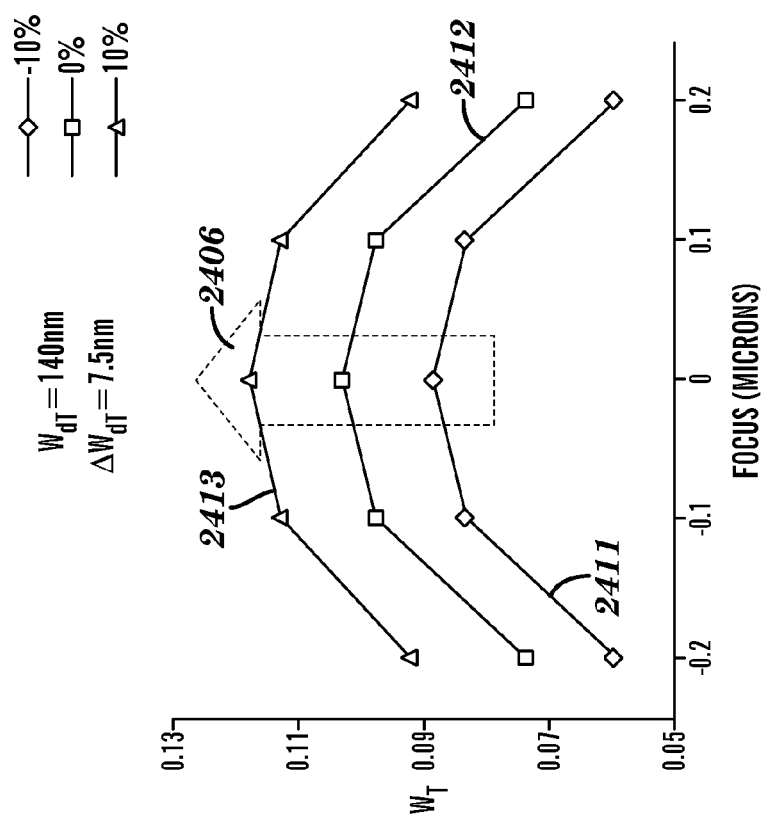
FIG. 24 plots the simulated response of the target in FIG. 23 to dose and focus.
Figure 24A:
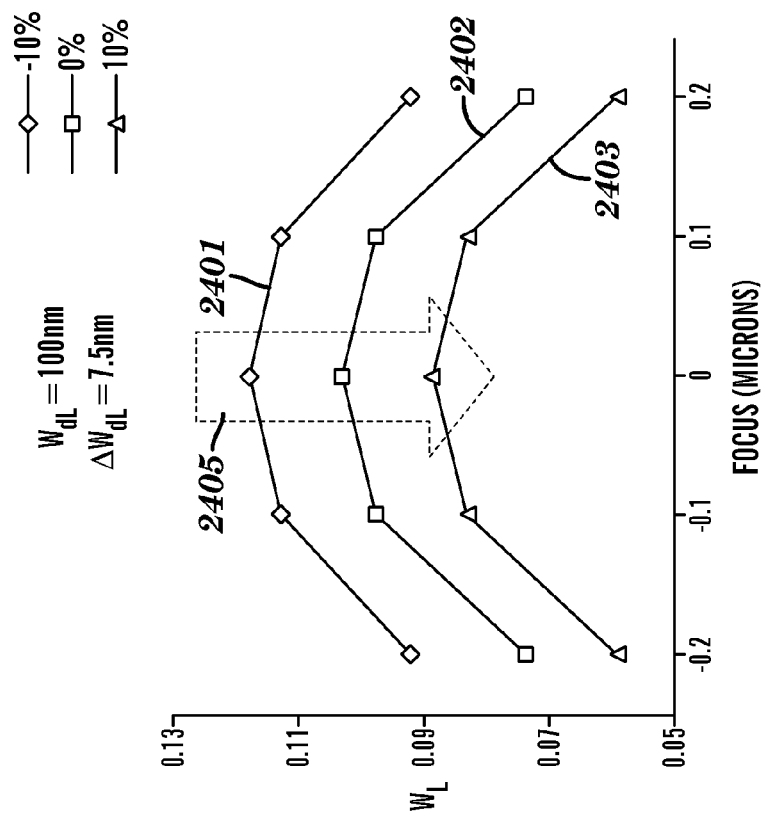

As noted above, one purpose of the differential CD measurement is to enable a differential response to processing conditions, such as dose and focus, during pattern formation in photoresist on the wafer. Several embodiments of diffractometry targets that enable dose and focus separation are shown in FIGS. 23-30. The target 2300 in FIG. 23 is comprised of differential shape (i.e. a patterned material layer where the patterned layer, such as resist, remains) and space (pattern areas where the patterned layer, e.g. resist, has been removed) gratings that define four regions, 2301, 2302, 2303 and 2304, as indicated. The widths $W_1$, $W_2$, $W_3$, $W_4$ of the grating elements 2311, 2312, 2313, 2314 are much less than the grating period, i.e., $W_1$, $W_2$, $W_3$, $W_4 \ll P$, so that each element is isolated with respect to its neighbors. Within first and second regions 2301 and 2302, the substrate (open space 2320) reflectivity is $R_{S1}$ and the grating shape element (e.g. resist shapes 2311, 2312) reflectivity is $R_L$, whereas within third and fourth regions 2303 and 2304, the surrounding region (e.g. large resist area 2330) reflectivity is $R_{S2}$ and the grating space (substrate) element 2314 reflectivity is $R_T$. Note that the reflectivities are "effective" reflectivities influenced by edge effects and profile characteristics in the regions of the narrow features. There are two pairs of regions of opposite tone, i.e. a substantially open (removed patterned areas) space 2320 consisting of sub-pattern regions 2301, 2302, and a substantially filled (i.e. filled by the patterned layer material, such as resist) region 2330 consisting of sub-pattern regions 2303, 2304. The two pairs of dual-tone regions (2320, 23430) can be treated separately in measuring the dimensions of the isolated shapes and spaces according to the invention described above. When formed as a latent or developed image in resist, the isolated shape width $$W_L = \frac{W_1 + W_2}{2}$$

decreases in the direction indicated by the dashed arrow 2405 as dose increases from −10% (2401) to 0% (2402) to +10% (2403) as indicated by the curves of FIG. 24A, which is in the opposite direction (indicated by the dashed arrow 2402 over the curves of FIG. 24B) relative to that of the isolated space width $$W_T = \frac{W_3 + W_4}{2},$$

which increases as dose increases from −10% (2411) to 0% (2412) to +10% (2413). On the other hand, the dimensions of the spaces (curves 2411, 2412 and 2413 of FIG. 24B) and shapes (curves 2401, 2402 and 2403 of FIG. 24A) change in the same direction with respect to changes in defocus (or focus). The plots of FIGS. 24A and 24B are simulations of the inventive measurement method applied to a Focus-Exposure matrix (under the same conditions as those described for FIG. 11) of the target 2300 shown in FIG. 23, where a 40 nm bias has been applied to the space elements 2313, 2314 to ensure printing to size at the same nominal dose as the shape elements 2311, 2312. Methods for extracting dose and defocus are described in Ausschnitt (U.S. Pat. No. 5,965,309) or in the publication by C. P. Ausschnitt, "Distinguishing dose and defocus for in-line lithography control," Proc. SPIE, Vol. 3677, 140-147 (1999), the disclosures of which are hereby incorporated in their entirety by reference. Once the response of the dual-tone target 2300 to dose and focus is characterized for a process, measurements of the changes from nominal in dimensions of patterns produced by that process can be converted to dose and defocus by the inverse modeling as described in the above publications. One tone is characterized by opaque (or dark) lines or features (representing remaining patterned material) in a clear (or bright) field, while the opposite tone pattern is characterized by clear (or bright) features in an opaque (or dark) field.

Figure 25:
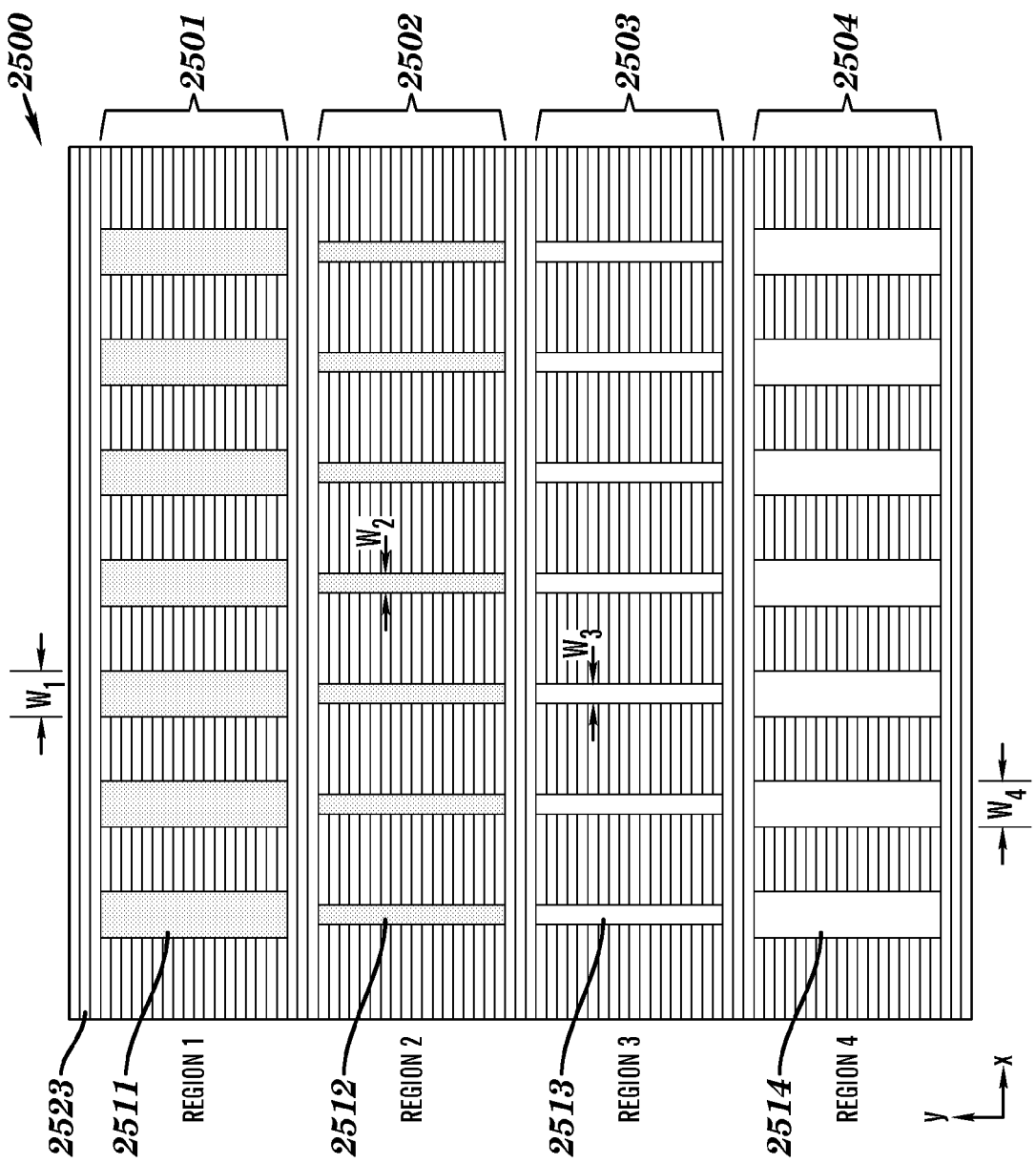
FIG. 25 illustrates a dual-tone line-length target consisting of four regions, two in which the isolated line shapes are defined by the ends of periodic orthogonal line spaces of different lengths and the other two defined by the ends of periodic orthogonal line shapes of different lengths.

Another embodiment of a differential CD/dose/focus target 2500 is shown in FIG. 25. Here, within a first and second sub-pattern region 2501, 2502 respectively, an effective isolated shape region 2511, 2512 (having nominal widths $W_1$, $W_2$, respectively) of remaining patterned material characterized by reflectivity $R_L$ is formed by the area substantially surrounded by the ends of nested narrow-width parallel spaces (i.e. areas of removed patterned material in the shape of lines having width preferably about $p_f/2$) of nominal period $p_f \ll P$ whose lengths are oriented along the direction of primary periodicity P (i.e. the x-direction in FIG. 25) and orthogonal to the edge of the effective shape regions 2511, 2512, in a manner similar to the shape regions 901, 902 defined by fine-period lines 908 of FIG. 9B. Within subpattern regions 2503, 2504, an effective isolated space region (a region of removed patterned material) 2513, 2514 (having nominal widths $W_3$, $W_4$, respectively) characterized by reflectivity $R_T$ is formed by the ends of tightly nested parallel narrow rectangular shapes (i.e., lines of remaining patterned material having width, preferably about $p_f/2$) of nominal period $p_f \ll P$ whose lengths are oriented parallel to the direction of primary periodicity P and are orthogonal to the edges of the effective space regions 2513, 2514. The delineation of effective space regions 2513, 2514 is similar to the delineation of space regions 903, 904 by fine-period lines 909 of FIG. 9C. As viewed by the diffractometer 40, the regions 2523 covered by the fine-period parallel rectangular lines and spaces are characterized by effective reflectivity $R_S^e$. In a manner similar to that for the target 2300 of FIG. 23, the two pairs of regions (2501, 2502) and (2503, 2504) in FIG. 25 can be treated separately in measuring the effective widths of the effective isolated shapes $\overline{w}_1$, $\overline{w}_2$ and spaces $\overline{w}_3$, $\overline{w}_4$ according to the invention described by Ausschnitt in U.S. Pat. No. 5,965,309, as discussed above. The response of the effective isolated shape width $\overline{w}_1$, $\overline{w}_2$ to dose is opposite that of the effective isolated space $\overline{w}_3$, $\overline{w}_4$, whereas their response to defocus is the same, as illustrated in FIGS. 24A, 24B and 27A, 27B. This distinct response of the shape and space structures enables the separate control of lithographic dose and focus according to Ausschnitt (U.S. Pat. No. 5,965,309). The advantages of the target 2500 in FIG. 25 relative to the target 2300 of FIG. 23 are twofold: 1) shape and space ends have enhanced sensitivity to dose and focus; and 2) the target 2500 of FIG. 25 maintains a more uniform pattern density, comparable to that of the chip pattern, necessary to ensure compatibility with other process steps such as CMP (chemical mechanical polishing).

Figure 26A:
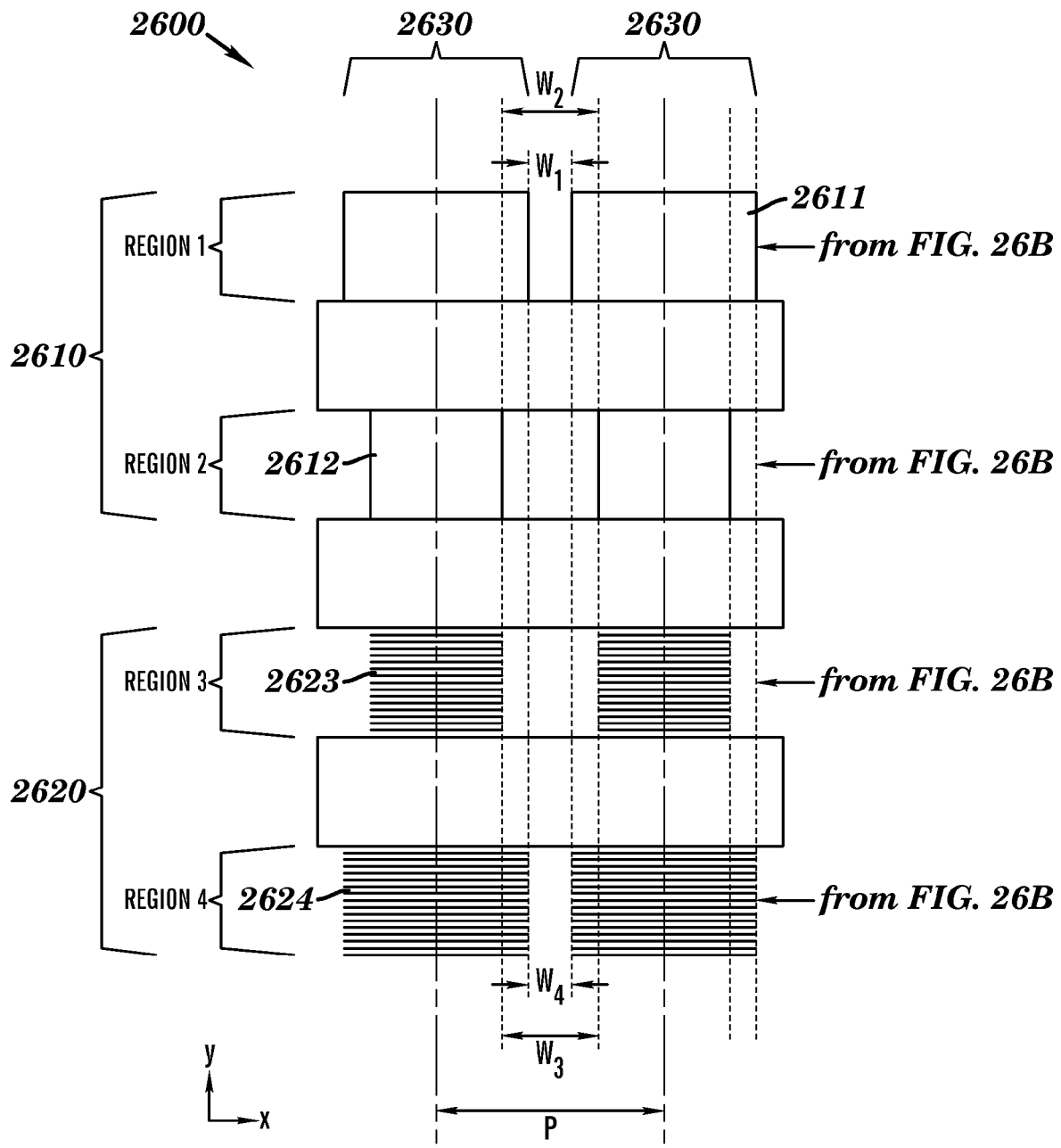
FIG. 26 illustrates a target that separately enhances the response to both dose and focus. The dose target uses sub-resolution assist features on the mask to enhance dose sensitivity and suppress focus sensitivity on the substrate. The focus target uses tapered line ends to enhance the focus sensitivity of line-end shortening.
Figure 26B:
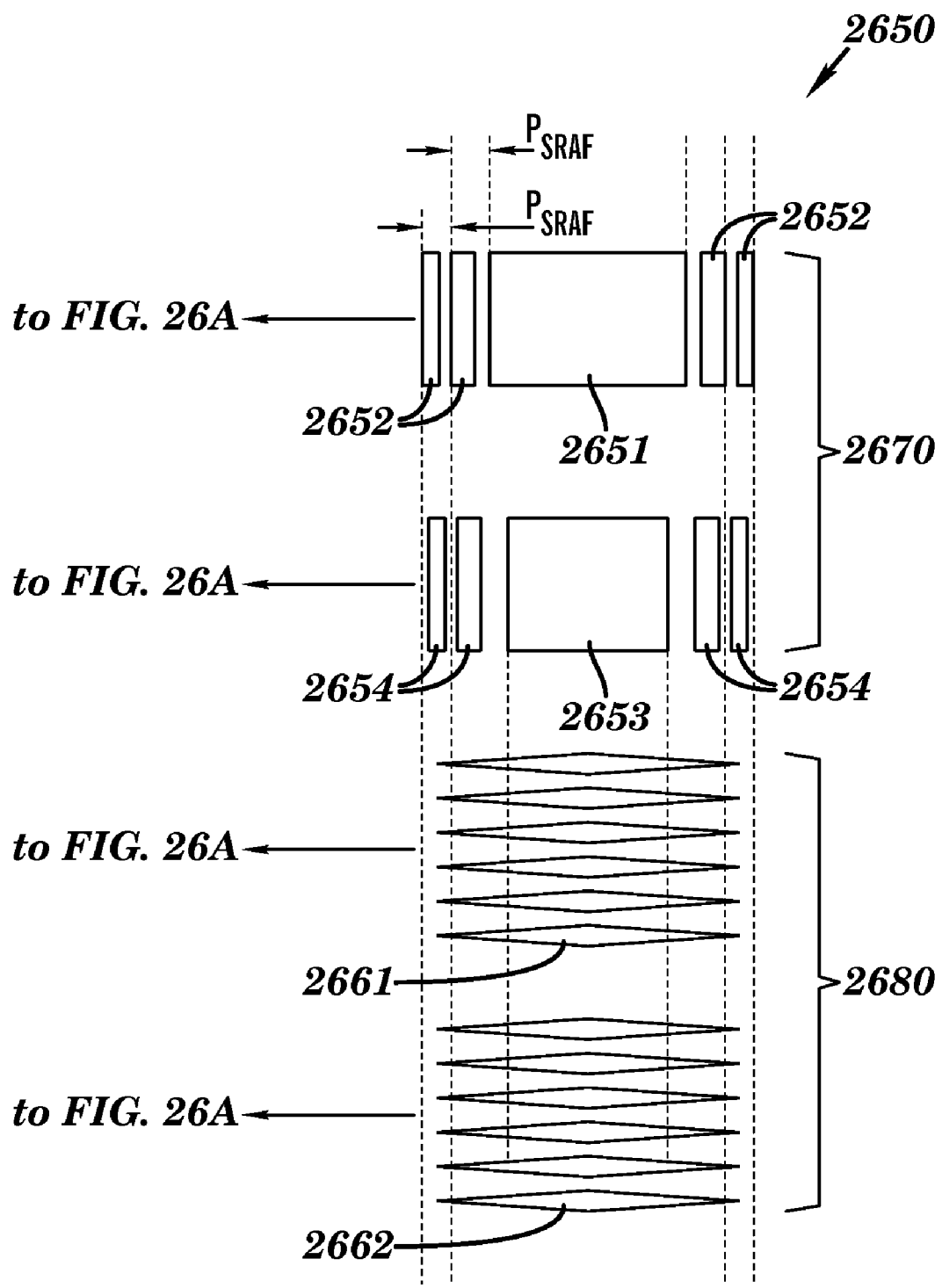
Figure 27B:
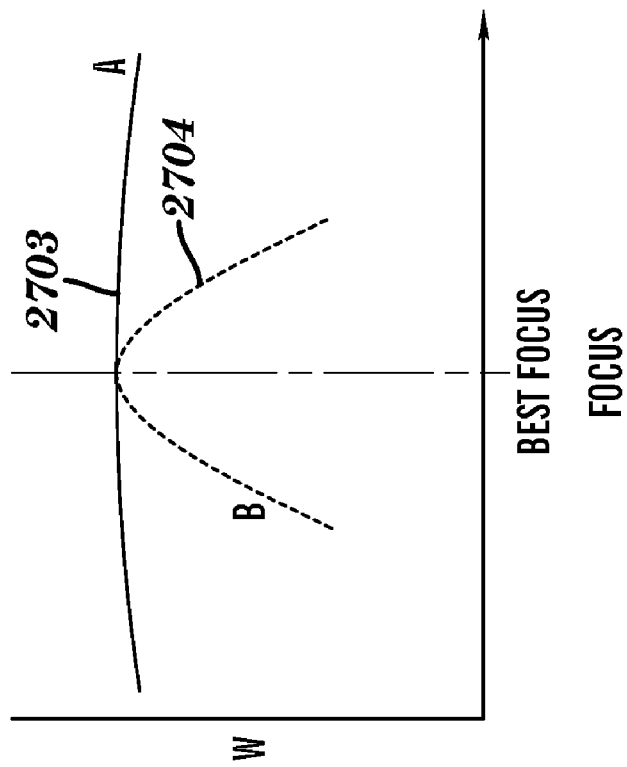
FIG. 27 are plots of the dose and focus response for dose and focus target of FIG. 26.
Figure 27A:
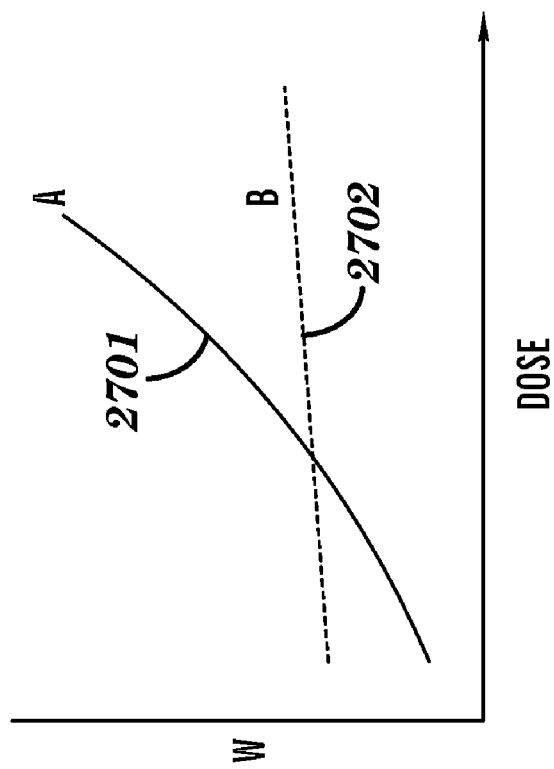

Other targets to enable dose and focus differential response by differential CD measurement of patterns formed in resist films can be created based on dose sensitive designs described by Starikov ("Exposure Monitor Structure", SPIE vol. 1261 Integrated Circuit Metrology, Inspection, and Process Control IV (1990)) and Inoue, et. al. (U.S. Pat. No. 6,251,544, issued Jun. 26, 2001) and focus sensitive designs described by Suwa (U.S. Pat. No. 4,908,656) and Ausschnitt (U.S. Pat. No. 5,953,128). The Starikov and Inoue designs greatly enhances dose sensitivity and dampen focus sensitivity by using subresolution assist features (SRAFs) on the mask pattern. The Suwa and Ausschnitt designs enhance sensitivity to defocus by introducing tapering of the ends of lines. These designs are readily adapted to the inventive differential CD measurement described above as illustrated in FIG. 26. In FIG. 26A, a target 2600 is designed that has a dose-sensitive section 2610 comprised of two subpattern regions, Regions 1 and 2, having repeating elements 2611, 2612, respectively, and a defocus-sensitive section 2620 comprising two subpattern regions, Regions 3 and 4, having repeating elements 2623, 2624, respectively. The target 2600 has a primary periodicity of P in the x-direction of N repeating sub-patterns element sections 2630 (for clarity, only two repeating element sections 2630 are shown). The open patterned regions or spaces (between the remaining patterned material) have widths $W_1$, $W_2$, $W_3$, $W_4$ corresponding to subpattern elements 2611, 2612, 2623 and 2624, respectively. In FIG. 26B illustrates a portion of a mask layout 2650 used for forming one element section 2630. The upper mask section 2670 consists of primary features 2651, 2653 with adjacent sub-resolution assist features (SRAFs) 2652, 2654 which are used to image the primary features 2611 and 2612, respectively, on the wafer. As illustrated in FIG. 27A, the widths of the spaces $W_1$, $W_2$ in the dose-sensitive region 2610 are very sensitive to dose as illustrated by curve 2701 (as described, for example, by Starikov and Inoue), while the variation of widths $W_3$, $W_4$ with defocus does not change rapidly as illustrated by curve 2703 as illustrated in FIG. 27B.

By contrast, the focus-sensitive region 2620 is formed by a mask layout such as 2680, consisting, for example, of tapered lines 2661, 2662 (as described by Suwa or Ausschnitt), to form patterned regions 2623, 2624, respectively. The widths $W_3$, $W_4$ of the spaces in the focus-sensitive region 2620 vary as a function of dose in a manner similar to curve 2702 of FIG. 27A, thus are relatively insensitive to dose variations, but are relatively very sensitive to defocus, as illustrated by curve 2704 of FIG. 27B.

Other defractometry targets for use in accordance with the present invention can be designed to achieve focus sensitivity using phase shifting elements on the mask as demonstrated by Brunner (U.S. Pat. No. 5,300,786). What all of these embodiments have in common is that they rely on CD or overlay measurement. The various target designs are readily adapted to the inventive differential CD measurement described above, or the inventive differential overlay measurement described below. Targets that address specific applications other than dose and focus control can be assembled from the embodiments illustrated in FIGS. 6, 8, 9, 23, 25 and 26, among others. For example, a target consisting of a series of width steps to approximate the wedge elements 601 shown in FIG. 6 would provide a means of quantifying the linearity of the lithographic process over a wide range of CDs. A comparison of wafer measurements to mask measurements on such a target would quantify the so-called MEEF (mask error enhancement factor) effect that is critical to understanding sources of CD variation in sub-wavelength imaging.

Figure 28:
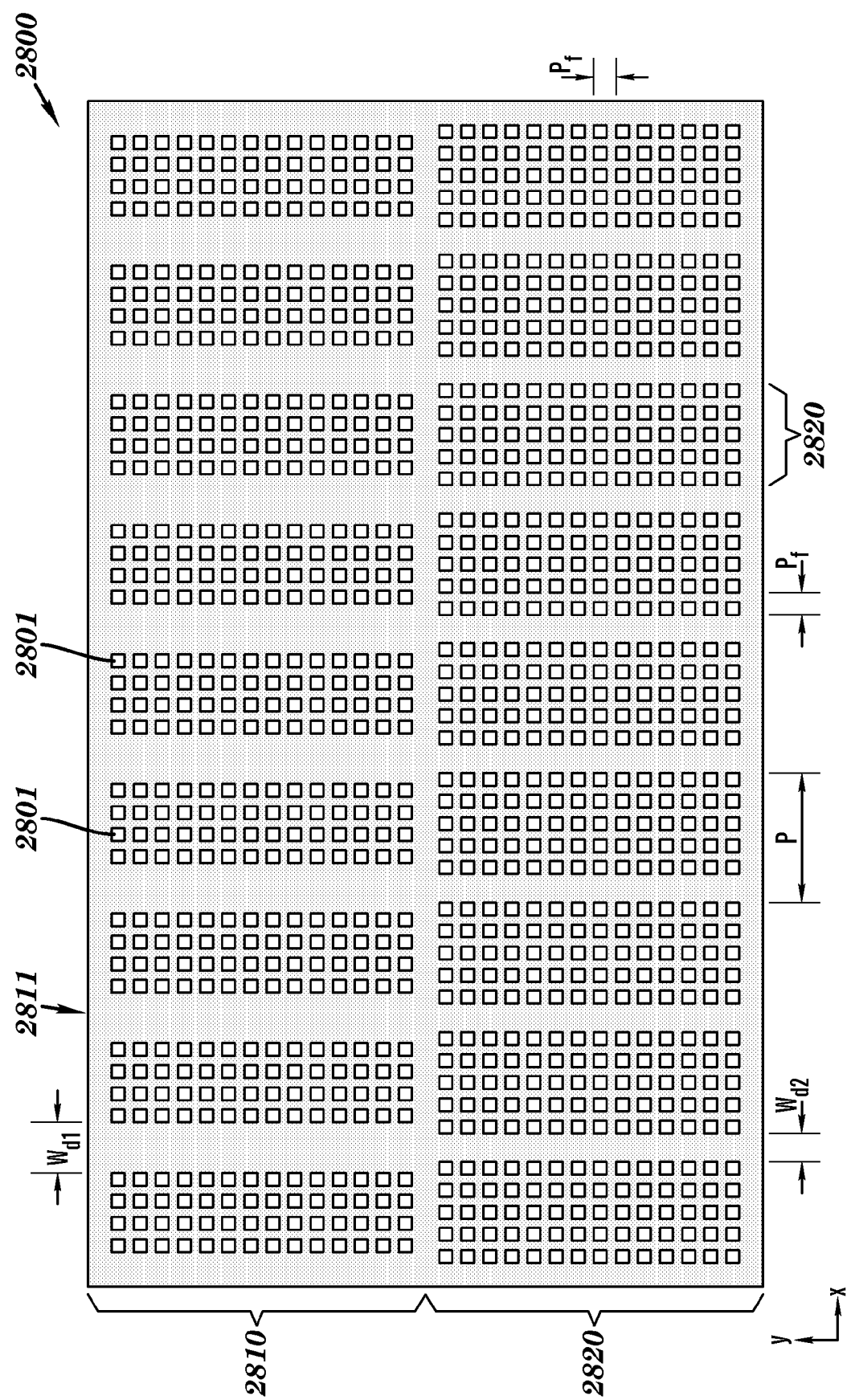
FIG. 28 shows a differential grating target layout comprised of dense contact holes.
Figure 29:
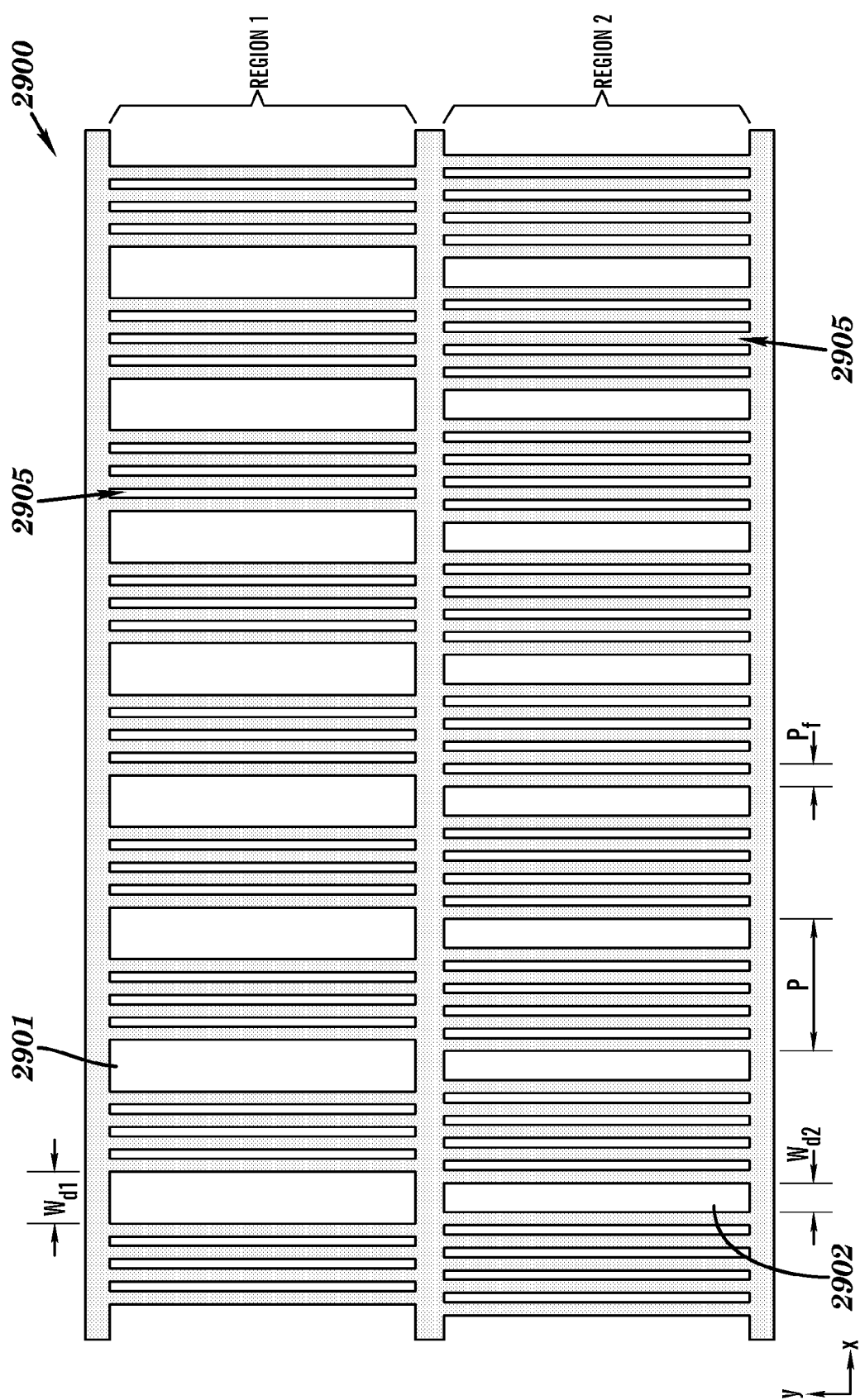
FIG. 29 shows a differential grating target layout comprised of dense parallel lines oriented perpendicular to the grating period.

Target embodiments can also be tailored to the characteristics of specific patterning layers. FIG. 28 shows a target 2800 comprised entirely of contact holes 2801 at a fine period $p_f$ in the x- and y-directions, arranged to form larger elements 2811 having nominal width $W_{d1}$, and 2812 having nominal width $W_{d2}$, having primary periodicity P along the x-direction. In another embodiment, FIG. 29 shows a target 2900 having two subpattern regions Region 1 and 2, where the background reflectivity region 2905 is comprised of finely spaced lines at fine period $p_f$ running parallel to the coarse period P of the measurable grating elements 2901, 2902 having nominal widths $W_{d1}$, $W_{d2}$, respectively.

Figure 30:
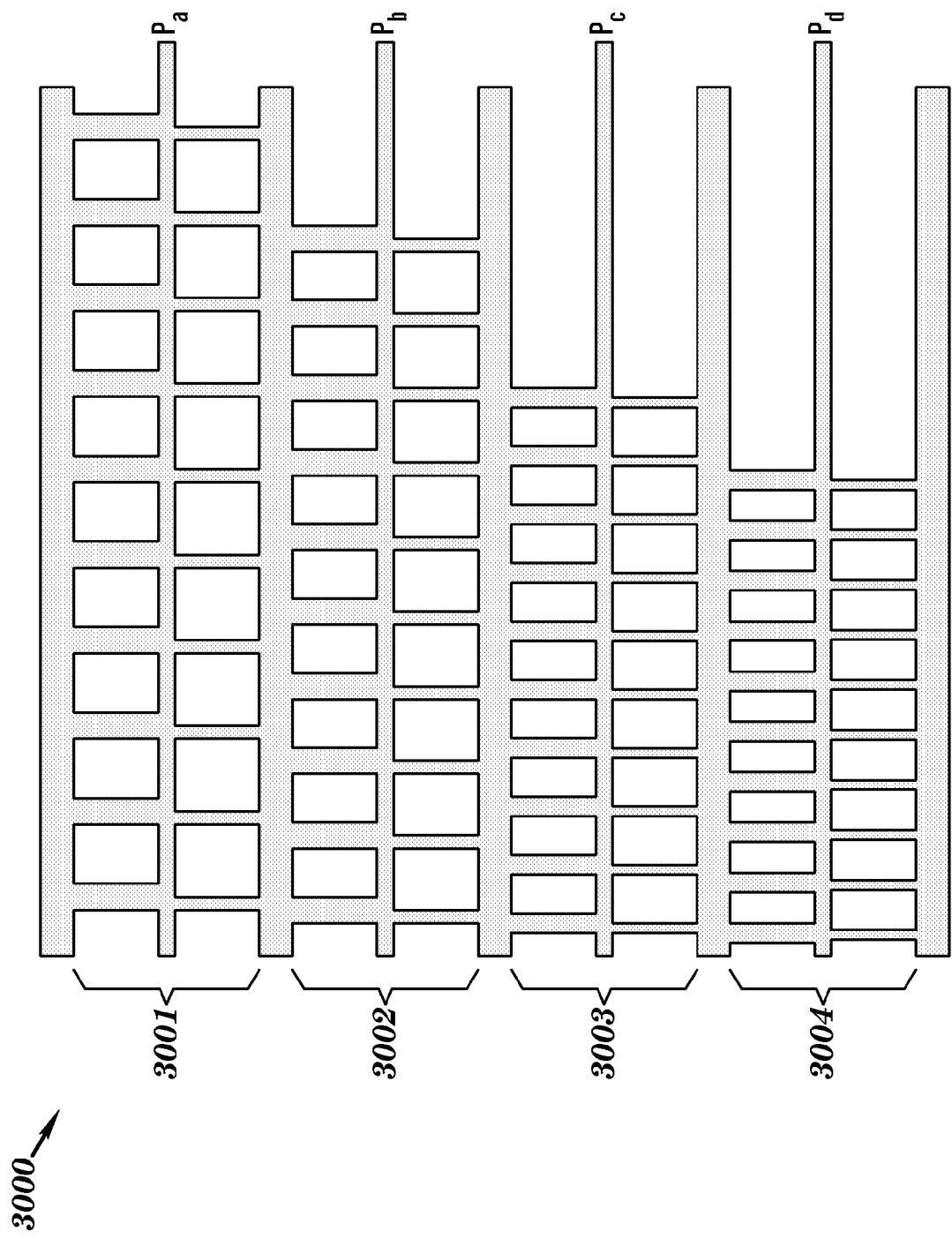
FIG. 30 shows a target comprised of multiple targets of the type shown in FIG. 17 at different periods.
Figure 31:
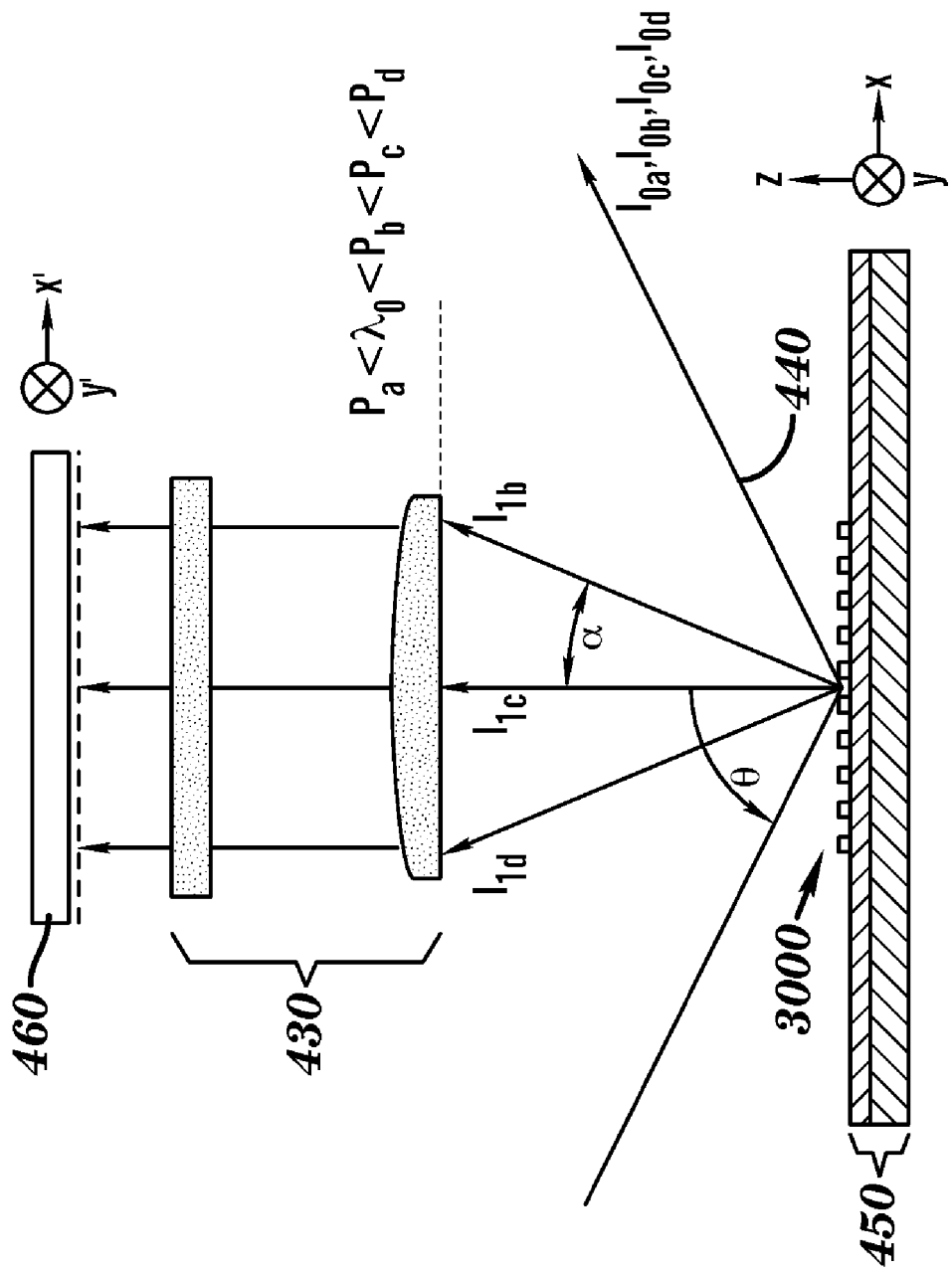
FIG. 31 illustrates the optical rays in the inventive apparatus for the target shown in FIG. 30.

Another target embodiment 3000, shown in FIG. 30, enables the application of the inventive differential diffractometry measurement to the parallel acquisition of through-pitch CD measurements. The measured dependence of the printed CD on pitch or period is critical to the determination of the Optical Proximity Correction (OPC) rules. OPC rules govern the modification of product mask layouts to ensure simultaneous printing of differently pitched features to a common size. A current limitation of OPC rules generation is that the conventional SEM CD measurement approach is slow and laborious. In particular, SEM CD measurement precludes the gathering of sufficient data to ensure the matching of the printed CDs over a representative process window. The target of FIG. 30 is comprised of multiple differential gratings 3001, 3002, 3003, 3004, each similar in design to that shown in FIG. 17 where the period, $P_a$, $P_b$, $P_c$, $P_d$, respectively, is changed from one differential grating to the next. Under monochromatic illumination $\lambda_0$, the diffraction from the target 3000 in FIG. 30 will occur as shown in FIG. 31. The zero order intensities $I_{0a}$, $I_{0b}$, $I_{0c}$, $I_{0d}$ are reflected along the path 440, and the first order intensities $I_{1b}$, $I_{1c}$, $I_{1d}$ are collected by the optics 430. However, first order intensity $I_{1a}$ for subregion 3001 is not collected because the pitch of subregion 3001 $P_a < \lambda_0$. The relationship between the angles can be expressed by the grating equation:

$$\frac{n\lambda_0}{P} = \sin\theta + \sin\alpha. \quad (24a)$$

The range of grating periods for which non-zero diffracted orders are detectable by the apparatus must satisfy the condition $-NA_x < \sin\alpha < NA_x$, in which case:

$$\frac{n\lambda_0}{\sin\theta + NA_x} < P < \frac{n\lambda_0}{\sin\theta - NA_x}. \quad (24b)$$

Figures 32A, 32B:
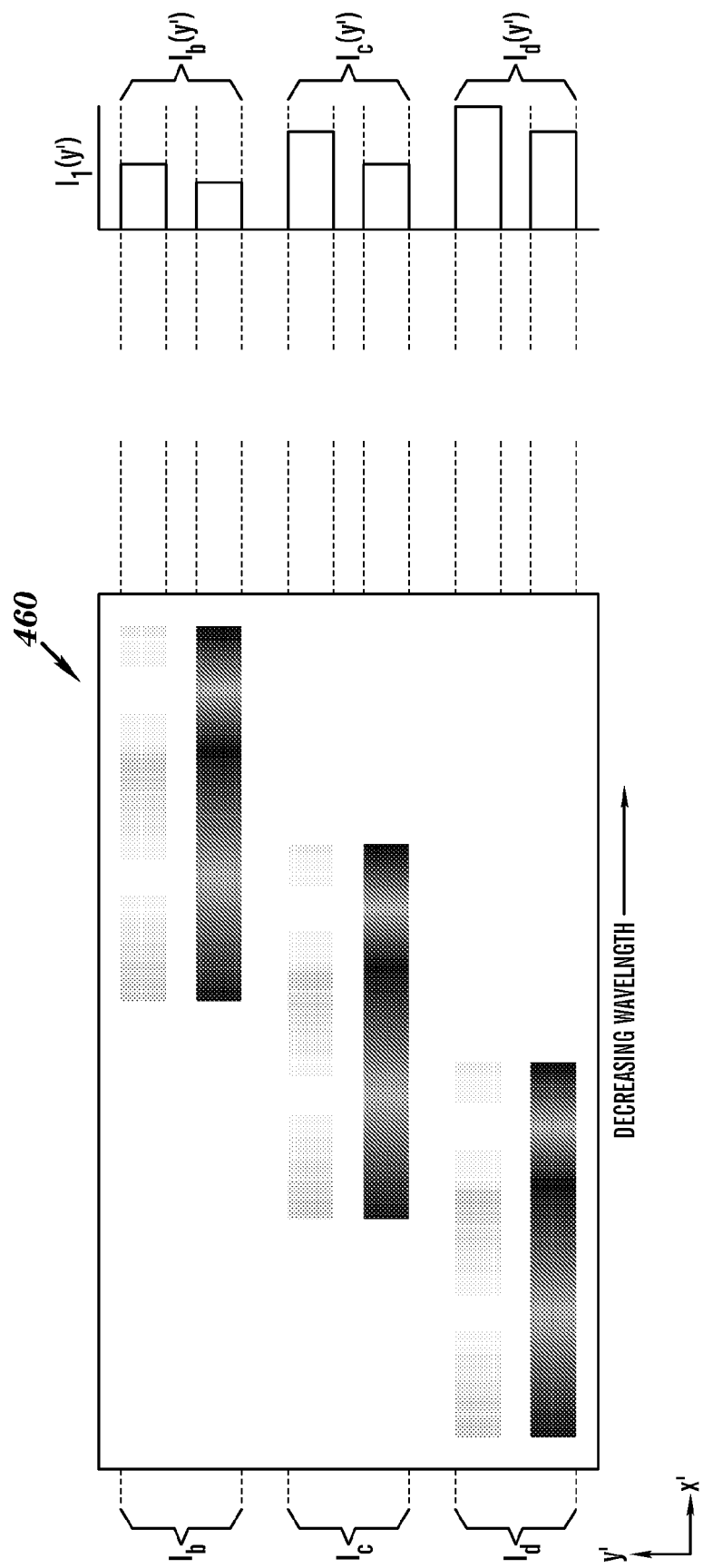
FIG. 32 shows the detected intensity distribution corresponding to the target and apparatus of FIGS. 30 and 31, respectively.

For shallow angle illumination $\theta=70°$ and $NA_x=0.5$, corresponding to a maximum collection angle $\alpha_{max}=\pm30°$, the range of first order detection is $0.7\lambda_0 < P < 2.3\lambda_0$. Thus, available DUV sources at a wavelength of 200 nm would enable CD measurement at periods in the range 140 nm<P<460 nm. Ranges encompassing larger periods are achieved using longer wavelength illumination. A multiwavelength or broadband source would accommodate the entire range of interest for OPC at the most advanced ground rules, periods from 150 nm to 3000 nm. Periods smaller than the lower cutoff defined in Equation 24b are detectable only in zero-order. FIG. 32A shows the detected first-order intensities $I_b$, $I_c$, $I_d$ from a target 3000 for the broadband illumination of three periods $P_b < P_c < P_d$ on a plan view of the detector 460. Since the diffraction angle varies with period, the detected intensities are staggered in the x'-direction, which corresponds to the direction of varying wavelength on the detector 460. Simultaneous measurement of the CDs in each of the periods is enabled by separate measurement of the intensities $I_1(y')$ integrated or summed over the x'-direction, illustrated in FIG. 32B. Thus, the inventive method enables the simultaneous measurement of CDs through a wide range of pitch.

The zero-order detection path 440 of the apparatus 40 in FIG. 4A enables the measurement of film thickness simultaneously with the measurement of CD. As shown in FIG. 33A, for the case of a target similar in design to target 1701 of FIG. 17, the zero-order image plotted on a plan view of the CCD2 detector 480 (FIG. 4A) is divided in the y'-direction into regions 3301, 3302 corresponding to the patterned regions 1731, 1732 of target 1701 in FIG. 17, while regions 3305 correspond to the unpatterned regions 1705 of target 1701 in FIG. 17. The intensity spectrum $I_0(x')$ of the unpatterned regions 3305 can be utilized for film thickness measurement. As shown in FIG. 33B, the zero order intensity spectrum $I_0(x')$ 3307 in the unpatterned image region 3305 along line A-A' corresponding to the unpatterned target regions 1750 between the two grating image regions 3301, 3302 corresponding to target regions 1711, 1712, respectively, has an unique signature that depends on the intrinsic properties of the films—the real and imaginary components of the refractive indicies $n_i(\lambda)$, $k_i(\lambda)$ of the film—and the thickness $t_i$ of each film. In cases where the $n_i(\lambda)$, $k_i(\lambda)$ values are known, the thicknesses can be determined by conventional fitting of the modeled response of a multi-film layer to the measured spectrum using the thicknesses as free parameters. In the case where one or more of the $n_i(\lambda)$, $k_i(\lambda)$ values are not known, their determination can be included in the fitting routine by using conventional models of their expected dispersive behavior, such as the Cauchy formulation. Of course, in the absence of detectable non-zero order diffraction (as would be the case in the absence of a target), the same methods can be applied to the determination of film properties and thicknesses using the detector 480 of apparatus 40 in FIG. 4A.

Differential Overlay

A variation of an embodiment of the inventive diffractometry system 40 in FIG. 4 is shown in FIG. 34. The ability to illuminate the target 40 from two opposite directions, both along the direction of the target primary pitch P, i.e., the x-direction, has been added, where FIG. 34A illustrates illumination of target 455 directed from the negative x-direction (the direction of primary periodicity) and FIG. 34B illustrates illumination of the target 455 directed from the positive x-direction. This enables detection of both positive and negative diffracted orders with a single apparatus. This can be achieved by configuring the apparatus 40 to allow repositioning of the illumination 410, or repositioning of the target wafer 450, to achieve the appropriate illumination direction relative to the target. When the illumination is from left to right at an angle $$\theta = \arcsin\left(\frac{\lambda}{P}\right),$$

the +1 diffracted order 441 is detected. When the illumination is from right to left at an angle $$\theta = \arcsin\left(-\frac{\lambda}{P}\right),$$

the −1 diffracted order 441' is detected. The ability to detect both positive and negative diffracted orders is essential to the measurement of overlay error, as explained below.

Figure 35A:
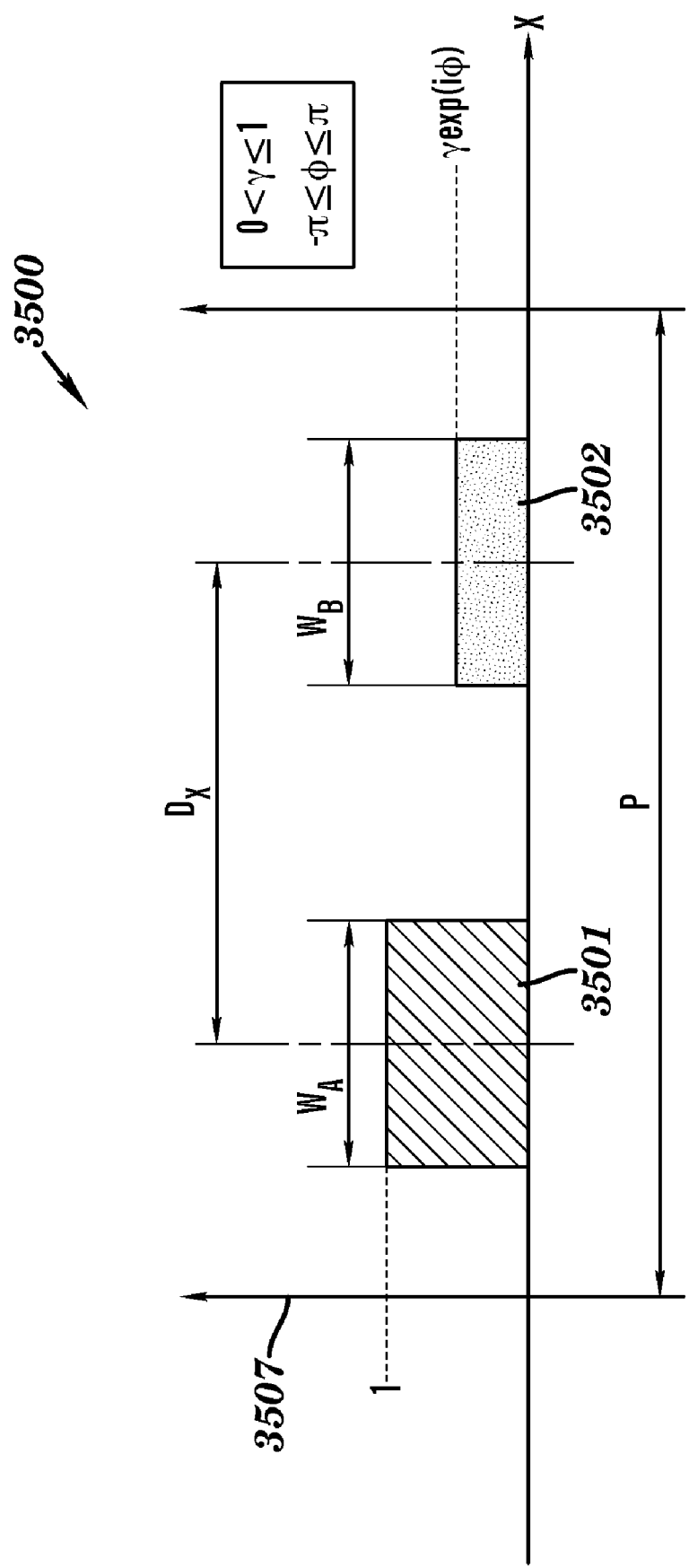
FIG. 35 shows a schematic of the two-dimensional reflectivity of the two-level grating target suitable for overlay metrology and plots of the resulting first order intensity dependence on the relative position of the grating elements for various conditions of the relative amplitude $\gamma$ and phase $\phi$.

A repeating unit of an idealized overlay target grating 3500 (similar to the idealized CD diffraction schematic of FIG. 5A) is shown in FIG. 35A, where, for clarity, only one repeating unit is illustrated. The overlay grating target 3500 as printed on the wafer consists of two features 3501, 3502 within each period P, one feature 3501 formed by the patterning process A having width $$W_A \le \frac{P}{4}$$

and the second feature 3502 formed by the patterning process B having width $$W_B \le \frac{P}{4}.$$

Patterning process B may represent the process for printing a first layer of features 3502, and patterning process A may represent the process of a second, overlying layer of features 3501. As in the case of the CD targets discussed earlier, the features 3501 and 3502 can be comprised of lines, trenches or arrays of smaller features, as long as the features are compatible with the groundrules of the process layers on which they are printed. The widths $W_A$ and $W_B$ relative to the period P determine the range of the measurable overlay error. The idealized overlay grating 3500 in FIG. 35A has two lines 3501, 3502 within each period in the direction of the horizontal axis x: lines 3501 having width $W_A$ and lines 3502 having width $W_B$, whose centerlines are separated by a distance $D_x$. The ratio $D_x/P$ is designed to have a nominal value of ½. Therefore, x-direction overlay error $\epsilon_x$ between the two features 3501, 3502, normalized to the period P, can be expressed as:

$$\epsilon_x = \frac{D_x}{P} - \frac{1}{2} \quad (25)$$

The vertical axis 3507 in FIG. 35A illustrates the normalized complex reflectivity of the line 3501 having a real amplitude of 1, and zero phase, and line 3502 having a real amplitude of $\gamma$ where $0 < \gamma \leq 1$ and phase $\phi$, where $-\pi \leq \phi \leq \pi$. Normalization of the reflectivities of the lines 3501, 3502 is relative to the complex reflectivity of the underlying film stack and substrate. In contrast to the CD case (see FIG. 5) where the target features are formed in a single layer, the overlay features 3501, 3502 may be formed in different films of the film stack. In general, therefore, the reflectivities of the two features 3501, 3502 relative to the substrate at any given wavelength are not equal, but differ in both amplitude and phase as described further below.

For substrate reflectivity $R_S$ and respective line reflectivities $R_A$, $R_B$, the spatial variation of the reflectivity amplitude $a(x,y)$ over the surface of a finite grating consisting of N periods containing line pairs of length H (the length H is oriented along the y-direction, orthogonal to the x-direction, which is the direction of periodicity) illuminated by an amplitude $A_0$ is described by the following equation:

$$a(x, y) = A_0 \left\{ \begin{array}{l} R_S + R_{AS}\left[rect\left(\frac{y}{H}\right)rect\left(\frac{x}{W_A}\right) \otimes comb\left(\frac{x}{P}\right)\right]rect\left(\frac{x}{NP}\right) + \\ R_{BS}\left[rect\left(\frac{y}{H}\right)rect\left(\frac{x-D_x}{W_B}\right) \otimes comb\left(\frac{x}{P}\right)\right]rect\left(\frac{x}{NP}\right) \end{array} \right\} \quad (26)$$

where we have defined $R_{AS}=R_A-R_S$ and $R_{BS}=R_B-R_S$. In the scalar diffraction theory approximation valid for P>2, the far-field amplitude $A_n$ of order n is given by the Fourier transform of Equation (26):

$$\frac{A_n(u,v)}{A_0} = R_S \delta(u, v) + \quad (27)$$

$$HNP\text{sinc}(Hv)\sum_n \text{sinc}\left[NP\left(u - \frac{n}{P}\right)\right]\left[\begin{array}{c} R_{AS}W_A\text{sinc}(W_A u) + \\ R_{BS}W_B\text{sinc}(W_B u)e^{-i2\pi D_x u} \end{array}\right]$$

where (u, v) are the far-field coordinates at a distance z from the grating defined by ($u=x/\lambda z$, $v=y/\lambda z$). In the direction $$\left(u = \frac{n}{P}, v = 0\right),$$

the intensity in the plane of the detector 460 of FIG. 34 is dispersed in wavelength in the x-direction according to Equation (1) and imaged at a magnification M in the y-direction. For $n \neq 0$, the first order amplitude is given by:

$$A_{\pm n}(\lambda, D_x) = K(\lambda)\left[1 + \gamma(\lambda)e^{i\left(\phi(\lambda) \pm \frac{2\pi n D_x}{P}\right)}\right] \quad (28)$$

and the corresponding intensity is:

$$I_{\pm n}(\lambda, D_x) = |K(\lambda)|^2 \left[1 + \gamma^2(\lambda) + 2\gamma(\lambda)\cos\left(\pm \frac{2\pi n D_x}{P}\right) + \phi(\lambda)\right] \quad (29)$$

where, at a single wavelength, the following definitions apply:

$$K(\lambda) \equiv A_0 HNPW_A R_{AS}(\lambda)\text{sinc}\left(\frac{nW_A}{P}\right) \quad (30a)$$

$$\gamma(\lambda) \equiv \frac{W_B \text{sinc}\left(\frac{nW_B}{P}\right)}{W_A \text{sinc}\left(\frac{nW_A}{P}\right)}\left|\frac{R_{BS}(\lambda)}{R_{AS}(\lambda)}\right| \quad (30b)$$

$$\phi(\lambda) \equiv \cos^{-1}\left[\left|\frac{R_{AS}(\lambda)}{R_{BS}(\lambda)}\right|\text{Real}\left(\frac{R_{BS}(\lambda)}{R_{AS}(\lambda)}\right)\right] \quad (30c)$$

and the ranges $0 < \gamma(\lambda) \leq 1$ and $-\pi < \phi(\lambda) \leq \pi$ apply. Under multiple wavelength illumination the definitions of Equations 30a-30c become functions of the relative reflectivities at each wavelength, but the general expressions for the amplitude and intensity in Equations 28-29 remain valid. In other words, the determination of (the unknown) overlay error $\epsilon_x$ from diffracted intensity measurements, also requires determination of two additional unknown parameters, namely, the amplitude and phase ($\gamma$, $\phi$) of the normalized complex reflectivities. Thus, the invention provides a means for determining the effective amplitude and phase difference as well as overlay error between patterns A and B based on measurements of diffracted intensity, as described in more detail below.

Figure 35C:
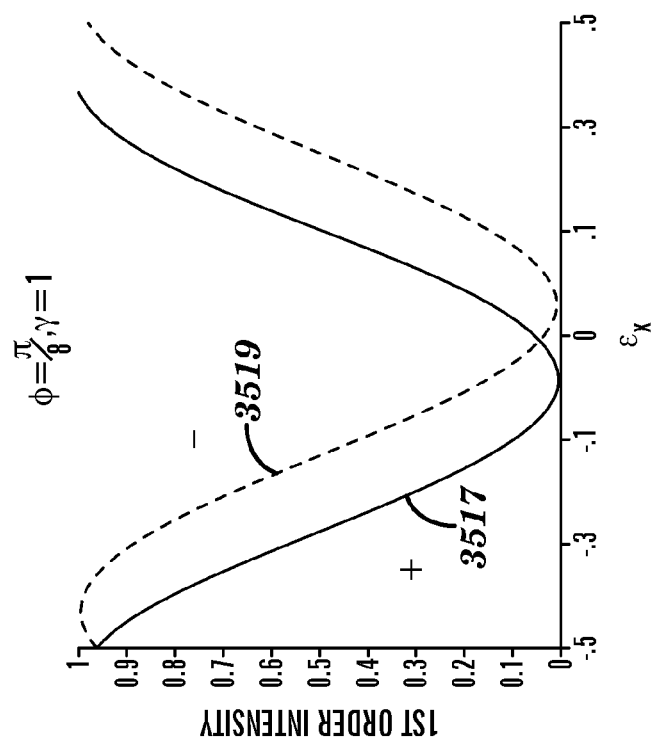
Figure 35B:
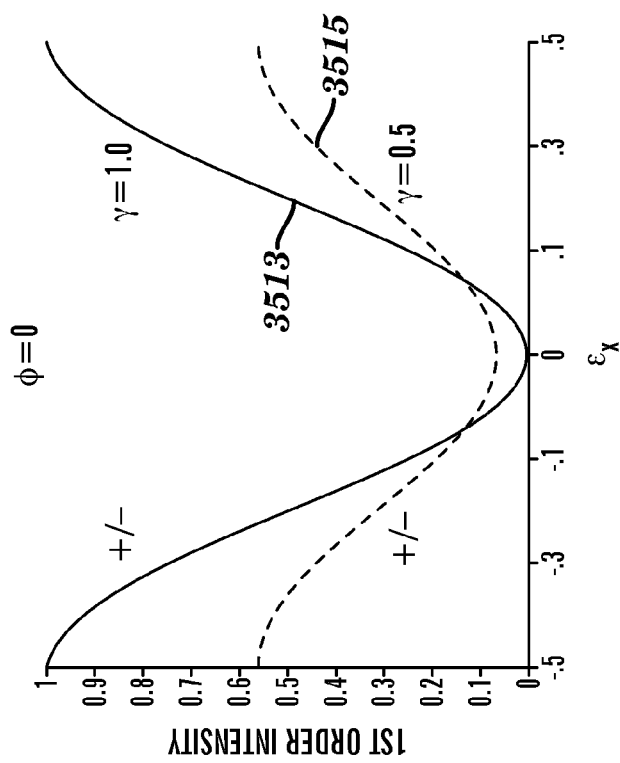

In the $\gamma=1$, $\phi=0$ case, the expression for intensity in Equation (29) becomes similar to Equation (7), and an approach to determining overlay error $\epsilon_x$ analogous to that used to determine CD above can be applied (see Equations 20a and 20b). However, the general case where $\gamma<1$, $\phi \neq 0$, likely to be encountered in product wafer overlay metrology, requires significant modification of this approach. Illustrated in FIG. 35B are plots 3513, 3515 of the normalized intensity $$\frac{I(D_x)}{4|K|^2} \text{ of the } n = \pm 1$$

diffracted orders as a function of the overlay error $\epsilon_x$ (recall that $$\epsilon_x = \frac{D_x}{P} - \frac{1}{2}$$

from Equation 25) at two values ($\gamma=1.0$ and $\gamma=0.5$, respectively) of the relative reflectivity magnitude $\gamma$ and relative phase difference of $\phi=0$ as given by Equation (29). Under these conditions, the normalized intensity for both $n=\pm 1$ diffracted orders are identical (i.e., each curve 3513, 3515 is a superposition of the positive and negative orders), with minima fixed for both orders at $\epsilon_x=0.5$, but the modulation, defined as $$\frac{I_{max} - I_{min}}{I_{max} + I_{min}},$$

decreases with decreasing γ. FIG. 35C shows plots 3517, 3519 of the normalized intensity of the n=+1 and n=−1 diffracted orders, respectively, at γ=1, φ=π/8. The n=+1, −1 intensity curves 3517, 3519 respectively, are now spatially separated such that their average is equivalent to the case of φ=0, γ=1 as curve 3513 shown in FIG. 35B, and the minima are offset in opposite directions relative to the nominal value of $D_x/P=1/2$, corresponding to $\epsilon_x=0$. Alternatively, the intensity curves 3517, 3519 for the n=±1 orders for the case of nonzero φ can be differenced, and that difference function will have a zero crossing at the location of zero overlay error. Note, however, from Equation (29) that this method becomes ineffective as φ approaches zero or any multiple of $$\frac{\pi}{2}.$$

For arbitrary values of φ, therefore, the overlay error is best determined by the average phase shift of the intensity variation in the positive and negative diffracted orders, as described in detail below.

Figure 36:
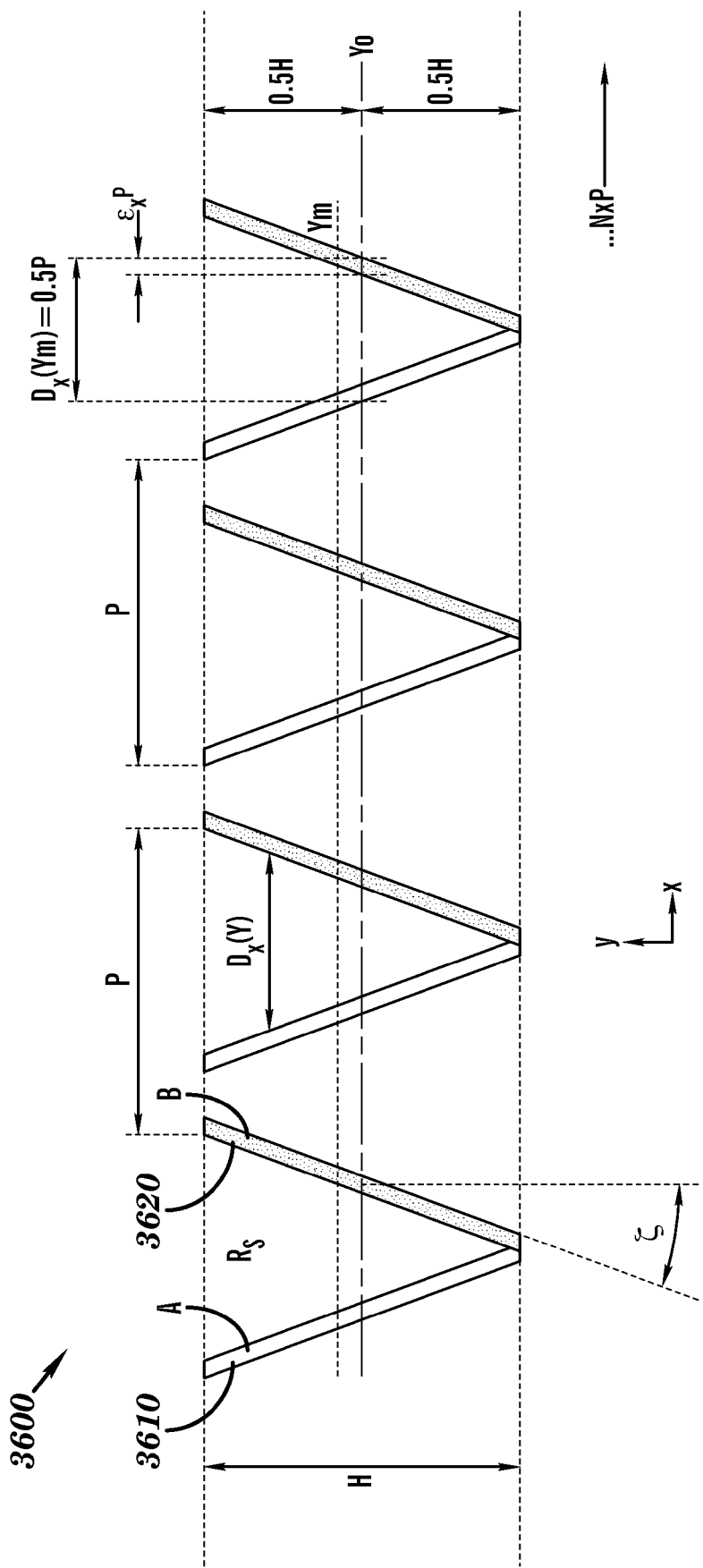
FIG. 36 is a two-level grating target consisting of oppositely tilted grating elements.

FIG. 36 illustrates one embodiment of a diffractometry target 3600 suitable for use with the diffractometry system 40 (see FIG. 34) in accordance with the present invention, useful for measuring overlay. The measurable overlay target 3600 includes a pair of elements 3610 and 3620, oppositely-tilted at an angle ζ, each repeated at period P (i.e., along the x-direction which is the direction of primary periodicity of the target pattern). The relative distance $D_x(y)$ between each pair of elements 3610 and 3620, varies linearly over the dimension H in the y-direction. The relative tilt of each element pair is designed so that $D_x(y)/P=0.5$ at y=H/2, which is hereafter referred to as $y_0$, along the y-direction. Thus, the designed distance is given by:

$$D_x(y) = (y - y_0)\tan\zeta + \frac{P}{2} \quad (31)$$

and the printed distance in the presence of an overlay error $\epsilon_x$ can be expressed as:

$$D_x(y) = (y - y_m)\tan\zeta + \frac{P}{2} = (y - y_0)\tan\zeta + \frac{P}{2} + P\epsilon_x \quad (32)$$

where $y_m$ is the shifted location of the position corresponding to $$D_x = \frac{P}{2}.$$

As in the case of the CD target the number of periods N making up the overlay target 3600 should be approximately 10 or greater.

Figure 37A:
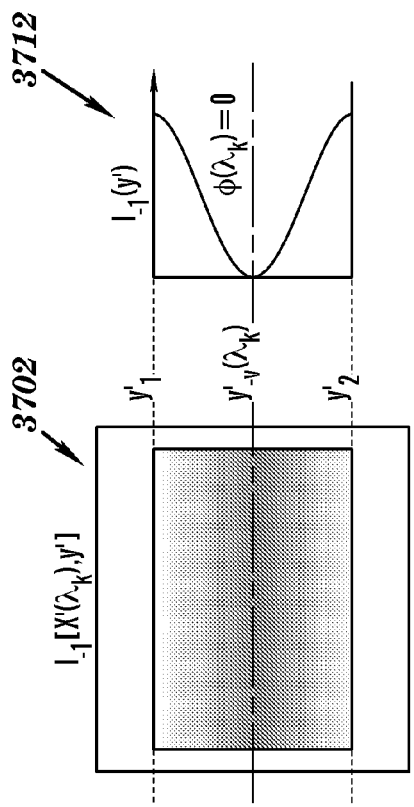
FIGS. 37A-37D illustrate representative monochromatic images of the positive and negative first order diffracted intensities of the two-level tilted grating target on the detector array of the inventive apparatus.
Figure 37B:
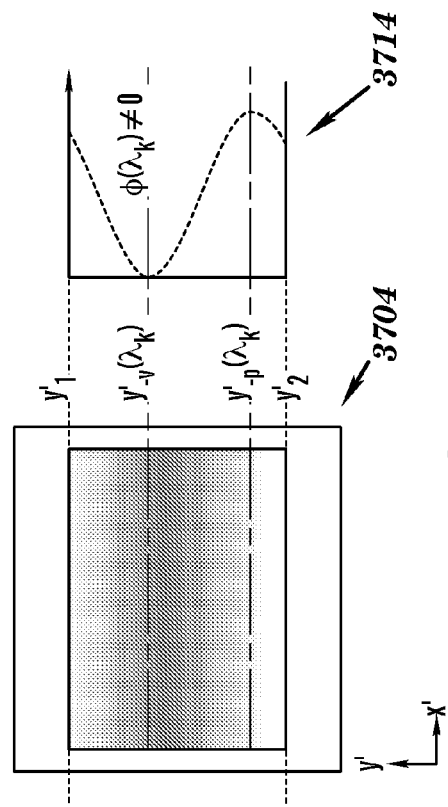
Figure 37C:
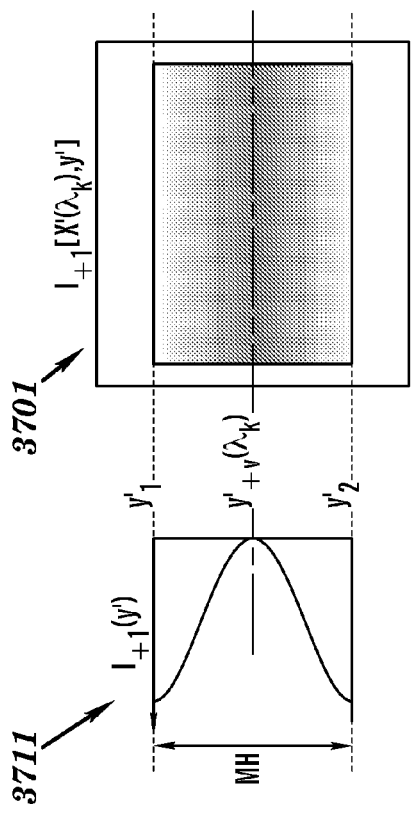
Figure 37D:
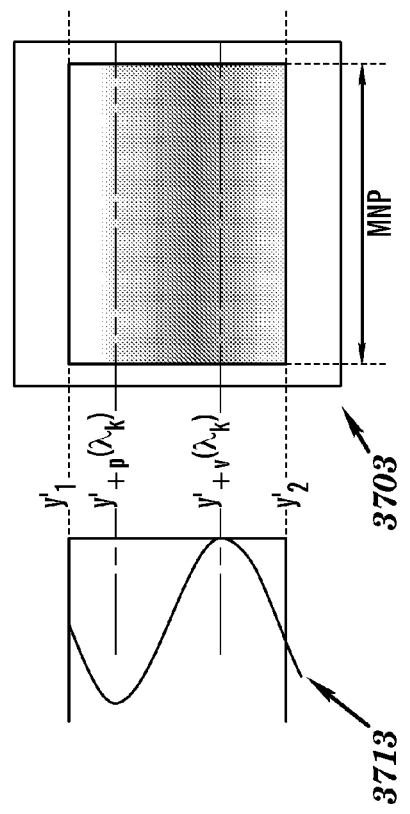

Assuming monochromatic illumination at wavelength $\lambda_k$, the image of the n=+1 first order diffraction for the grating overlay target 3600 of FIG. 36 is illustrated in FIGS. 37(A)-(D) using a diffractometry system 40 having y-direction magnification M, such that $H_I=MH$. FIGS. 37A and 37B illustrate the intensity 3701, 3702 of the +1 and −1 diffracted orders, respectively, plotted on a plan view of detector 460 due to illumination from orientations as illustrated in FIG. 34A and FIG. 34B, respectively, where the relative phase φ of B process pattern is zero. The corresponding intensities averaged (or summed) over the x'-direction are indicated in the plots 3711, 3712, respectively. For the case where φ≠0, the +1 and −1 diffracted order intensities 3703, 3704, are plotted on plan views of the detector 460 in FIGS. 37C and 37D, and the corresponding x'-direction averaged or summed intensities are shown in plots 3713, 3714, respectively. Since diffraction only occurs within the patterned area of the target, the detected intensity is zero outside the region $H_I \times L_f(\lambda_k)$. Within the $H_I \times L_f(\lambda_k)$ region of the detector 460 plane, extending from $y'_1$ to $y'_2$ as illustrated in plots 3711, 3712, 3713 and 3714, the intensity is uniform in the x'-direction, but varies according to Equation (29) and as illustrated in FIGS. 35B and 35C in the y'-direction. When φ=0 the n=±1 orders are identical and the minimum intensity occurs where $$D_x(y'_v) = \frac{P}{2};$$

consequently, a nonzero overlay error $\epsilon_x$ will cause a shift in the location of the minimum intensity of both positive and negative orders n=±1, in the same direction relative to the nominally designed location of the minimum at $$y'_0 = \frac{y'_1 - y'_2}{2}$$

(see plots 3711 and 3712 of FIGS. 37A and 37B) defined by the fixed $H_I$ perimeter. In general, the overlay error is expressed as:

$$\epsilon_x = \frac{\tan\zeta}{P}(y'_v - y'_0) \quad (33)$$

where, in the case of φ=0, $$y'_v \equiv \frac{y'_{-v} + y'_{+v}}{2} = y'_{-v} = y'_{+v}.$$

When φ≠0, however, the minima ($y'_{-v}$, $y'_{+v}$) and maxima ($y'_{-p}$, $y'_{+p}$) of the n=±1 orders shift symmetrically about the $$D_x(y') = \frac{P}{2}$$

location (see plots 3713 and 3714 of FIGS. 37C and 37D); consequently, the overlay error $\epsilon_x$ is only directly related to the minima and maxima locations averaged over the positive and negative diffracted orders.

$$\epsilon_x = \frac{\tan\zeta}{P}(y'_v - y'_0) = \frac{\tan\zeta}{P}(y'_p - y'_0) \quad (34)$$

where $$y'_v \equiv \frac{y'_{-v} + y'_{+v}}{2} \text{ and } y'_p \equiv \frac{y'_{-p} + y'_{+p}}{2}.$$

Figure 38C:
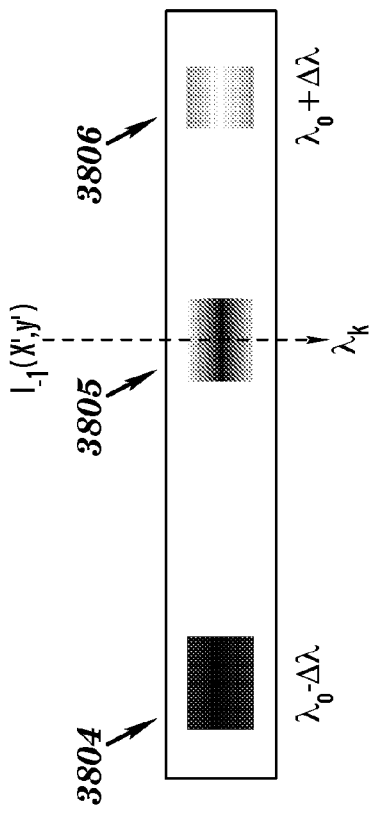
FIGS. 38A-38D illustrate representative multi-wavelength images of the positive and negative first order diffracted intensities of the two-level tilted grating target on the detector array of the inventive apparatus.
Figure 38D:
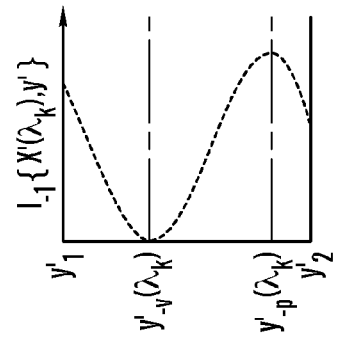
Figure 38A:
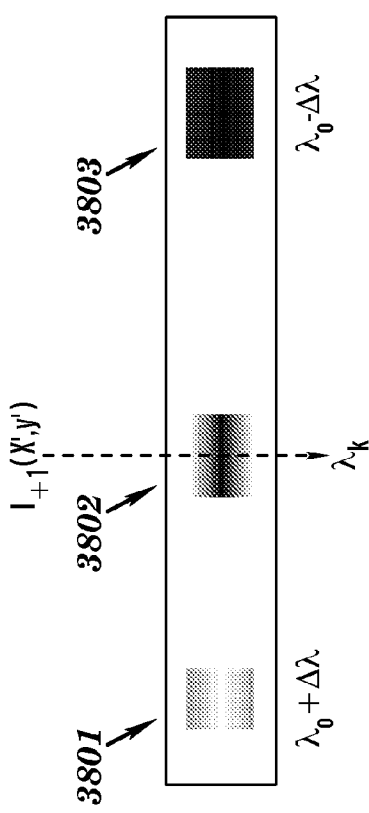
Figure 38B:
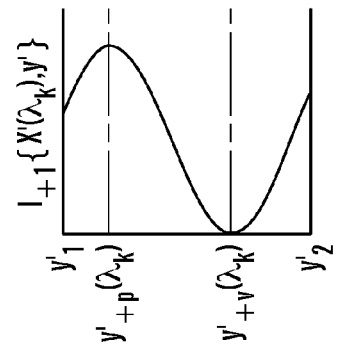

The most general approach to determining the overlay error using non-zero diffracted orders fits the variation of the diffracted intensities to the functional dependence of Equation (29). At a fixed wavelength $\lambda_k$ the unknown amplitudes $K_k$, $\gamma_k$, phase $\phi_k$ and overlay error $\epsilon_x$ may be determined by a curve fitting method, such as a least-squares fit, of the sum of the measured positive and negative diffracted order intensities to the known dependence in the direction perpendicular to the target period (the y'-direction) of Equation (29):

$$I_{+n}(y')+I_{-n}(y')-2|K_k|^2\{1+\gamma_k^2+\gamma_k[\cos\Phi_{+n}(y')+\cos\Phi_{-n}(y')]\}=\chi \quad (35a)$$

where:

$$\Phi_{+n}(y') = \frac{2\pi n D_x(y')}{P} + \phi_k \quad (35b)$$

$$\Phi_{-n}(y') = -\frac{2\pi n D_x(y')}{P} + \phi_k$$

$$D_x(y') = \frac{(y'-y'_m)}{M}\tan\zeta + \frac{P}{2}$$

$$= \frac{(y'-y'_0)}{M}\tan\zeta + P\left(\frac{1}{2}+\epsilon_x\right)$$

and $\chi^2$ is the residual to be minimized using K, $\gamma$, $\phi$ and $\epsilon_x$ as free parameters. FIG. 38A illustrates plan view plots of positive first-order intensities 3801, 3802, 3803 for multi-wavelength illumination for wavelengths $\lambda_0+\Delta\lambda$, $\lambda_k$, $\lambda_0-\Delta\lambda$, respectively, on the plane of the detector 460. A least-squares fit of the measurements of the y'-dependence of the diffracted intensity in the positive orders can be performed at each location x'($\lambda_k$) on the detector array 460, as illustrated in FIG. 38B. The corresponding negative first-order intensities 3806, 3805, 3804 are illustrated in plan view on the detector array 460, and FIG. 38D illustrates a least-squares fit for the negative order. A similar analysis can be performed for broadband illumination. While the overlay error is independent of wavelength, the use of multi-wavelength or broadband illumination enables the collective use of only those wavelengths for which $\gamma_k > \gamma_{threshold}$ is greater than a predetermined threshold close to unity, to ensure measurement precision. Allowed values of $\gamma_{threshold}$ will be dependent on the relative widths of the target elements and their reflectivities in the illumination wavelength range, as dictated by Equation (30b). The measured overlay error is the average of the wavelength-specific overlay errors $\epsilon_x(\lambda_k)$ determined at the different detector locations x'($\lambda_k$). The standard deviation of the wavelength-specific overlay errors can be computed, which provides an in situ monitor of measurement precision.

Figure 39:
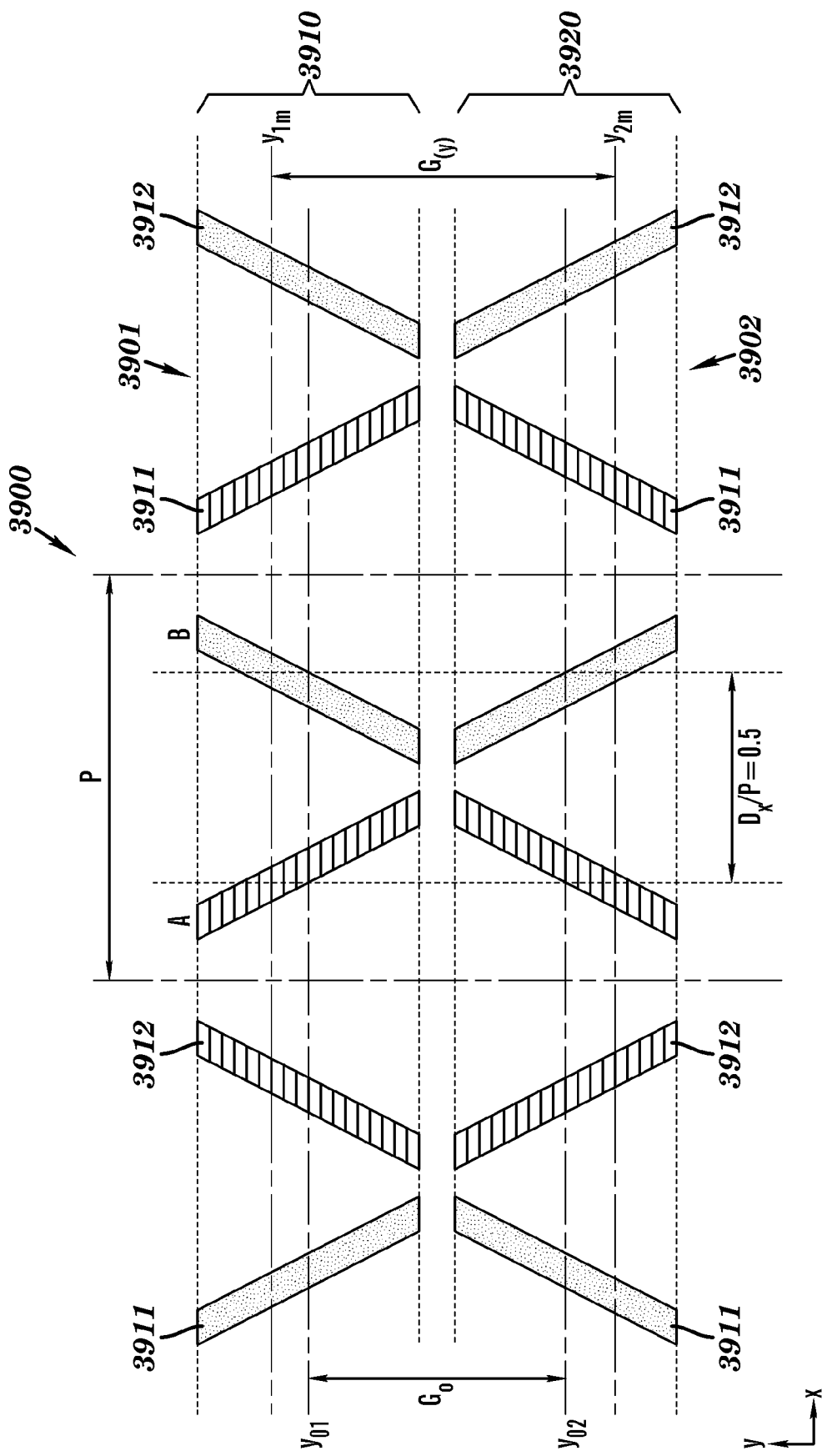
FIG. 39 illustrates a two-level "hourglass" target comprised of a pair of oppositely tilted grating targets.

As in the case of CD measurement, another embodiment of an overlay target 3900, printed on the wafer, according to the invention, is designed to comprise "hourglass" or "barrel" target elements 3901, 3902, consisting of two counter-tilted sections 3911 for an A lithographic process, and 3912 corresponding to B process conditions, organized in two subregions 3910, 3920 separated by a nominal pitch $G_0$ as shown in FIG. 39, overlain on the printed target 3900. The use of the two subregions 3910, 3920 doubles the measurement sensitivity while the predetermined pitch eliminates the need to determine the center location y'$_{01}$, y'$_{02}$ on the detector 460 (corresponding to the locations $y_{1m}$, $y_{2m}$ in the plane of the target 3900 indicated in FIG. 39) of the elements 3911, 3912, respectively. The least-squares fit of Equation (35a) determines the distance between the shifted positions corresponding to $$D_x = \frac{P}{2};$$

namely $$G = \frac{y'_{1m} - y'_{2m}}{M}.$$

That measured distance relative to the known period $G_0$ then determines the overlay error:

$$\epsilon_x = \frac{(G_0-G)\tan\zeta}{2P}. \quad (36)$$

Figure 40:
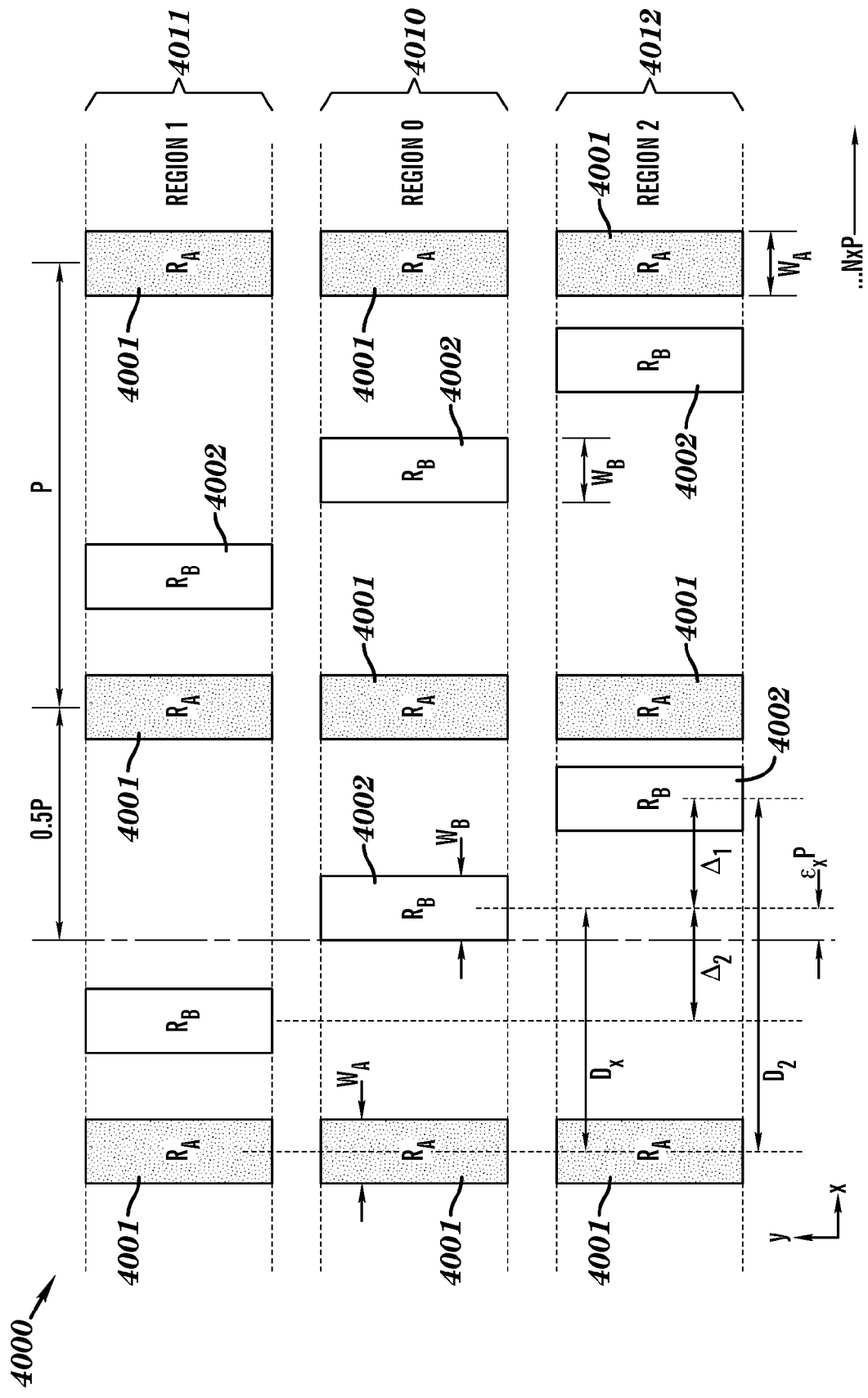
FIG. 40 illustrates a two-level grating target divided into three regions in which the grating elements at B process level have different positions relative to the grating elements at an A process level.
Figure 41B:
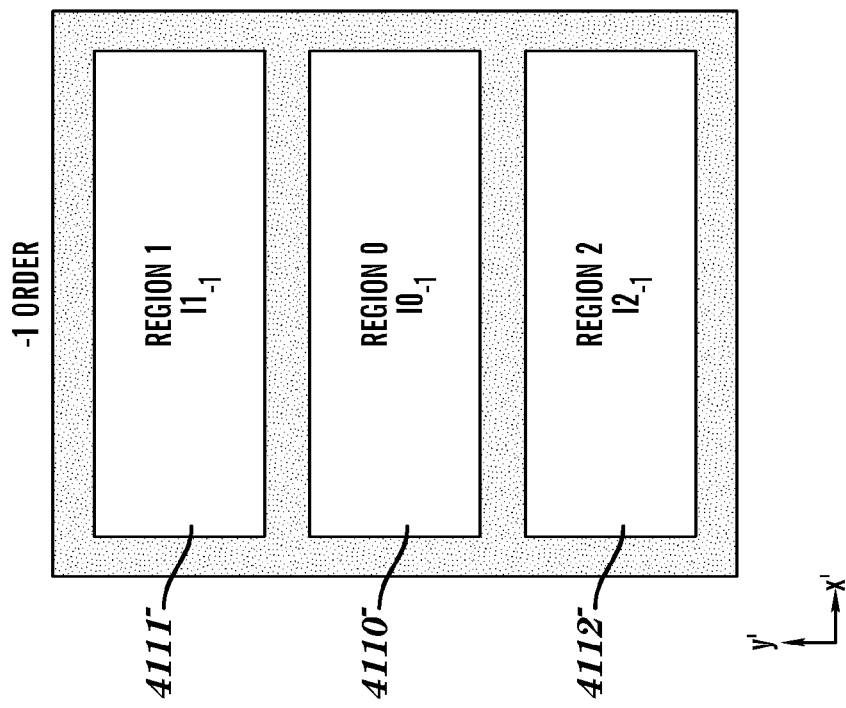
FIGS. 41A-41B illustrates the image of the positive and negative first order diffracted intensities of the three grating regions corresponding to the target of FIG. 40.
Figure 41A:
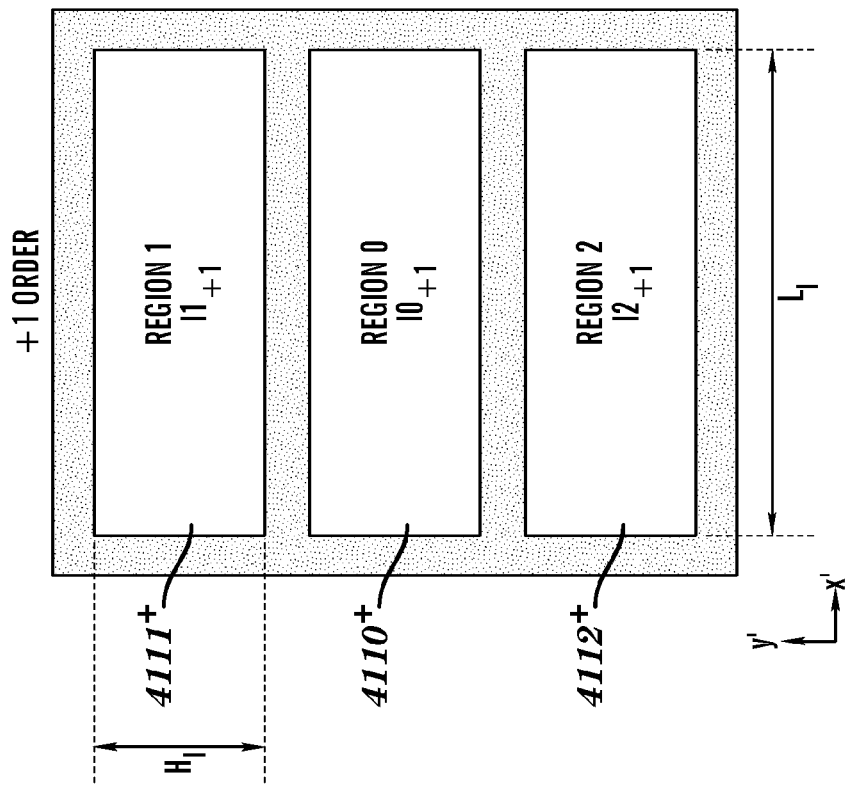

The discrete differential grating target 4000 shown in FIG. 40 provides an alternative means of overlay measurement based on the same inventive differential diffractometry principal. The grating 4000 is divided into three or more subregions, e.g., Region 0 (4010), Region 1 (4011), Region 2 (4012), where within each subregion elements 4001 of the A process having width $W_A$, spaced at pitch P, have the same location along the x-direction (the direction of primary periodicity), but the B process elements 4002 having width $W_B$, which also are spaced at pitch P, but are located at nominally differing placements relative to the A elements 4001 in different subregions. The elements of each subregion have a nominal length H in the y-direction. In one of the subregions, designated as Region 0 (4010) the B elements 4002 have a nominal fixed offset $D_x$=0.5P relative to the A elements. In adjacent subregions (e.g. Region 1 (4011), Region 2 (4012)), the B elements 4001 have relative offsets $D_1$, $D_2$, respectively, where $D_1=D_x-\Delta_2$, $D_2=D_x+\Delta_1$, where, preferably, $\Delta_1=\Delta_2$. Each subregion is imaged separately on the detector array 460 of the diffractometry system 40 having magnification M, in the positive x-direction as in FIG. 34A to capture the positive first order, and then in the negative x-direction as in FIG. 34B to capture the negative first order. The detected images on the detector array 460 are illustrated in FIGS. 41A and 41B for the case of monochromatic illumination where the intensity in each region is roughly constant. The n=+1 (positive) images are illustrated in FIG. 41A for Region 1 (4111$^+$), Region 0 (4110$^+$) and Region 2 (4112$^+$), and the n=−1 (negative) order images for Region 1 (4111$^-$), Region 0 (4110$^-$) and Region 2 (4112$^-$) are illustrated in FIG. 41B. As discussed above, the size of the image for each region is $H_I \times L_I$, where $H_I$=MH and $L_I$=MHP. The positive and negative images are preferably imaged sequentially by switching the direction of the illumination after all regions of the differential target 4000 for a given order are imaged. Each image may be stored for subsequent analysis. Many variations on the imaging sequence are possible, including, but not limited to, imaging multiple targets printed in different orientations that are simultaneously illuminated from multiple directions parallel to the target periods, or by sequentially repositioning the wafer in order to obtain alternative imaging orientations. For each diffracted order, the configuration of the separate target regions (e.g. 4011, 4010, 4012) are imaged on corresponding regions of the detector array 460 (e.g. image intensities $I0_{+1}$, $I1_{+1}$, $I2_{+2}$ in regions 4110⁺, 4111⁺, 4112⁺ respectively for the +1 order, and image intensities $I0_{-1}$, $I1_{-1}$, $I2_{-1}$ in regions 4110⁻, 4111⁻, 4112⁻ respectively for the −1 order).

Figure 42B:
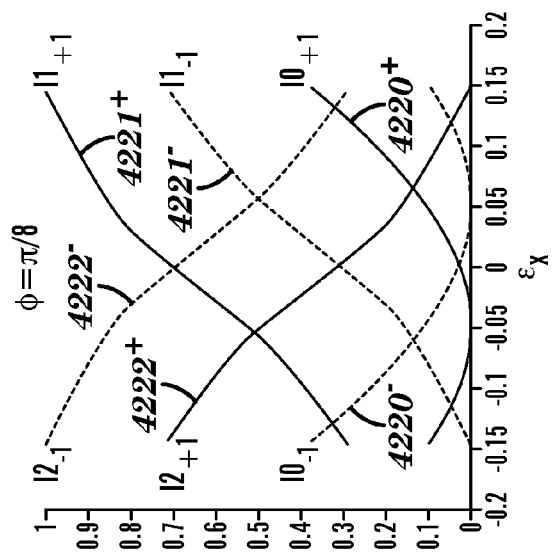
FIGS. 42A-42C plot the positive and negative first order diffracted intensities of the three regions as a function of the overlay error under various relative reflectivity phase conditions between the two levels when $$\Delta = \frac{P}{4}.$$
Figure 42C:
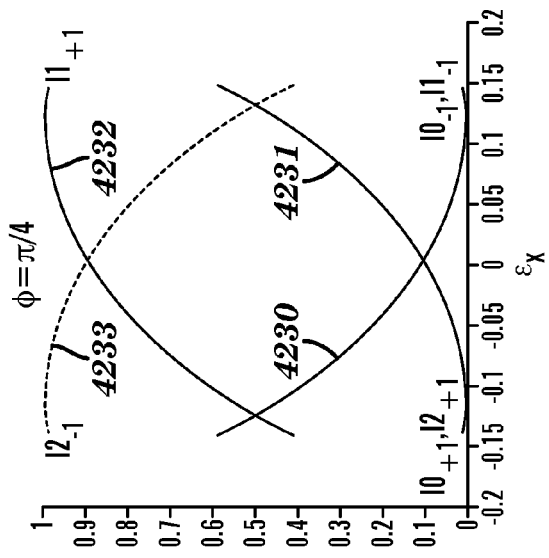
Figure 42A:
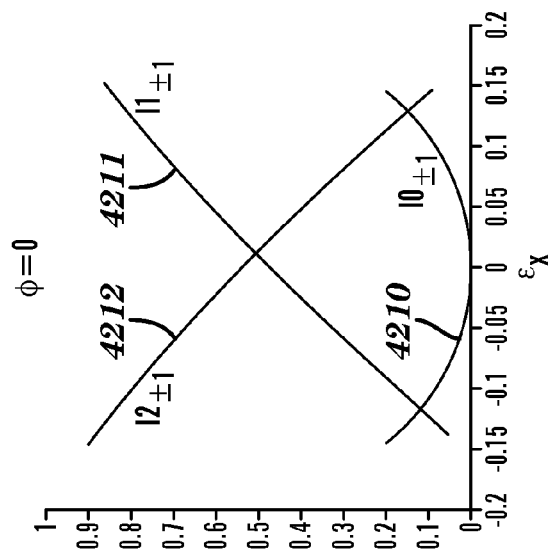

From Equation (29) the response of the six intensities $I0_{+1}$, $I1_{+1}$, $I2_{+1}$, $I0_{-1}$, $I1_{-1}$, $I2_{-1}$ to overlay error $\epsilon_x$ along the direction of primary periodicity, e.g. the x-direction, is plotted in FIGS. 42A-42C for the case of the overlay target 4000 in FIG. 40, for three representative values of the relative phase $\phi$ (i.e. $\phi=0$, $\pi/8$, and $\pi/4$, respectively) at $\gamma=1$. The intensity is plotted only over the allowed dynamic range, which is the range of overlay error $\epsilon_x$ over which the separate A and B process patterns of the overlay target 4000 of FIG. 40 do not overlap. For example, in the case of the target 4000 in FIG. 40, the dynamic range is approximately $$\left(\frac{P}{4}+\frac{W_A+W_B}{2}<\varepsilon_x<\frac{3P}{4}-\frac{W_A+W_B}{2}\right),$$

within which the response of relative intensities to changes in overlay error will be linear. Outside of the allowable dynamic range, the response of intensity to overlay error is likely to be non-linear. The target element widths $W_A$, $W_B$ are preferably chosen to be sufficiently large so that proximity effects will not be significant, and so that the printed widths are essentially as designed. Preferably, $W_A$, $W_B$ are nominally equal, and chosen to be a fixed fraction of the period, preferably $W_A$ and $W_B$ are about 0.2P. The response to overlay error $\epsilon_x$ for the six intensities (i.e., the +1 and −1 diffracted orders for the three overlay target subregions 4010, 4011, 4012) each varies uniquely as a function of the normalized relative phase $\phi$. It is possible to classify the response curves of the six intensities according to the printed target's relative phase regime. For example, FIG. 42A illustrates the intensity responses for $\phi=0$. Here, for each target subregion 4010, 4011, 4012, the positive and negative diffracted orders are superimposed on each other, as illustrated by intensity curves 4210, 4211, 4212, respectively. However, when $\phi=\pi/8$, each of the six intensity response curves, $I0_{+1}$, $I1_{+1}$, $I2_{+1}$, $I0_{-1}$, $I1_{-1}$, $I2_{-1}$, 4220⁺, 4220⁻, 4221⁺, 4221⁻, 4222⁺, 4222⁻, respectively, are different as illustrated in FIG. 42B. On the other hand, in the case of $\phi=\pi/4$, the $I1_{+1}$ (4232) and $I2_{+1}$ (4233) responses are each distinct, but the $I0_{-1}$, $I1_{-1}$ and $I0_{+1}$, $I2_{-1}$ are superimposed in curves 4230 and 4231, respectively, as illustrated in FIG. 42C. Accordingly, the present invention uses the relative responses of the intensities in order to extract relative phase $\phi$ and relative magnitude $\gamma$, as described in more detail below.

The ratio of the intensities detected at a single wavelength are described by the sets of equations:

$$r_1^+ \equiv \frac{I1_{+1}}{I0_{+1}} = \frac{1+\rho\cos(\psi^++\delta)}{1+\cos\psi^+} \tag{37a}$$

$$r_2^+ \equiv \frac{I2_{+1}}{I0_{+1}} = \frac{1+\rho\cos(\psi^+-\delta)}{1+\cos(\psi^+)} \tag{37b}$$

$$r_1^- \equiv \frac{I1_{-1}}{I0_{-1}} = \frac{1+\rho\cos(\psi^-+\delta)}{1+\cos\psi^-} \tag{37c}$$

$$r_2^- \equiv \frac{I2_{-1}}{I0_{-1}} = \frac{1+\rho\cos(\psi^--\delta)}{1+\cos\psi^-} \tag{37d}$$

where we have defined the parameters:

$$\delta \equiv \frac{2\pi\Delta}{P} \tag{37e}$$

$$\rho \equiv \frac{2\gamma}{1+\gamma^2}$$

$$\psi^+ \equiv \frac{2\pi D_x}{P}+\phi$$

$$\psi^- \equiv \frac{2\pi D_x}{P}-\phi.$$

Rearranging Equations 37a-37e, the general solutions for the three unknowns $\psi^+$, $\psi^-$ and $\rho$ are derived:

$$\psi^+ = \arccos\left(\frac{T^+}{\rho}\right) \tag{38a}$$

$$\psi^- = \arccos\left(\frac{T^-}{\rho}\right) \tag{38b}$$

$$\rho = \sqrt{(T^\pm)^2+\frac{[C^\pm(1+\alpha T^\pm)]^2}{(1-\alpha^2)}} \tag{38c}$$

where:

$$a \equiv \cos\delta \tag{38d}$$

$$\kappa^\pm \equiv \frac{(r_2^\pm+r_1^\pm)}{2}$$

$$\eta^\pm \equiv \frac{(r_2^\pm-r_1^\pm)}{2}$$

$$T^\pm \equiv \frac{1-\kappa^\pm}{\kappa^\pm-\alpha}$$

$$C^\pm \equiv \frac{\eta^\pm}{\kappa^\pm}.$$

Of particular interest to differential overlay metrology is the case where preferably $$\Delta = \frac{P}{4},$$

so that $\alpha=0$ and Equations (38a)-(38c) simplify to:

$$\psi^+ = \arccos\left(\frac{T^+}{\rho}\right) \tag{39a}$$

$$\psi^- = \arccos\left(\frac{T^-}{\rho}\right) \tag{39b}$$

$$\rho = \sqrt{(T^\pm)^2+(C^\pm)^2} \tag{39c}$$

where:

$$T^\pm \equiv \frac{1}{\kappa^\pm}-1 \tag{39d}$$

For the sake of brevity, we will restrict our attention to the $\Delta=P/4$ case, but a similar analysis may be easily applied to cases of other values of $\Delta$.

Equations (25) and (37)-(39d) can now be solved for the unknowns overlay error $\epsilon_x$, relative magnitude y, and relative phase $\phi$ in terms of the measurable intensities ($I0_{+1}$, $I1_{+1}$, $I2_{+1}$):

$$\epsilon_x = \frac{1}{4\pi}(\psi^+ + \psi^-) - \frac{1}{2} \tag{40}$$

$$\phi = (\psi^+ - \psi^-) \tag{41}$$

$$\gamma = 1 \pm \sqrt{1-\rho^2} \tag{42}$$

The arccosine functions in the definitions of $\psi^+$, $\psi^-$ in Equations (38a) and (38b) introduce an ambiguity in the solutions, which can be resolved by constraining the solutions in accordance with the physical characteristics of overlay error and relative phase. The application of Equations (39a)-(39d), which are expressed in terms of measured intensity ratios, to determining the correct (i.e., physically meaningful) overlay error $\epsilon_x$ and phase $\phi$ requires that transformations are applied to ($\psi^+$, $\psi^-$) that are consistent with the different possible phase regimes within ($-\pi < \phi \leq \pi$) when $$\Delta = \frac{P}{4}.$$

This is accomplished by constraining $\phi$ of Equation (41) to be constant, since the relative phase should not change as a function of overlay error. In addition, the overlay error $\epsilon_x$ of Equation (40) is preferably constrained to be linear with a slope of one over the allowed dynamic range, that is, variations in printed $D_x$ preferably result in a fixed, proportional change in the value of $\epsilon_x$.

Figure 43:
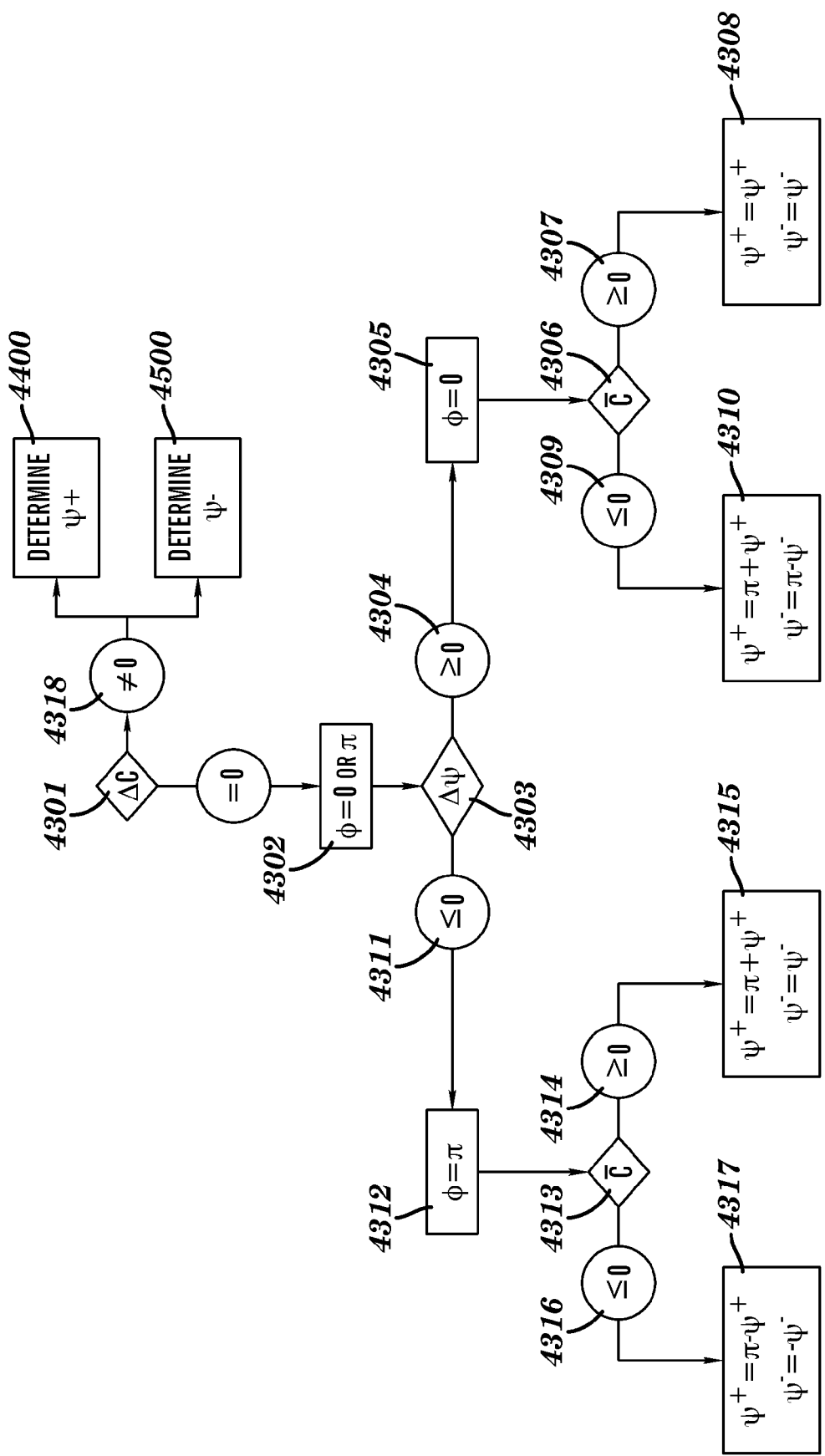
FIG. 43 is the flowchart that determines the transformations of $\psi$ in the case when $\phi=(0, \pi)$ and the $n=\pm 1$ orders are identical.
Figure 44:
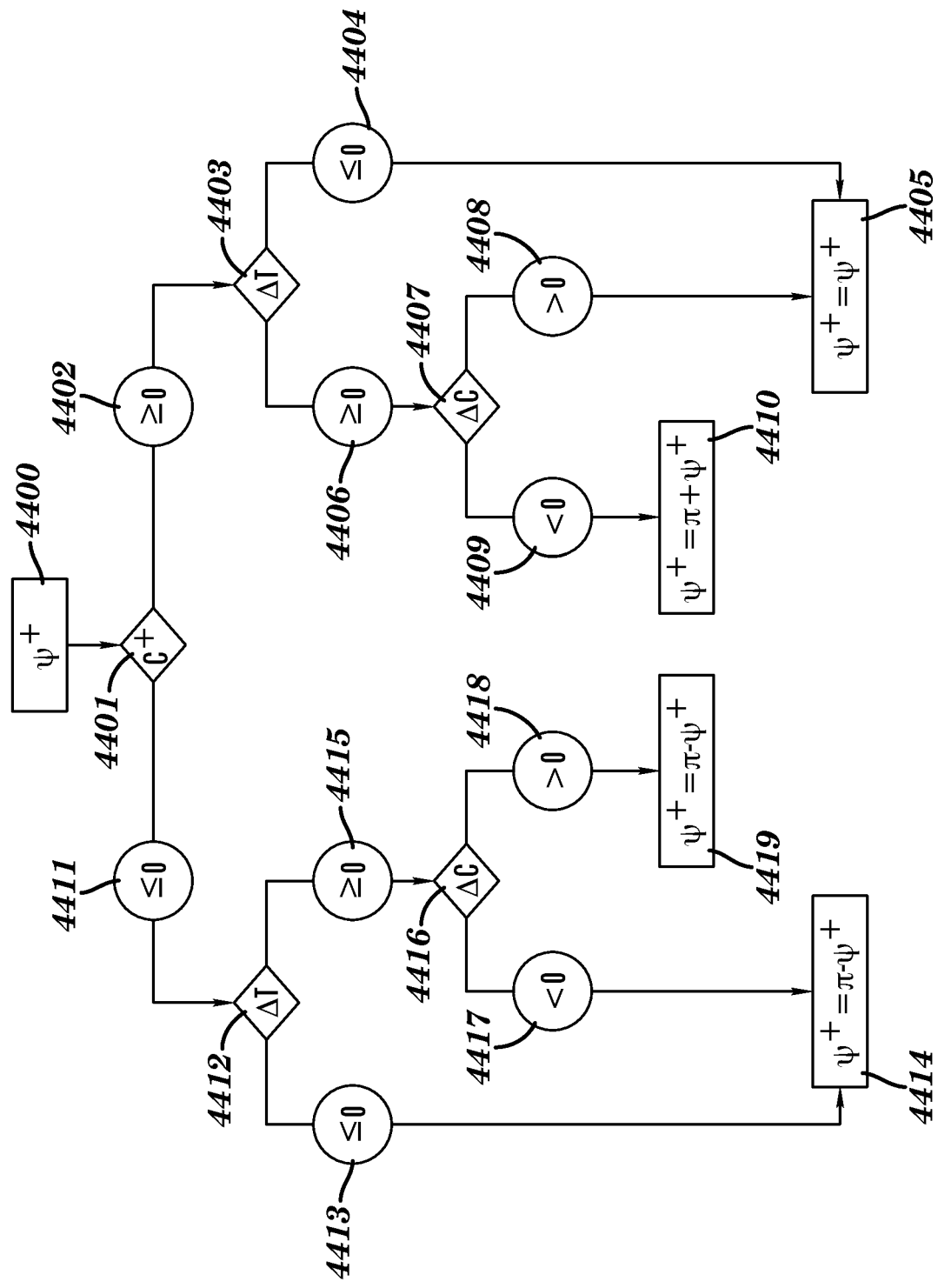
FIG. 44 is the flowchart that determines the transformation of the positive diffracted order $\psi^+$ in the case when $\Delta C \neq 0$.
Figure 45:
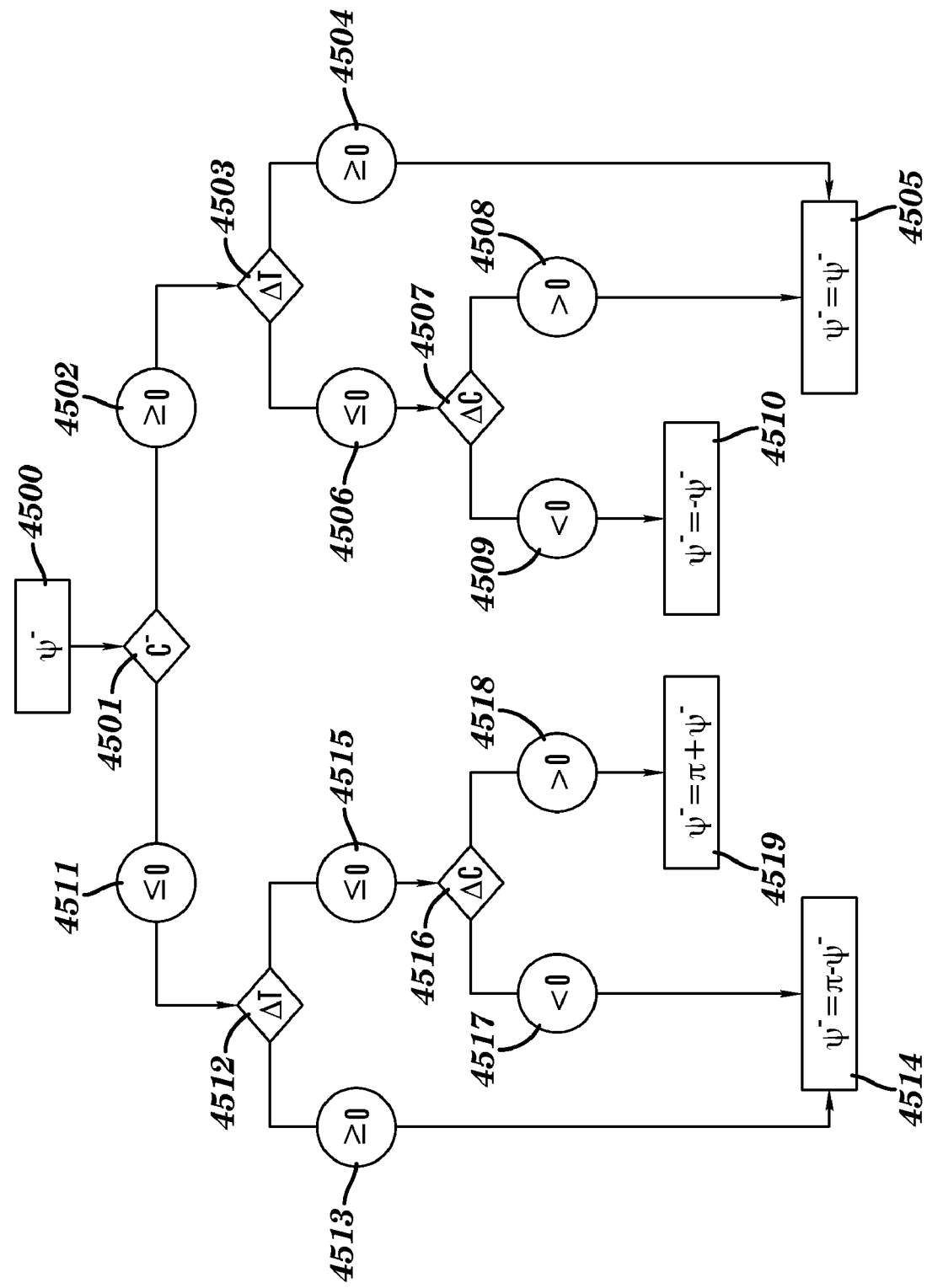
FIG. 45 is the flowchart that determines the transformation of the negative diffracted order $\psi^-$ in the case when $\Delta C \neq 0$.

The necessary transformations to ($\psi^+$, $\psi^-$) are shown in the flowcharts of FIGS. 43-45 where we have defined the parameters:

$$\Delta C \equiv C^+ - C^- \tag{43}$$

$$\Delta \psi \equiv \psi^+ + \psi^- - \pi$$

$$\Delta T \equiv T^+ - T^-$$

$$\overline{C} = \frac{C^+ + C^-}{2}$$

The flowcharts illustrated in FIGS. 43-45 describe logical trees in which the various parameters of Equations 43, all of which are derived from measured intensities, are tested and compared to zero to determine whether the values of $\psi^+$ and $\psi^-$ should be adjusted (or transformed).

Referring to FIG. 43, first the parameter $\Delta C$ is tested (Block 4301). If $\Delta C=0$, this leads to the first "degenerate" case when $\phi=0$ or $\pi$ (Block 4302), and the two diffracted $n=\pm 1$ orders are identical. Next, the sign of the parameter $\Delta\psi$ is tested (Block 4303). If $\Delta\psi \geq 0$ (Block 4304), then the relative phase $\phi$ is set equal to 0 (Block 4305), and the sign of the parameter $\overline{C}$ is tested (Block 4306). If $\overline{C} \geq 0$ (Block 4307), then no transformation of $\psi^+$ or $\psi^-$ is required (Block 4308). If $\overline{C}<0$ (Block 4309), then $\psi^+$ is transformed to $\pi+\psi^+$ and $\psi^-$ is transformed to $\pi-\psi^-$ as in Block 4310. If $\Delta\psi<0$ (Block 4311), the $\phi$ is set equal to $\pi$ (Block 4312), and $\overline{C}$ is tested (Block 4313). If $\overline{C} \geq 0$ (Block 4314), then $\psi^+$ is transformed to $\pi+\psi^+$, and no transformation of $\psi^-$ is performed (Block 4315). If $\overline{C}<0$ (Block 4316), then the sign of $\psi^-$ is reversed, and $\psi^+$ is transformed to $\pi-\psi^+$ (Block 4317). For the cases where $\Delta C \neq 0$ (Block 4318), a branch (Block 4400) is taken to determine $\psi^+$ as shown in FIG. 44 and in addition, a branch (Block 4500) to determine $\psi^-$ as shown in FIG. 45.

Figure 46A:
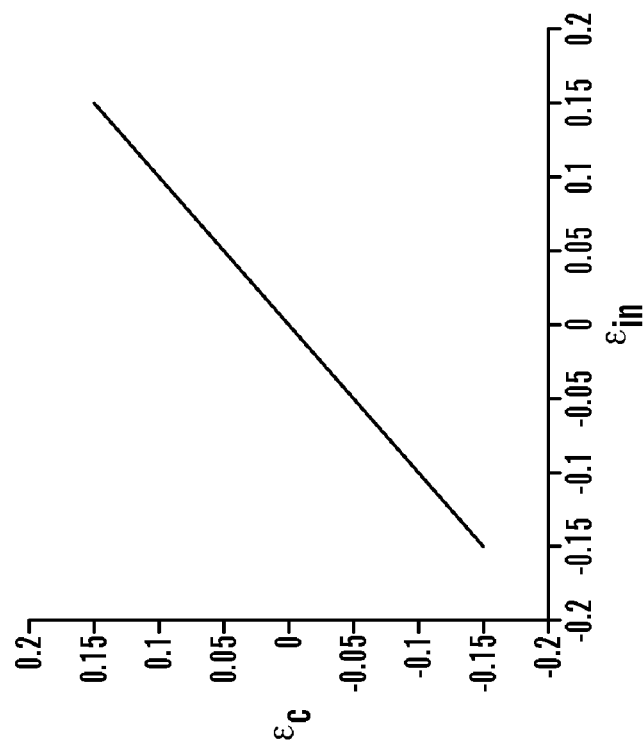
FIG. 46A plots the calculated overlay response $\epsilon_c$ to any input value of overlay error $\epsilon_{in}$ for all allowed values of $\gamma$ and $\phi$ to show that $\epsilon_c = \epsilon_{in}$ over the allowed dynamic range.

Referring to FIG. 44, for the $\psi^+$ branch (Block 4400) when $\Delta C \neq 0$, first the sign of $C^+$ is tested (Block 4401). If $C^+ \geq 0$ (Block 4402), then $\Delta T$ is tested (Block 4403). If $\Delta T<0$ (Block 4404), then no transformation of $\psi^+$ is required (Block 4405). If $\Delta T \geq 0$ (Block 4406), then $\Delta C$ is tested (Block 4407). If $\Delta C>0$ (Block 4408), then no transformation of $\psi^+$ is required (Block 4405). If $\Delta C<0$ (Block 4409), then $\psi^+$ is transformed to $\pi+\psi^+$ (Block 4410). Similarly, if $C^+<0$ (Block 4411), then the signs of $\Delta T$ (Block 4412) and $\Delta C$ (Block 4416) are sequentially tested to determine the appropriate transformation of $\psi^+$ (Block 4414 or Block 4419). Likewise, to determine the appropriate transformation for $\psi^-$ for the case when $\Delta C \neq 0$ (in Blocks 4505, 4510, 4514 and 4519), the logic illustrated in FIG. 45 is followed, beginning with Block 4500. Having transformed $\psi^+$ and $\psi^-$ by this logic, Equations (39a)-(39d) enable determination of the exact values of $\epsilon_x$ and $\phi$ from the measurement of the six $n=\pm 1$ order intensities $I0_{+1}$, $I1_{+1}$, $I2_{+1}$, $I0_{-1}$, $I1_{-1}$, $I2_{-1}$ (as in FIG. 41) detected from an inventive overlay target, such as 4000 of FIG. 40. The resulting response $\epsilon_c$ calculated from Equation (40), after transforming $\psi^+$, $\psi^-$, to any input value of overlay error $\epsilon_{in}$ is linear, with unity slope and zero intercept, regardless of the values of $\gamma$ and $\phi$ within the allowed dynamic range for the case of $\Delta=P/4$, as shown in FIG. 46A. To generate this plot, values of $0.1 \leq \gamma \leq 1$ were chosen in increments of 0.1, and $-\pi \leq \phi \leq \pi$ at increments of $\pi/100$. As in the case of the continuously varying target of FIG. 36, the use of multi-wavelength or broadband illumination enables sampling the intensities at different locations $x(\lambda_k)$ to maximize $\gamma$.

The sensitivity of overlay error $\epsilon_x$ to measured changes in the difference $\eta$ and sum $\kappa$ of the relative intensity ratios defined in Equation (38d) is given by:

$$\Delta\epsilon_x = \frac{\partial \epsilon_x}{\partial \eta}\Delta\eta + \frac{\partial \epsilon_x}{\partial \kappa}\Delta\kappa \tag{44}$$

From Equations (39) we obtain:

$$\frac{\partial \epsilon_x}{\partial \eta} = \frac{1}{4\pi}\left(\frac{\partial \psi^+}{\partial \eta^+} + \frac{\partial \psi^-}{\partial \eta^-}\right) \tag{45a}$$

$$\frac{\partial \epsilon_x}{\partial \kappa} = \frac{1}{4\pi}\left(\frac{\partial \psi^+}{\partial \kappa^+} + \frac{\partial \psi^-}{\partial \kappa^-}\right) \tag{45b}$$

Substitution in Equations (38a)-(38d) gives:

$$\frac{\partial \psi^\pm}{\partial \eta^\pm} = \frac{T^\pm \eta^\pm}{\rho^3 (\kappa^\pm)^2 \sqrt{1-\left(\frac{T^\pm}{\rho}\right)^2}} \tag{46a}$$

$$\frac{\partial \psi^\pm}{\partial \kappa^\pm} = \frac{1}{\rho \kappa^\pm \sqrt{1-\left(\frac{T^\pm}{\rho}\right)^2}}\left\{\frac{1}{\kappa^\pm} + \frac{T^\pm}{\rho^2}\left[\frac{1}{\kappa^\pm}\left(\frac{1}{\kappa^\pm}-1\right)+\left(\frac{\eta^\pm}{\kappa^\pm}\right)^2\right]\right\} \tag{46b}$$

where the values of $\psi^+$, $\psi^-$ in computing Equation (44) must be subjected to the same transformations as Equations (39a)-(39d).

Figure 46B:
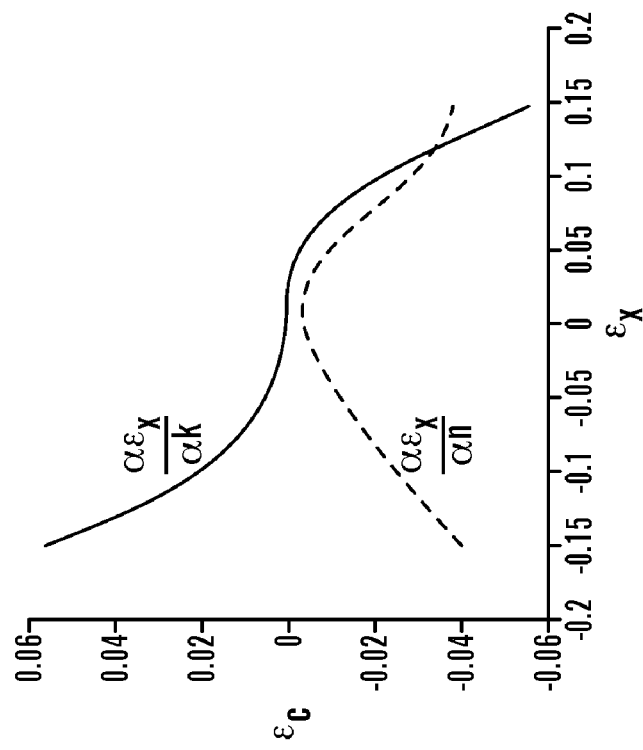
FIG. 46B plots the sensitivity of overlay error $\epsilon_x$ to changes in the measurable components $\kappa$, $\eta$ of the calculated $\epsilon_c$.

As shown in FIG. 46B for the case $\gamma=0.8$ and $\phi=0$, a desirable characteristic of the inventive differential overlay metrology is that $$\frac{\partial \varepsilon_x}{\partial \kappa}$$

crosses zero at $\varepsilon_x=0$. This guarantees that the inventive target design and measurement technique will have high sensitivity to overlay error in the vicinity of $\varepsilon_x=0$. The dependence of $$\frac{\partial \varepsilon_x}{\partial \kappa} \text{ on } \varepsilon_x$$

is a function of the relative amplitude $\gamma$ and phase $\phi$ of the two pattern levels A and B that define the overlay target. Since $$\left(\frac{\partial \varepsilon_x}{\partial \eta}\right)$$

doesn't cross zero, it will not contribute as strongly as $$\frac{\partial \varepsilon_x}{\partial \kappa}$$

to sensitivity.

Figure 47B:
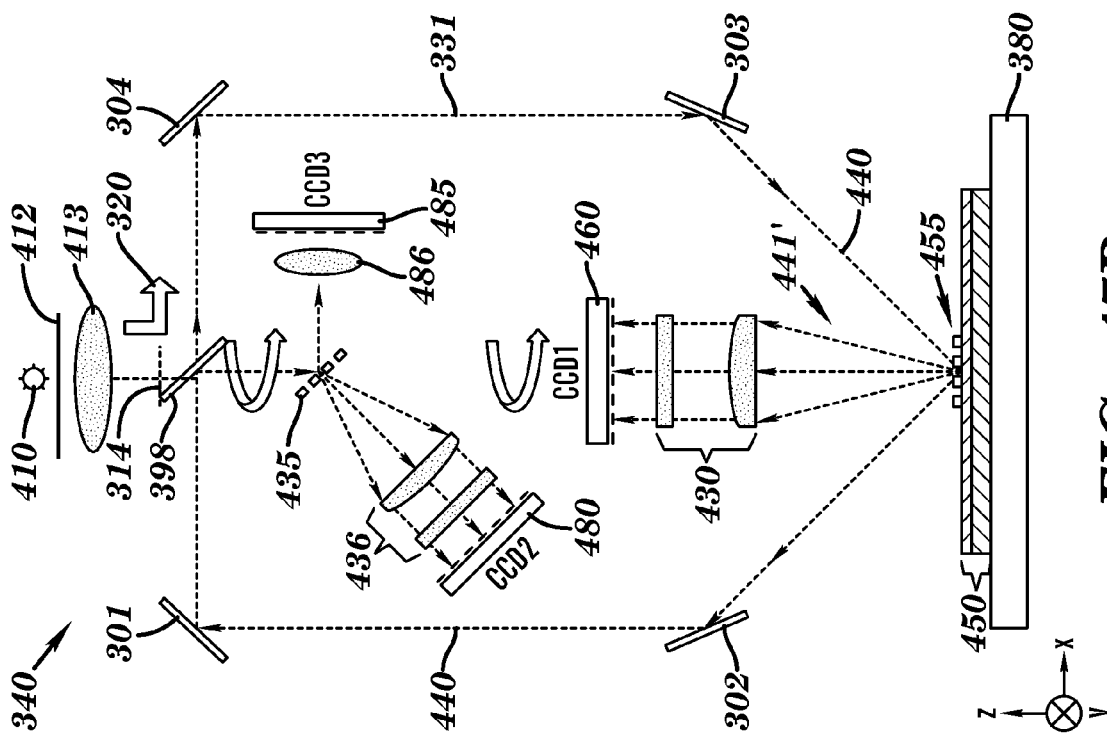
FIGS. 47A-47B illustrate an apparatus enabling rapid sequential measurement of positive and negative first order diffraction intensity using a common source and detector.
Figure 47A:
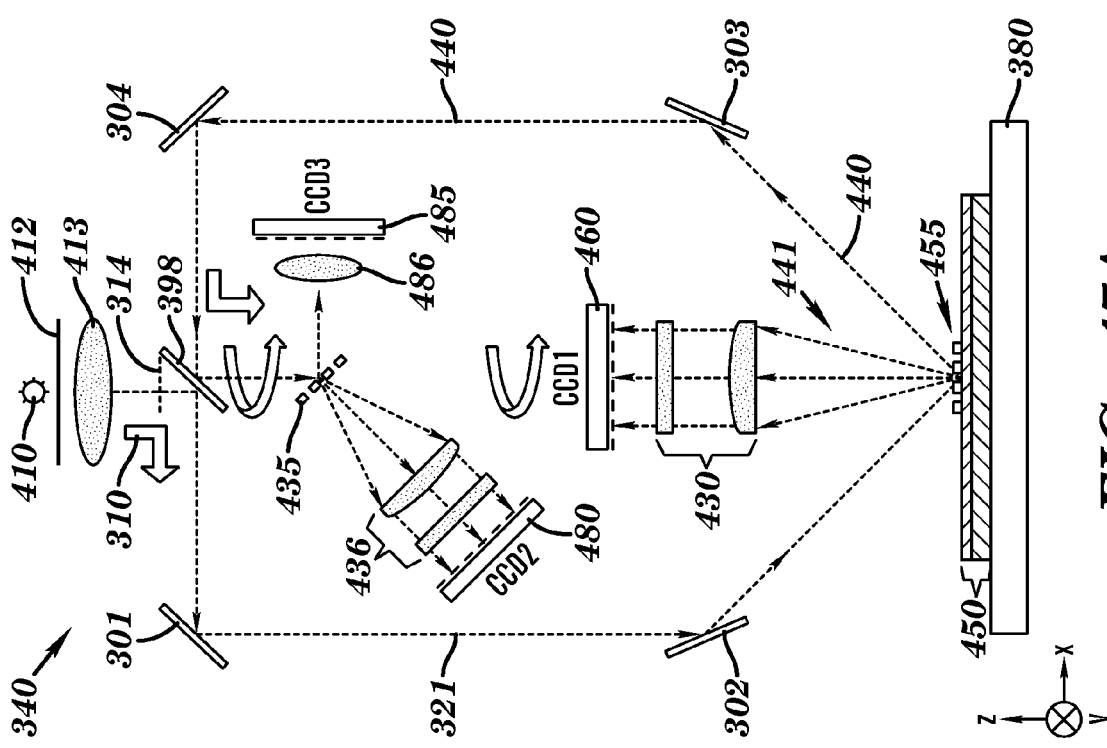

The measurement of overlay error requires detection of $n=\pm 1$ order intensities for at least two orientations to determine $\varepsilon_x$, $\varepsilon_y$, the vector components of overlay error. Thus, the inventive diffractometry apparatus preferably includes the ability to direct illumination and collect $n=\pm 1$ diffracted orders in at least two orientations corresponding to two orientations of the targets such as those illustrated in FIGS. 9 and 40. FIGS. 47A and 47B illustrate schematic views of an embodiment of the inventive diffractometry apparatus 340 that enables the rapid acquisition of the necessary intensity data, using a common illumination source 410 (e.g. having a bandwidth of $\lambda\pm\Delta\lambda$ as previously discussed), an optional color filter 412, illumination optics 413, optional polarizer 314 and common diffracted order detector 460 (e.g. a first CCD array). A rotatable mirror 398 directs illumination, initially along the direction 310, sequentially to mirrors (e.g. 301, 302) that direct the illumination along the path 321 to the diffractometry target 455 on substrate 450, the target 455 characterized by a periodicity P oriented along the x-direction. The rotatable mirror 398 is capable of being rotated to provide illumination of the target 455 from different orientations. Thus, for example, in FIG. 47A, the rotatable mirror 398 is to direct illumination along the positive x-direction, by means such as re-direction mirrors 301, 302, so as to collect the +1 diffracted order 441. By re-orienting the rotatable mirror 398 by 180 degrees, the illumination is directed initially along the 320 direction, towards means such as re-direction mirrors 304, 303, along the path 331, so as to illuminate the target 455 from the negative x-direction, thus collecting the −1 diffracted order 441', as illustrated in FIG. 30B. The detection optics 430 and, optionally, the detector CCD1 460 itself are rotated in sychrony with the rotating mirror 398 to maintain a fixed relationship between the anisotropic (different in x-y) imaging capability of the optics 430 and the plane of illumination. Additional re-direction mirrors (not shown) may be provided along the y-direction, so as to obtain measurements of overlay in the y-direction as well. Optionally, the substrate 450 may be supported and/or secured on a rotatable platform 380, which can be used to orient the substrate 450 so as to allow illumination from different directions. A polarizer 314 is optionally provided that rotates with the mirror 398 to provide the polarization corresponding to optimum first order diffraction efficiency. The preferred embodiment is to direct illumination to four distinct orientations located on orthogonal axes. For target gratings with elements orthogonal to the direction of incidence, the first order diffraction is magnified and imaged on the detector CCD1 460 in the direction perpendicular to the grating period and linearly dispersed in wavelength in the direction parallel to the grating period. Optionally, a second detector array (such as CCD2) 480 may be provided, which collects zero order energy 440 directed through dispersive element 435 through second optics 436. Additionally, a third detector array 485, such as CCD3 may be provided which collects zero order energy reflected off dispersive element 435 (not diffracted) directed through third optics 486 to obtain additional measurements as described further below.

Figure 48:
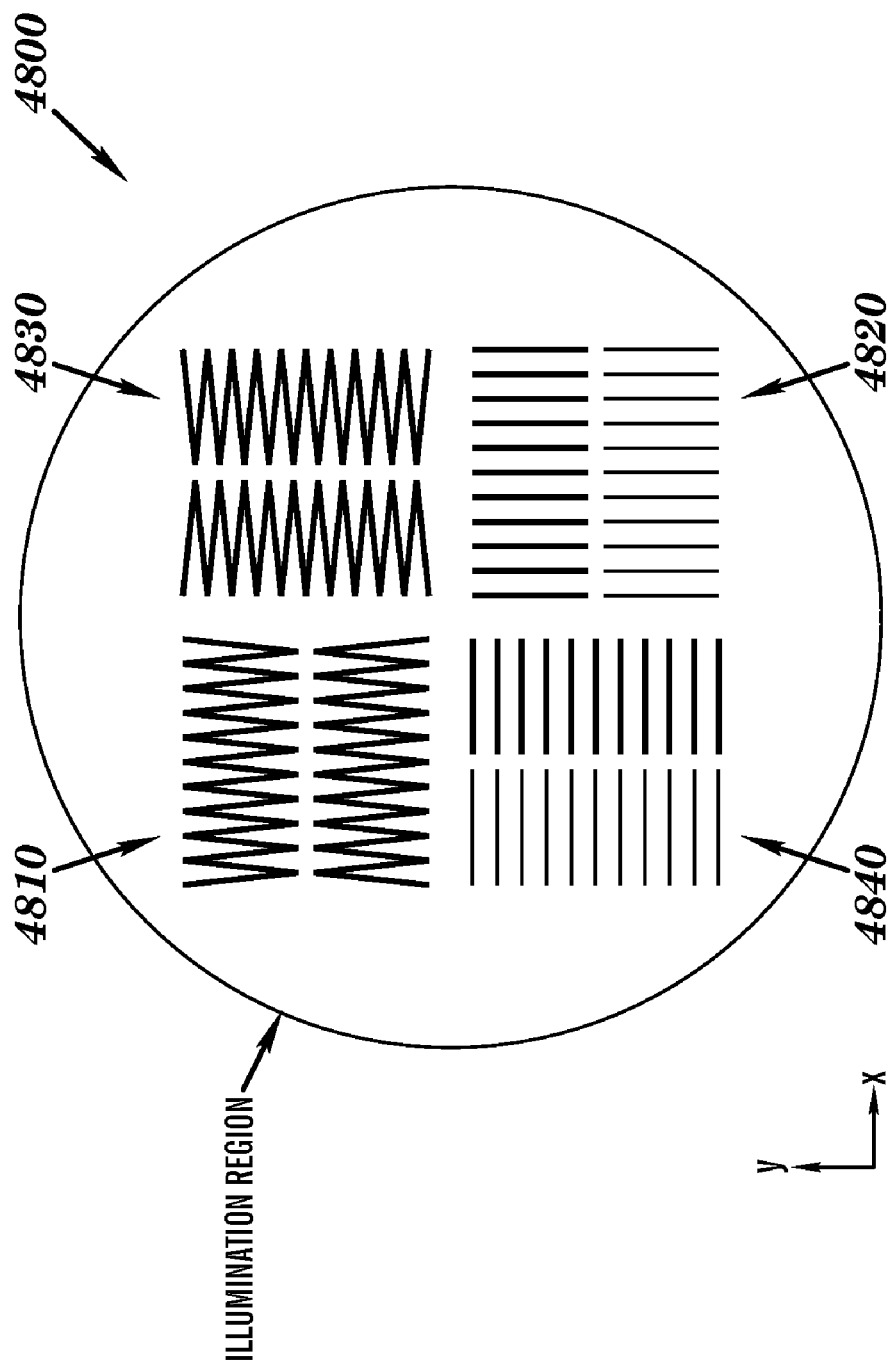
FIG. 48 illustrates a combined CD, overlay and film-thickness target for measuring, x and y oriented CDs, x and y overlay error among two pairs of levels, and film-thickness in the unpatterned areas.

Many target configurations are applicable to the metrology apparatus of FIG. 47. CD and overlay targets of the primary types described above can be grouped together on single and multiple process layers to form simultaneously illuminated target "clusters" tailored to specific production and process characterization applications. One such cluster described above is the through-pitch target shown in FIG. 30. In creating target clusters, the imaging in the direction perpendicular to the primary target periods and the plane of illumination ensures that adjacent gratings in the imaging direction will not interfere with one another. Thus, clusters can be comprised of a large number (limited only by the detection field of view) of primary targets at a single orientation, stacked in the direction perpendicular to the plane of illumination. The wavelength dispersive elongation of the diffracted intensity of primary targets with periods parallel to the plane of illumination, however, requires that primary targets at the same orientation cannot be placed adjacent to one another in the plane of illumination. Isolation of targets stacked in the plane of illumination is achieved by changing their orientation. The best isolation between primary targets in the plane of illumination is achieved when the orientations of the simultaneously illuminated primary targets are respectively parallel and perpendicular to the plane of illumination. A useful cluster configuration that enables the simultaneous measurement of overlay, CD and film thickness is shown in FIG. 48. The embodiment of the inventive differential overlay target 4800, as shown in FIG. 48, may have two overlay gratings 4810, 4830 at levels B and A (i.e., grating elements printed using process B are interleaved with those printed previously using process A), each similar to grating 3900 of FIG. 39 having diadic grating subregions, where an x-oriented grating 4810 has a x-direction pitch $P_{OLx}$ and a y-oriented grating 4830 has a y-direction pitch $P_{OLy}$. In most cases $P_{OLx}=P_{OLy}=_{OL}$. The same target 4800 is also designed to combine B-level CD gratings 4820, 4840, each similar in design to any of those shown in FIG. 6, 8, 9, 17, 23, 25, 26, or 28-30, having pitches $P_{CDx}$, $P_{CDy}$, respectively, where in most case $P_{CDx}=P_{CDy}=P_{CD}=P_{OL}=P$.

The sequential images 4901, 4902, 4903, 4904 on the plane of detector 460 (CCD1) will appear as shown in FIG. 49B" depending on the orientation of the rotatable mirror 398, as an example, assuming rotation of the mirror in the clockwise direction 322 sequentially to locked positions 1, 2, 3 and 4, as indicated in FIG. 49A, to allow formation of each image 4901, 4902, 4903, 4904, respectively. Overlay image processing consists of storing the intensities of each grating region at each orientation and diffracted order, and applying Equations (35a)-(36) to solve for overlay error in each diadic overlay grating region 4810, 4830.

The embodiment of the differential CD and overlay apparatus 340 illustrated in FIG. 49 may also be equipped to perform conventional spectroscopic scatterometry and film thickness metrology. By making the rotatable mirror 398 reflective on both sides, the reflected zero order 440 can be directed through a wavelength dispersive element 435 through second optics 436 to a second CCD detector 480 (i.e. CCD2) at each orientation. In the presence of either conventional or differential grating targets, the zero order spectrum can be analyzed by conventional scatterometry techniques to determine various characteristics of the pattern (CD, sidewall angle, etc.) and underlying films. As noted earlier, the zero-order intensity spectra of the unpatterned target regions, shown in the image 4905 on a plan view of CCD2 array 480, as illustrated in FIG. 49, can be used for film thickness measurement. The CCD2 image 4905 is shown as an oval shape because it is the zero-order intensity of the roughly circular illumination 410 imaged in the direction perpendicular to the period of the transmission grating 435 and elongated in the wavelength dispersive direction parallel to the transmission grating period. The overall target image may be captured by a third detector array 485 (i.e., CCD3), configured with optics 486 to collect zero order energy 4906, can be used for target pattern recognition and wafer alignment, or other measurements for which the grating elements of a target need not be resolved. The inventive apparatus 340, configured in the manner of FIG. 47, provides the capability to conduct CD, overlay and film thickness measurements simultaneously at a single target location results in an approximate tripling of the measurement speed for production applications where all three measurements are required. Although CD and film thickness do not require measurement of the both the positive and negative diffracted orders, the positive and negative diffracted order results can be averaged and differenced to improve and monitor measurement precision. In some applications, therefore, it may be preferable to conduct CD and film thickness metrology separately from overlay. In any event, the inventive differential diffractometry apparatus and method enables wide flexibility in cluster target layout to optimize measurement throughput and capability.

In the absence of any target pattern on the wafer 450, as shown in FIG. 50, the embodiment of the inventive apparatus 340 may be used for conventional spectroscopic film thickness measurement, where the zero order spectrum 5001 collected at second detector 480 (FIG. 50C) and pre-determined film properties (the real and imaginary components of the film index of refraction at the measurement wavelengths) are used to determine the film thicknesses in the unpatterned film stack 451, as known in the art. In the absence of a target grating, there is no non-zero diffracted order to be collected at the first detector position 460, as illustrated in FIG. 50B. Optionally, the apparatus 340 may be configured with viewing optics 486 and viewing detector CCD3 485 may be provided to allow real-time viewing and alignment (e.g. via alignment marks 5002) necessary to position the illumination with respect to the target locations on the substrate. As shown, the light forming the image on detector 485 is specular reflection from the transmission grating surface. Alternatively, a beam splitter (not shown) placed in the path 371 of the zero order beam could direct light to the imaging system.

Figure 51:
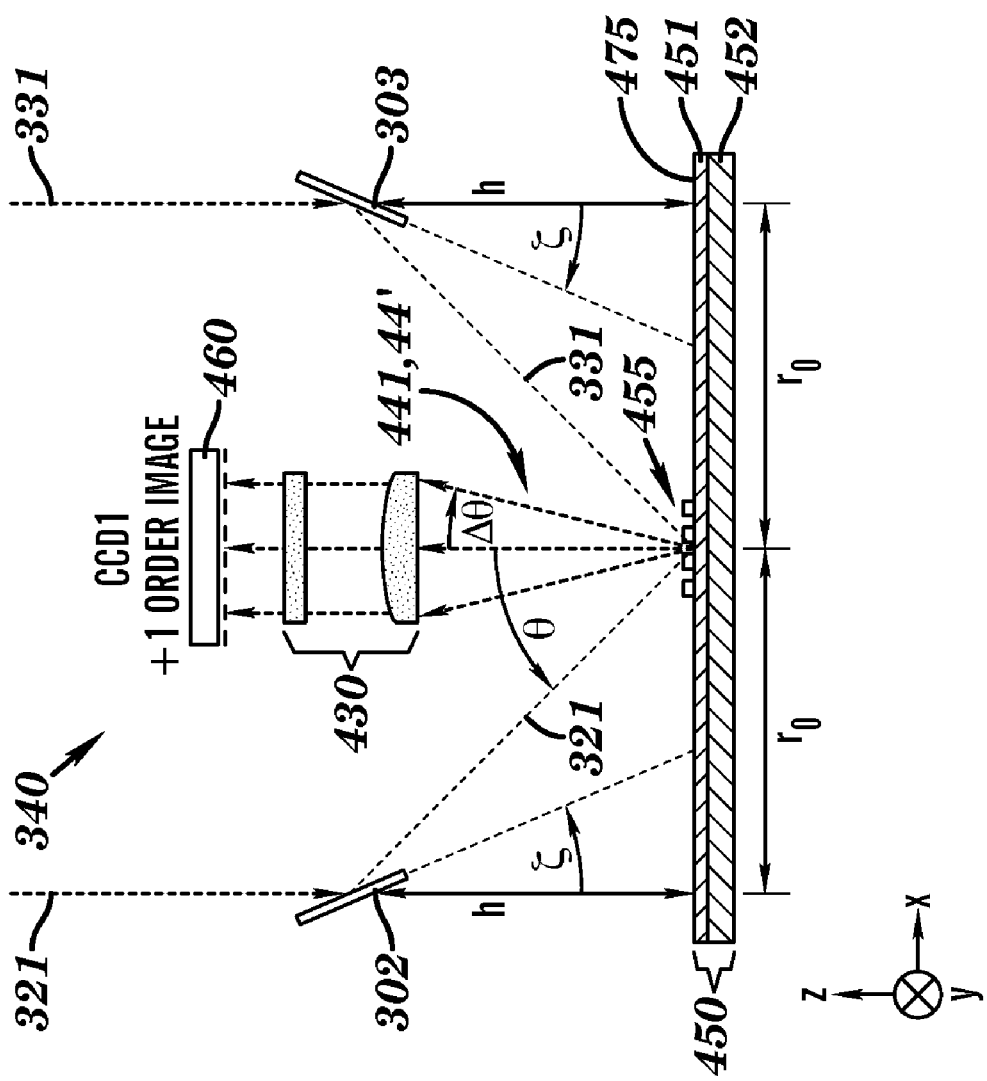
FIG. 51 is a detailed view of the geometric relationships that must be maintained between the incident and reflected beams of the apparatus to ensure the simultaneous detectability of both zero order and a non-zero order diffracted energy as the center wavelength is changed.

In a preferred embodiment of the diffractometry apparatus 340 (of FIG. 47) as illustrated in FIG. 51, adjustable mirrors 302, 303 are provided to ensure that the direction of the first order diffracted rays 441, 441' (depending on whether the illumination rays are from the positive 321 or negative 331 x-direction respectively), will be substantially normal to the substrate surface 475 so as to direct the diffracted orders to the first detector array 460. As the center wavelength $\lambda_0$ and or the primary pitch P of the target 455 is changed in the apparatus 340 shown in FIG. 47, the angle $\theta$ between the incident ray 321, 331 and the first-order diffracted ray 441, 441' will change according to Equation (1). To maintain a fixed first-order diffraction direction $\theta$, so that the first detector array 460 may be positioned at a direction normal to the substrate surface 475, therefore, preferably both the height h and tilt angle $\zeta$ (relative to the vertical, or z-direction) of the lower mirrors 302, 303 of the apparatus 340 are adjusted as dictated by the geometric relationship illustrated in the detail of the apparatus 340 illustrated in FIG. 51, where:

$$\xi = \frac{\theta}{2} \quad (47)$$
$$h = r_0 \cot\theta,$$

where $r_0$ is the horizontal distance of the lower mirrors 302, 303 from the preferably central horizontal location of the first detector array 460. As in FIG. 4C, the angle $\Delta\theta$ represents the wavelength dispersion of the illuminated target. Note that many embodiments of the inventive apparatus 340 that provide similar functionality are possible. These embodiments include, but are not necessarily limited to, the use of multiple fixed beams instead of a rotating mirror, different means of directing a single beam such as a dithered mirror, adjustable fiber optic channels to direct the beams appropriately, rotating the substrate about the target center instead of the illumination and detection optics.

Figure 52:
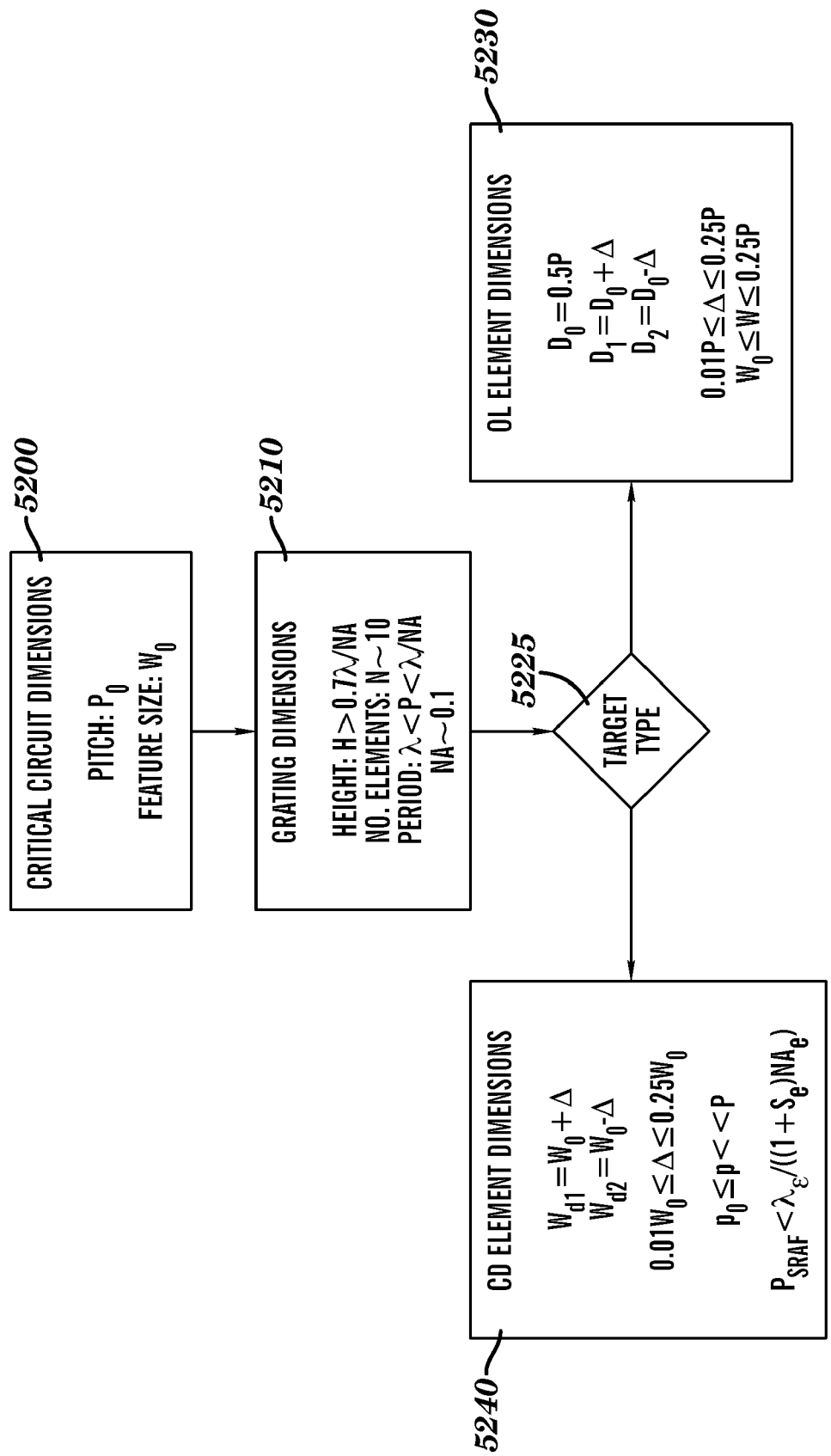
FIG. 52 flowcharts the inventive target design process.

FIG. 52 illustrates a flowchart summarizing an embodiment of the inventive target design process. The process starts (Block 5200) wherein a target design pattern is provided, having critical pattern dimensions to be printed (e.g., the minimum circuit feature size $W_0$ and pitch $p_0$ in the case of semiconductor manufacturing). Given a selected illumination center wavelength $\lambda_0$ and bandwidth $\pm\Delta\lambda$, and a relatively low $NA_x$, $NA_y$ for the anisotropic diffractometry collection and imaging objective 413 (see FIG. 4A), the overall dimensions of the inventive grating target 455 are determined so as to ensure that the first-order diffraction is detectable independent of all other diffracted orders (Block 5210). For example, the height H (orthogonal to the direction of the primary period P) of a grating region (or subregion) is preferably greater than about $$\left(\frac{0.7\lambda}{NA_y}\right),$$

where the numerical aperture $NA_y$ in the imaging direction is preferably between about 0.05 and 0.5, and is preferably about 0.2 as a compromise among depth of focus, target size, and image acuity. The primary period P of the grating is preferably $$\lambda < P < \frac{\lambda}{NA_x},$$

where the numerical aperture $$NA_x \geq \frac{|n|\Delta\lambda}{P}$$

required to collect the full spectrum implies the condition $\lambda > |n|\Delta\lambda$. For $n = \pm 1$ and $\lambda = 2\Delta\lambda$, $NA_x \approx 0.5$ is preferred. The number of repeating elements N is preferably about 10 or greater. Further details of the target design depend on whether the application is for CD or for overlay metrology (Block 5225). For a CD target, the element dimensions are based primarily on the target feature critical dimension $W_0$ (Block 5240). For example, in the design of a CD target 1701 as illustrated in FIG. 17, there are two grating subregions 1731, 1732, within which the elements 1711, 1712 have nominal width $W_{d1}$, $W_{d2}$, respectively. Here, $W_{d1} = W_0 + \Delta$, and $W_{d2} = W_0 - \Delta$, where preferably, the difference $\Delta$ between sub-grating target widths $W_{d1}$, $W_{d2}$ is preferably chosen so that $0.01W_0 \leq \Delta \leq 0.25W_0$, and preferably about $0.1W_0$. To enhance sensitivity to dose and defocus, the grating elements (e.g., the target 2500 as in FIG. 25) may be delineated by sub-elements having period $p_f$ oriented along a direction orthogonal to the direction of the primary pitch P, wherein $p_0 \leq p_f \ll P$. For gratings using subresolution assist features (SRAFs), such as the target grating 2600 of FIGS. 26A and 26B, the SRAF spacing $p_{SRAF}$ is preferably constrained to be less than $$\frac{\lambda_e}{(1+\sigma_e)NA_e},$$

where the parameters $\lambda_e$, $\sigma_e$, $NA_e$ refer to the wavelength, coherence, and numerical aperture of the exposure tool, respectively. The subresolution pitch $p_{SRAF}$ for the dose target 2600 of FIG. 26 must be below the resolution of the exposure tool.

If the target type is for overlay measurement (Block 5230), then the design parameters are less dependent on the critical dimensions of the design, but are constrained by factors such as the resolution of the diffractometry system, i.e. $\lambda$, $NA_y$, or available real estate on the chip. Thus, the dimensions of the overlay target will depend on the primary pitch P, and for an overlay target 4000 as illustrated in FIG. 40, for example, the nominal spacing between A process elements and B process elements $D_0$ (i.e., $D_x$ in the horizontal direction or $D_y$ in the vertical direction) is preferably $D_0 = 0.5P$, and $D_1 = D_0 + \Delta$, and $D_2 = D_0 - \Delta$, where $\Delta$ is preferably between about 0.01P and 0.25P. The widths $W_A$, $W_B$ of individual elements of the overlay target are preferably $W_0 \leq W_{A,B} \leq 0.25P$.

Figure 53:
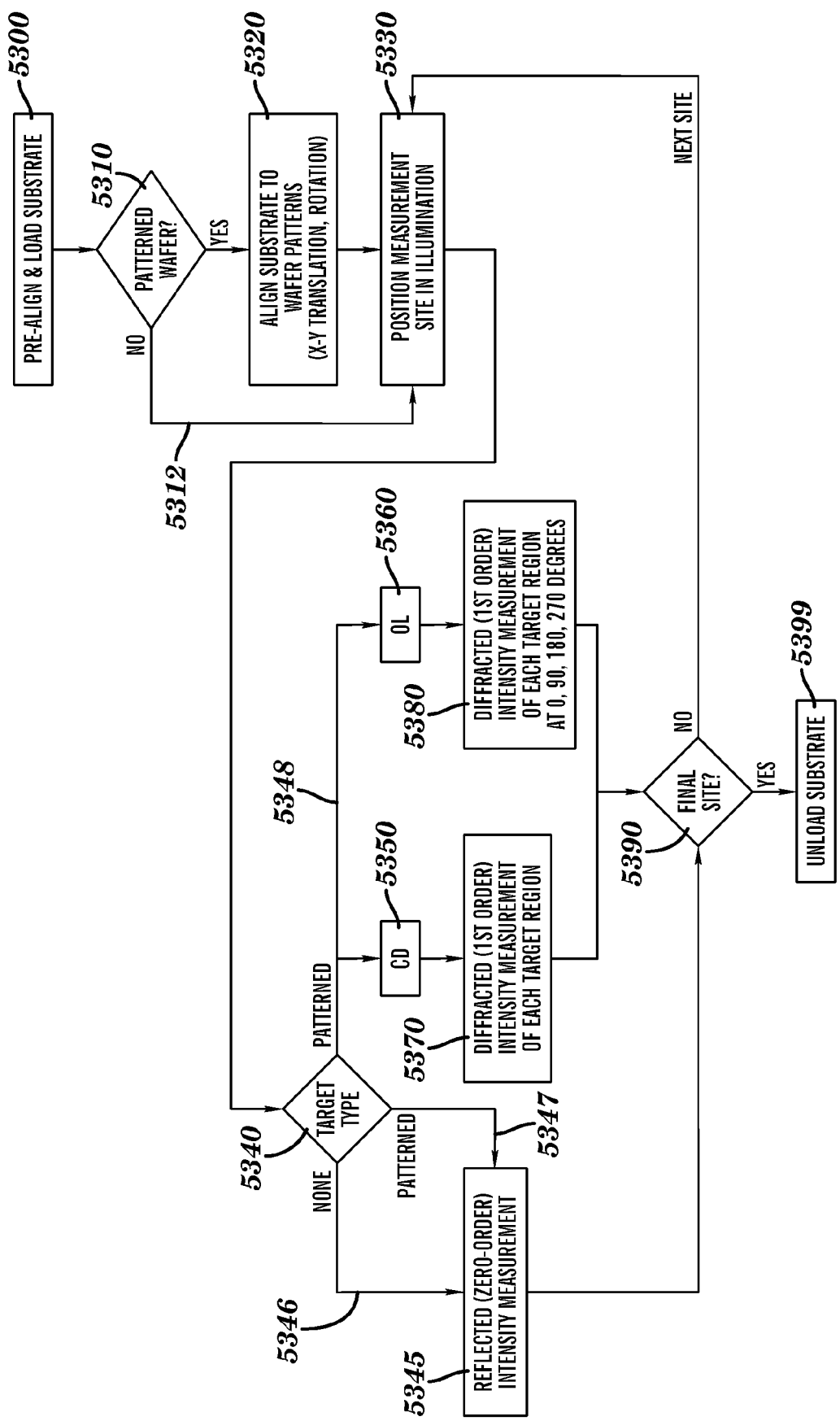
FIG. 53 flowcharts the measurement modes of measurement possible with the inventive apparatus.
Figure 54:
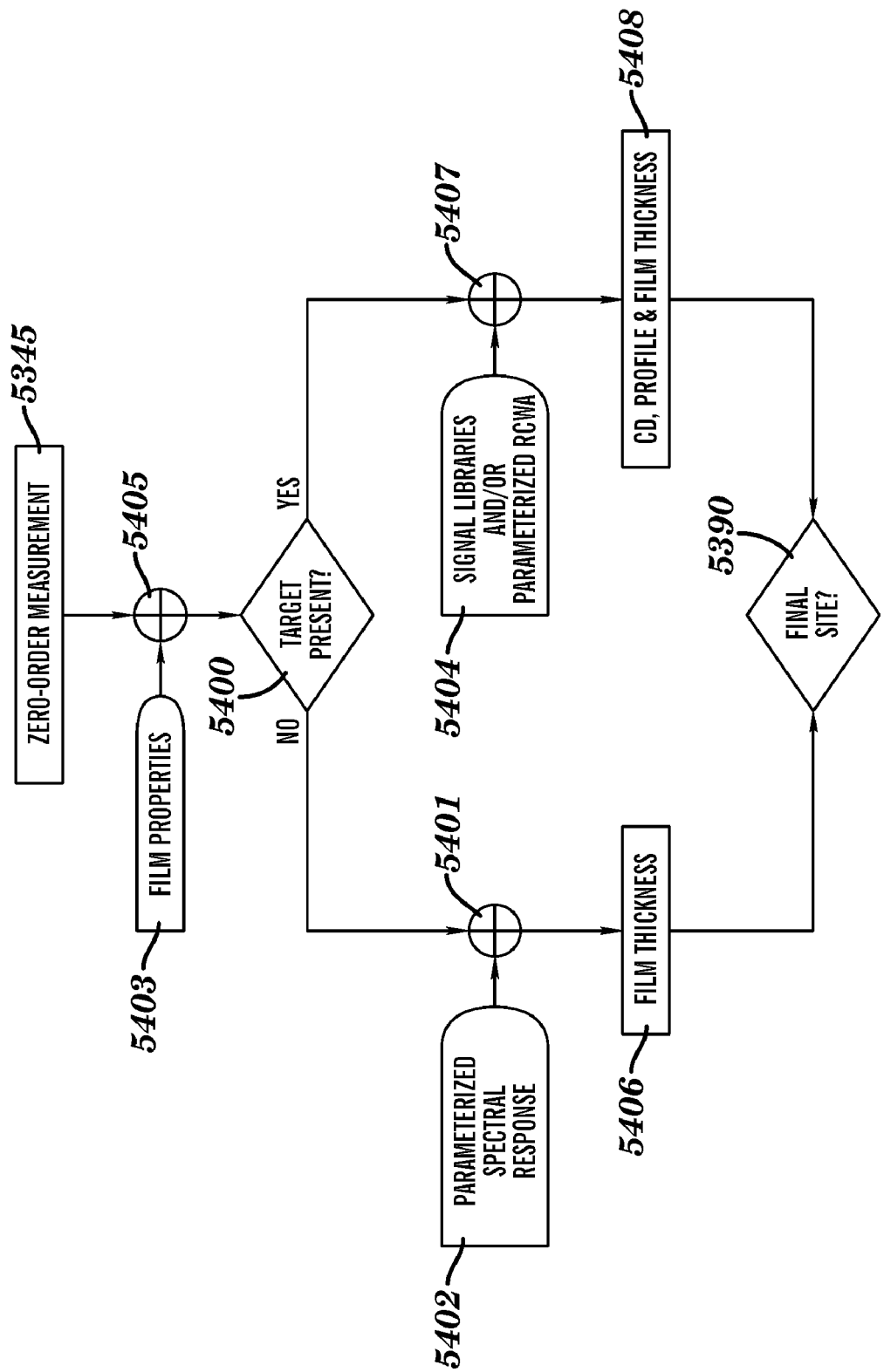
FIG. 54 flowcharts a zero-order measurement analysis when using the inventive apparatus.
Figure 55B:
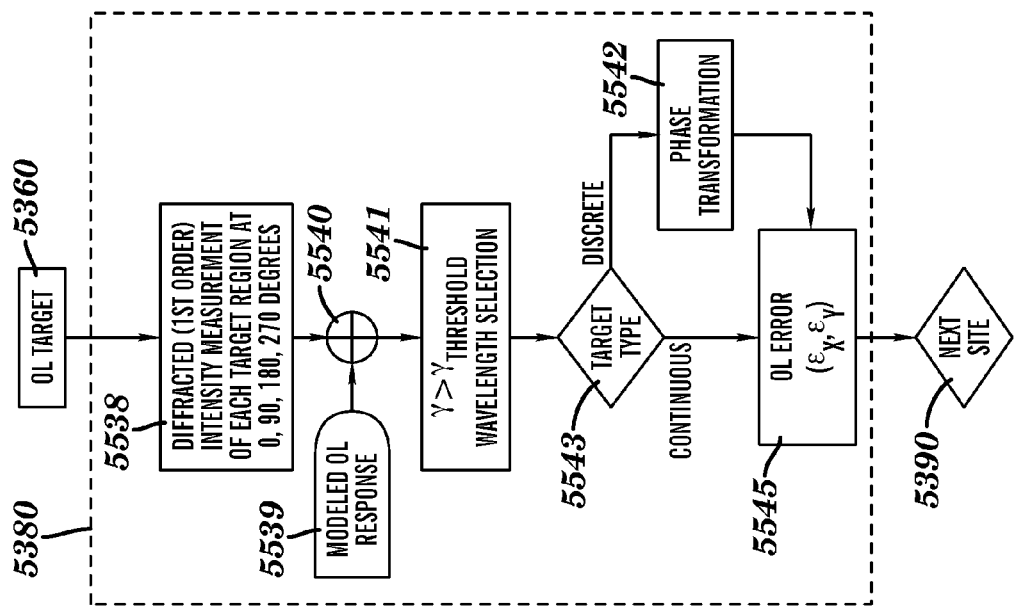
FIGS. 55A-55B flowchart the inventive data analysis for CD, dose, focus and overlay determination based on the inventive measurement method and apparatus.
Figure 55A:
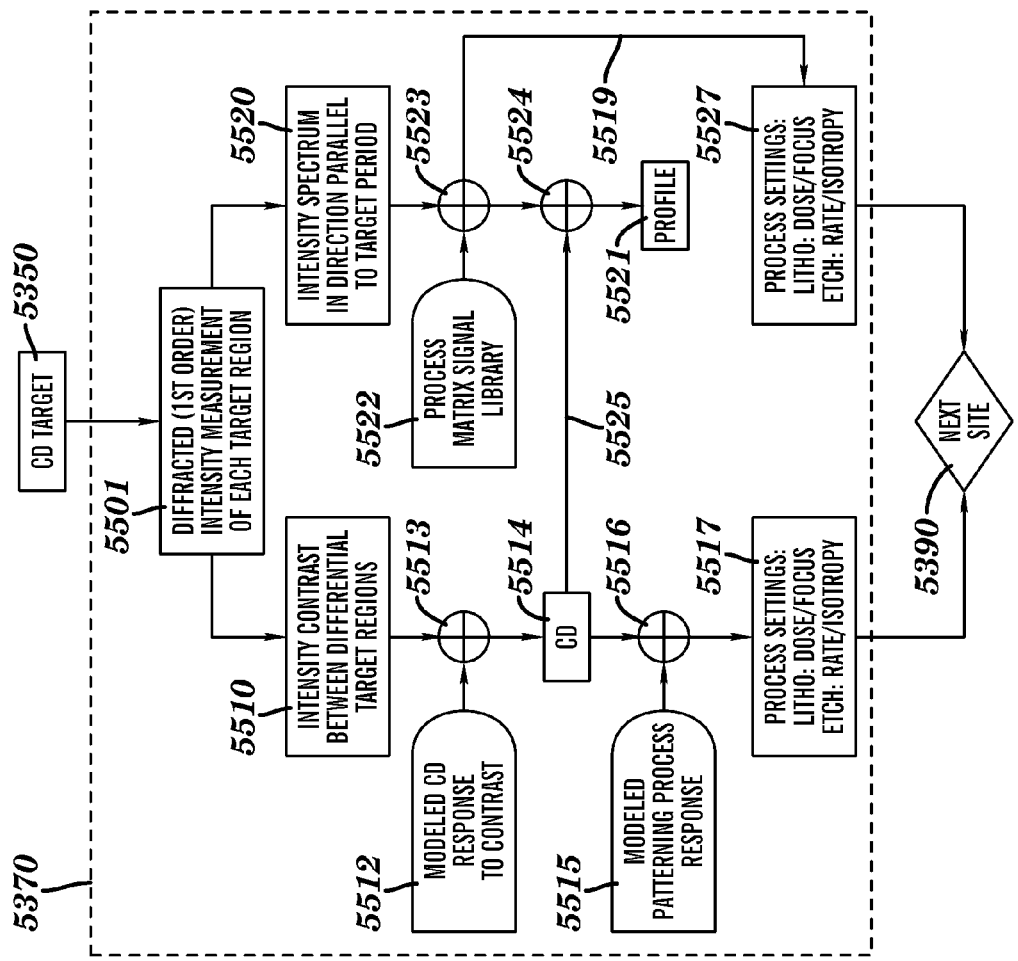

The inventive apparatus (for example, as illustrated in FIGS. 34, 47, 50, 51) may be used to perform multiple measurements of multiple metrology sites on a wafer, as summarized in the flowcharts illustrated in FIGS. 53-55. One example of such an application is as a metrology module 200 on a track tool or etch tool as illustrated in FIG. 3, but the inventive integrated metrology tool 200 could also be used in off-line applications 35. Referring to FIG. 53, a substrate, having multiple metrology sites, is loaded and aligned into the tool (Block 5300). The number and type of metrology sites for the wafer may be provided as input to the tool. Alternatively, intentional differences between targets (offsets in the target periods, for example) could enable the metrology tool to recognize the target type on the fly. A check is first performed to determine whether the wafer has patterns (Block 5310). Typically, if the wafer is patterned, all the patterns on the wafer will be aligned in a similar, global, manner, and therefore the wafer is typically aligned, by appropriate translation and rotation (Block 5320). This can be performed, for example, by use of the viewing detector 485 (e.g. CCD3) such as illustrated in FIG. 47. If the wafer is not patterned, the alignment step may be skipped 5312. Next, the wafer is then positioned so that the first site to be measured can be illuminated (Block 5330). The type of target site then determines which analysis path is to be taken (Block 5340). If there is no site pattern (5346), then only zero-order measurements are taken (path 5346). If the site is patterned, then non-zero order measurements can be taken by following the path 5348 to Blocks 5350 or 5360, or, alternatively, zero-order measurements can be taken by following the path 5347. Zero-order measurement and analysis can be performed using either an inventive diffractometry target or a conventional scatterometry target (Block 5345), as described in more detail with reference to FIG. 54. If the site contains a CD diffractometry target, in accordance with the present invention, then the CD analysis path (Block 5350) is followed, or if the site contains an inventive overlay diffractometry target, then the overlay analysis path (Block 5360) is followed, as described in more detail with reference to FIGS. 55A and 55B, respectively. The analysis can be continued using the same tool for all selected metrology sites (Block 5390), and when all sites have been measured, the wafer may be unloaded (Block 5399) or continue processing along the track or etch tool.

Referring to FIG. 54, if a zero-order measurement is appropriate for the selected metrology site (Block 5345), then, either a conventional film thickness measurement or scatterometry may be performed, depending on whether a target is present (Block 5400). In both cases, film properties 5403 are provided for the analysis of reflected zero-order measurements that have been obtained (Block 5405). If there is no target, then the zero-order intensity measurements are analyzed (Block 5401) with respect to provided film properties 5403, to determine film thickness (5406) by comparison to parameterized spectral responses (Block 5402) using methods known in the art. If the target site contains a conventional scatterometry target, then the zero-order intensities may be analyzed (Block 5407) in accordance with a library of calibrated signals and/or parameterized RCWA (Rigorous Coupled Wave Analysis) (Block 5404) and determination of CD, profile and film thickness may be obtained (Block 5408). If there are additional sites to be measured, the wafer can continue to be processed by the inventive tool (Block 5390).

If the site contains an inventive CD diffractometry target, then the Blocks 5350 to 5370 can be taken, as illustrated in FIG. 53, and Block 5370 is described in more detail in FIG. 55A. Referring to FIG. 55A, first order diffracted intensity measurements are obtained (Block 5501). The contrast between target subregion intensities is obtained (Block 5510), for example, from Region 1 (1731) and 2 (1732) of FIG. 17, averaged or summed along the x'-direction, i.e. I(y') as in FIG. 18C, and may be analyzed to determine average CD. The modeled CD response of the target to changes in contrast is provided (Block 5512), for example, in accordance with Equation 15 for a target having a continuously varying characteristic dimension along the y-direction (as in tapered element target 60 of FIG. 6) or Equations 20a and 20b for a target having a characteristic dimension that varies discretely along the y-direction (as in multi-subregion target 1701 of FIG. 17). The measured contrasts are input to the modeled response (Block 5513) to obtain CD (Block 5514). If the target site contains subregions that are sensitive to process conditions, such as dose and defocus, or etch rate and isotropy, then process conditions (Block 5517) can be obtained from the resulting average CD measurements (Block 5516) by using model of the relationship between process conditions and CD variations (Block 5515), for example, by the method of Ausschnitt described in U.S. Pat. No. 5,965,309.

Alternatively, process conditions, such as dose and defocus measurements may be obtained by analysis of the intensities as a function of wavelength, i.e. I(x'), summed or averaged along the y'-direction (Block 5520). A signal library (5522) may be provided experimentally, for example by using a focus-exposure matrix (FEM), or by simulation. The signal library can be compared and matched to the intensity spectrum (Block 5523) to derive process conditions such as dose and defocus or etch rate and isotropy (Block 5527). Since the intensity response of printed features is dependent on both CD as well as characteristics such as sidewall profile, the CD values obtained from the contrast measurements (Block 5514) can be input into the results of the process response signal analysis (5524) to derive a profile measurement (Block 5521). Metrology according to the invention can continue for additional sites on the wafer (5390).

It is also important to note that the non-zero order intensity spectra measurable with the inventive apparatus are sensitive to all profile characteristics of the target grating elements— e.g., sidewall angle, resist loss, footing, etc.—and insensitive to the underlying film stack. Simulated or empirical process matrix signal-libraries can be used both to determine these profile details and pinpoint the process conditions corresponding to the measured spectra. The inventive differential diffractometry approach has a three-fold advantage over conventional scatterometry:

1. Increased sensitivity to profile changes, as evidenced by the dose and focus sensitivity discussed above, and insensitivity to the underlying film stack improves the signal-to-noise in determining the profile characteristics.
2. Profile measurements can be made relative to the average CD independently determined by the inventive differential technique thereby further increasing the signal-to-noise (Block 5524 in FIG. 55A). This is shown schematically by the arrow 5525 that connects CD to the profile determination path in FIG. 55A.
3. Insensitivity to underlying film stack enables much more efficient simulated or empirical library generation by the determination of the spectra variation through a focus-exposure matrix at lithography and through a rate-isotropy matrix at etch. This establishes a direct relationship between the spectra and process settings for process control applications. This is shown schematically by the path 5519 from the spectra and signal libraries 5522 to the process settings 5527 in FIG. 55A.

Referring to FIG. 55B, for the case of an overlay target (Block 5360), the overlay analysis (Block 5380) comprises the following steps. To measure overlay, intensity measurements from 4 different orientations are required (Block 5538). The measured intensities are compared (Block 5540) to the modeled response of the overlay target (Block 5539), for example, as described in Equations (35a)-(35b) for a target having continuously varying characteristic dimension along the y-direction (such as target 3600 in FIG. 36), or as in Equation 40 for an overlay target having a characteristic dimension that varies discretely in the y-direction (such as target 2300 illustrated in FIG. 23). In order to ensure the best signal-to-noise is available for the analysis, the range of wavelengths may be selected so that $\gamma > \gamma_{threshold}$ is selected to be as large as possible (as described in Equation 35 for a target of continuously varying characteristic dimension, or Equation 42 for a target of discretely varying characteristic dimension). If the target is of the discretely varying type (Block 5543), it is necessary to perform the phase transformation analysis of $\psi^{\pm}$ (as in FIGS. 43-45) to enable selection of a physically meaningful overlay error. Then the overlay error can be computed (Block 5545) as an average of the overlay errors determined at the selected wavelengths, in accordance with Equation 35 for the continuously varying characteristic target dimension or Equation 40 for the case of discretely varying characteristic target dimension. If more metrology sites remain, the measurement process can continue (Block 5390) until all selected sites are processed.

The method is suitable for implementation on a computer readable storage medium, for execution on a computer system, such as an image processor 490 (FIG. 4A), having a central processing unit, input/output (I/O) devices, and storage devices, which are capable of executing the instructions to perform the method, and accept data and control the inventive apparatus, such as illustrated in FIG. 4A.

The advantages realized by the above invention relative to current microscopy approaches to CD and overlay metrology, and dose and focus control include a simpler and more robust metrology apparatus with superior precision and speed. The inventive differential overlay and CD metrology approach provides in situ calibration of the measurements to the known period of the target using only the relative magnitude of detected intensities, thereby eliminating the predominant sources of TIS, WIS and matching errors among conventional metrology tools. Furthermore, the invention provides for both monitoring and control of dose and focus without the need for the laborious setup procedures required by scatterometry for CD or profile metrology.

It will be appreciated by those skilled in the art that the method and application to various layouts in accordance with the present invention is not limited to the embodiments discussed above. Accordingly, the invention is intended to encompass all such alternatives, modifications and variations which fall within the scope and spirit of the invention and the following claims.

The invention claimed is:

1. An apparatus for measuring a dimension on a substrate comprising:
    a source of radiation for illuminating said target pattern;
    collection optics configured to collect said one or more non-zeroth orders along said primary direction and to image said target pattern along said substantially orthogonal direction; and
    a detector array configured to detect spatial variations of said one or more non-zeroth orders from said collection optics along said substantially orthogonal direction and along said primary direction.

2. The apparatus of claim 1 further comprising a computer system comprising a computer readable storage medium, said computer readable storage medium comprising instructions for causing said computer system to determine said dimension of interest in accordance with said relationship, based on said detected measurable quantity of said one or more non-zeroth orders of said diffracted radiation.

3. The apparatus of claim 1 further configured to provide a second detector for detecting zeroth order radiation diffracted from said substrate, said apparatus further comprising means for determining film thickness from said zeroth order radiation.

4. The apparatus of claim 1 wherein said apparatus is configured for in-line processing for semiconductor manufacturing.

5. The apparatus of claim 4 wherein said target pattern comprises a first region having features of a first tone, and a second region having features of a second tone different from said first tone, wherein the method further comprises comparing measurements obtained from said first region with measurements obtained from said second region to determine effects of process conditions.

6. The apparatus of claim 5 wherein said process conditions are selected from the group consisting of dose, focus or a combination thereof.

7. The apparatus of claim 5 further comprising means for determining a deviation in said process conditions from nominal process conditions based on said dimension of interest.

8. The apparatus of claim 7 further comprising means for providing adjustments in subsequent process conditions in response to said deviation in process conditions.

* * * * *